US012692282B2

(12) United States Patent
Joo et al.

(10) Patent No.: US 12,692,282 B2
(45) Date of Patent: Jul. 28, 2026

(54) POLYCYCLIC COMPOUND AND ORGANIC LIGHT EMITTING DEVICE USING SAME

(71) Applicant: SFC CO., LTD., Chungcheongbuk-do (KR)

(72) Inventors: Sung-hoon Joo, Chungcheongbuk-do (KR); Bong-ki Shin, Chungcheongbuk-do (KR); Byung-sun Yang, Chungcheongbuk-do (KR); Ji-hwan Kim, Chungcheongbuk-do (KR); Hyeon-jun Jo, Chungcheongbuk-do (KR); Sung-eun Choi, Chungcheongbuk-do (KR); Seong-eun Woo, Chungcheongbuk-do (KR); Dong-myung Park, Chungcheongbuk-do (KR); Jun-young Moon, Chungcheongbuk-do (KR); Soo-kyung Kang, Chungcheongbuk-do (KR)

(73) Assignee: SFC CO., LTD., Chungcheongbuk-do (KR)

( * ) Notice: Subject to any disclaimer, the term of this patent is extended or adjusted under 35 U.S.C. 154(b) by 499 days.

(21) Appl. No.: 18/039,343

(22) PCT Filed: Dec. 1, 2021

(86) PCT No.: PCT/KR2021/017960

§ 371 (c)(1),
(2) Date: May 30, 2023

(87) PCT Pub. No.: WO2022/119297

PCT Pub. Date: Jun. 9, 2022

(65) Prior Publication Data

US 2024/0008365 A1 Jan. 4, 2024

(30) Foreign Application Priority Data

Dec. 1, 2020 (KR) ........................ 10-2020-0165665

(51) Int. Cl.

*H10K 85/60* (2023.01)
*C07F 5/02* (2006.01)
*C09K 11/02* (2006.01)
*C09K 11/06* (2006.01)
*H10K 50/12* (2023.01)

(52) U.S. Cl.

CPC .............. *C07F 5/027* (2013.01); *C09K 11/02* (2013.01); *C09K 11/06* (2013.01); *H10K 85/626* (2023.02); *H10K 85/636* (2023.02); *H10K 85/6572* (2023.02); *H10K 85/658* (2023.02); *C07B 2200/05* (2013.01); *C09K 2211/1022* (2013.01); *H10K 50/12* (2023.02); *H10K 85/6574* (2023.02)

(58) Field of Classification Search

CPC ........ C07F 5/027; C07F 7/0816; C09K 11/02; C09K 11/06; C09K 2211/1022; C09K 2211/188; H10K 85/626; H10K 85/636; H10K 85/6572; H10K 85/658; H10K 50/12; H10K 85/6574; H10K 50/11; C07B 2200/05

See application file for complete search history.

(56) References Cited

FOREIGN PATENT DOCUMENTS

| | | | |
|---|---|---|---|
| KR | 10-2020-0034899 | A | 4/2020 |
| KR | 10-2020-0066208 | A | 6/2020 |
| KR | 10-2148296 | B1 | 8/2020 |
| KR | 10-2020-0125583 | A | 11/2020 |
| KR | 10-2020-0132752 | A | 11/2020 |
| WO | 2020/218079 | A1 | 10/2020 |

OTHER PUBLICATIONS

Extended European Search Report from corresponding EP Application No. 21900985.9, dated Oct. 9, 2024.
Database Reaxys (Online), Oct. 29, 2020, Kwansei Gakuin University: "Cycloalkane condensed polycyclic aromatic compounds—WO2020/218079A1", XP093200224.
International Search Report from corresponding PCT Application No. PCT/KR2021/017960, dated Mar. 10, 2022.

*Primary Examiner* — Elmito Breval

(74) *Attorney, Agent, or Firm* — Harness, Dickey & Pierce, P.L.C.

(57) ABSTRACT

The present invention relates to a polycyclic compound which can be employed in various organic layers included in an organic light emitting device and contains R substituted with at least one deuterium (D), and to an organic light emitting device which has a long lifespan by comprising same to significantly improve lifespan characteristics thereof. According to the present invention, an organic light emitting device having a long lifespan can be implemented, and thus can be industrially advantageously used in various lighting and display devices, such as a flat panel display device, a flexible display device, a monochromatic or white flat panel lighting device, a monochromatic or white flexible lighting device, a vehicle display device, and a virtual or augmented reality display device.

15 Claims, No Drawings

POLYCYCLIC COMPOUND AND ORGANIC LIGHT EMITTING DEVICE USING SAME

CROSS-REFERENCE TO RELATED APPLICATIONS

This application is a national phase application of PCT Application No. PCT/KR2021/017960 filed on Dec. 1, 2021, which claims the benefit and priority to Korean Patent Application No. 10-2020-0165665, filed on Dec. 1, 2020. The entire disclosures of the applications identified in this paragraph are incorporated herein by references.

TECHNICAL FIELD

The present invention relates to a polycyclic compound and a long-lasting organic light emitting device with significantly improved life characteristics using the polycyclic compound.

BACKGROUND

Organic light emitting devices are self-luminous devices in which electrons injected from an electron injecting electrode (cathode) recombine with holes injected from a hole injecting electrode (anode) in a light emitting layer to form excitons, which emit light while releasing energy. Such organic light emitting devices have the advantages of low driving voltage, high luminance, large viewing angle, and short response time and can be applied to full-color light emitting flat panel displays. Due to these advantages, organic light emitting devices have received attention as next-generation light sources.

The above characteristics of organic light emitting devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structures of and materials for organic layers of organic light emitting devices that make the devices stable in terms of efficiency and last longer.

As such, there is a continued need to develop structures of organic light emitting devices optimized to improve their life characteristics and new materials capable of supporting the optimized structures of organic light emitting devices.

DETAILED DESCRIPTION

Problems to be Solved by the Invention

Accordingly, the present invention is intended to provide a compound that is employed in an organic layer of an organic light emitting device to achieve high efficiency and long lifetime of the device. The present invention is also intended to provide an organic light emitting device including the compound.

Means for Solving the Problems

One aspect of the present invention provides a polycyclic compound represented by Formula A-1:

[Formula A-1]

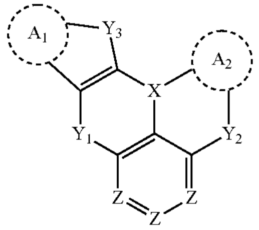

and having a structure including R substituted with at least one deuterium (D).

The structure represented by Formula A-1, specific compounds that can be represented by Formula A-1, and definitions of the rings $A_1$ and $A_2$, X, $Y_1$ to $Y_3$, and Z are described below.

The present invention also provides an organic light emitting device including a first electrode, a second electrode opposite to the first electrode, and one or more organic layers interposed between the first and second electrodes wherein one of the organic layers includes at least one of the specific polycyclic compounds that can be represented by Formula A-1.

Effects of the Invention

The polycyclic compound of the present invention can be employed in an organic layer of an organic light emitting device to achieve long lifetime of the device.

BEST MODE FOR CARRYING OUT THE INVENTION

The present invention will now be described in more detail.

The present invention is directed to a polycyclic compound for use in an organic light emitting device, represented by Formula A-1:

[Formula A-1]

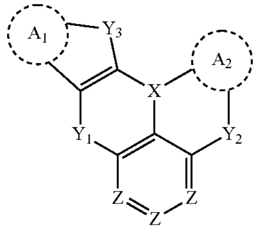

wherein $A_1$ and $A_2$ are each independently selected from substituted or unsubstituted $C_6$-$C_{50}$ aromatic hydrocarbon rings and substituted or unsubstituted $C_2$-$C_{50}$ aromatic heterocyclic rings, X is selected from B, P═O, and P═S, $Y_1$ and $Y_2$ are each independently selected from $NR_1$, $CR_2R_3$, O, S, Se, and $SiR_4R_5$, $Y_3$ is selected from O and S, each Z is independently selected from N and CR, with the proviso that at least one of the moieties Z is CR, $R_1$ to $R_5$ are the same as or different from each other and are each independently selected from hydrogen, deuterium (D), substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted amine, substituted or unsubstituted silyl, nitro, cyano, and halogen, provided that when both $Y_1$ and $Y_2$ are $NR_1$ and at least one of the two groups $R_1$ is heteroaryl, $C_{12+}$ heteroaryl containing O or S as a heteroatom is excluded from the definition of $R_1$, with the proviso that each of $R_1$ to $R_5$ are optionally bonded to one or more of the rings $A_1$ and $A_2$ to form an alicyclic or aromatic monocyclic or polycyclic ring, and the groups R are the same as or different from each other and are each independently selected from hydrogen, substituted or unsubstituted $C_6$-$C_{50}$ aryl, substituted or unsubstituted $C_2$-$C_{50}$ heteroaryl, substituted or unsubstituted $C_3$-$C_{30}$ cycloalkyl, substituted or unsubstituted $C_3$-$C_{30}$ heterocycloalkyl, and substituted or unsubstituted $C_3$-$C_{30}$ mixed aliphatic-aromatic rings, with the proviso that at least one of the groups R is an aryl, heteroaryl or mixed aliphatic-aromatic cyclic group substituted with at least one deuterium (D), the substituents of each of the rings $A_1$ and $A_2$ are optionally linked to each other to form an alicyclic or aromatic monocyclic or polycyclic ring, $R_2$ and $R_3$ are optionally linked to each other to form an alicyclic or aromatic monocyclic or polycyclic ring, and $R_4$ and $R_5$ are optionally linked to each other to form an alicyclic or aromatic monocyclic or polycyclic ring.

The use of the polycyclic compound in an organic light emitting device ensures long lifetime of the device.

The polycyclic compound represented by Formula A-1 according to the present invention has a structure including R substituted with at least one deuterium (D). That is, at least one of the substituents of R in the structure of the compound represented by Formula A-1 is deuterium.

According to one embodiment of the present invention, the degree of deuteration of the compound represented by Formula A-1 may be at least 5%.

According to one embodiment of the present invention, R may be deuterated $C_6$-$C_{30}$ aryl.

According to one embodiment of the present invention, the ring $A_2$ may be substituted with substituted or unsubstituted amine, which may be substituted or unsubstituted diarylamine.

The characteristic structures and ring-forming structures in Formula A-1 based on the definitions provided above can be identified from the specific compounds listed below.

As used herein, the term "substituted" in the definition of the rings $A_1$, $A_2$, R, $R_1$ to $R_5$, etc. indicates substitution with one or more substituents selected from deuterium, $C_1$-$C_{30}$ alkyl, $C_2$-$C_{30}$ alkenyl, $C_2$-$C_{30}$ alkynyl, $C_6$-$C_{50}$ aryl, $C_3$-$C_{30}$ cycloalkyl, $C_3$-$C_{30}$ cycloalkenyl, $C_1$-$C_{30}$ heterocycloalkyl, $C_2$-$C_{50}$ heteroaryl, $C_3$-$C_{30}$ mixed aliphatic-aromatic cyclic groups, $C_1$-$C_{30}$ alkoxy, $C_6$-$C_{30}$ aryloxy, $C_1$-$C_{30}$ alkylthioxy, $C_5$-$C_{30}$ arylthioxy, amine, silyl, germanium, boron, aluminum, phosphoryl, hydroxyl, selenium, tellurium, nitro, cyano, and halogen, or a combination thereof. The term "unsubstituted" in the same definition indicates having no substituent.

In the "substituted or unsubstituted $C_1$-$C_{30}$ alkyl", "substituted or unsubstituted $C_6$-$C_{50}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the term "bonded to an adjacent group to form a ring" means that the corresponding group combines with an adjacent group to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-111)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The aromatic hydrocarbon rings or aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The aromatic heterocyclic rings or heteroaryl groups refer to aromatic groups containing one or more heteroatoms. Examples of the aromatic heterocyclic rings or heteroaryl groups include, but are not limited to, thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The aliphatic hydrocarbon rings refer to non-aromatic rings consisting only of carbon and hydrogen atoms. The aliphatic hydrocarbon ring is intended to include monocyclic and polycyclic ones and may be optionally substituted with one or more other substituents. As used herein, the term "polycyclic" means that the aliphatic hydrocarbon ring may be directly attached or fused to one or more other cyclic groups. The other cyclic groups may be aliphatic hydrocarbon rings and other examples thereof include aliphatic heterocyclic, aryl, and heteroaryl groups. Specific examples of the aliphatic hydrocarbon rings include, but are not limited to, cycloalkyl groups such as cyclopropyl, cyclobutyl, cyclopentyl, adamantyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, and cyclooctyl, cycloalkanes such as cyclohexane and cyclopentane, and cycloalkenes such as cyclohexene and cyclobutene.

The aliphatic heterocyclic rings refer to aliphatic rings containing one or more heteroatoms such as O, S, Se, N, and Si. The aliphatic heterocyclic ring is intended to include monocyclic or polycyclic ones and may be optionally substituted with one or more other substituents. As used herein, the term "polycyclic" means that the aliphatic heterocyclic ring such as heterocycloalkyl, heterocycloalkane or heterocycloalkene may be directly attached or fused to one or more other cyclic groups. The other cyclic groups may be aliphatic heterocyclic rings and other examples thereof include aliphatic hydrocarbon rings, aryl groups, and heteroaryl groups.

The mixed aliphatic-aromatic rings or the mixed aliphatic-aromatic cyclic groups refer to structures in which two or more rings are fused together and which are overall non-aromatic. The mixed aliphatic-aromatic polycyclic rings may contain one or more heteroatoms selected from N, O, P, and S other than carbon atoms (C). Examples of the mixed aliphatic-aromatic polycyclic rings include, but are not limited to, tetralin, 1,1,4,4-tetramethyl-1,2,3,4-tetrahydronaphthalene, 1,2,3,4,4a,9b-hexahydrodibenzofuran, 2,3,4,4a,9,9a-hexahydro-4a,9a-dimethyl-1H-carbazole, and 5,6,7,8-tetrahydroquinoline.

The alkoxy group may be specifically a methoxy, ethoxy, propoxy, isobutyloxy, sec-butyloxy, pentyloxy, iso-amyloxy or hexyloxy group but is not limited thereto.

The silyl groups may be, for example, $-SiH_3$, alkylsilyl, arylsilyl, alkylarylsilyl, and arylheteroarylsilyl. Specific examples of the silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine group may be, for example, $-NH_2$, alkylamine, arylamine or arylheteroarylamine. The arylamine refers to an aryl-substituted amine group, the alkylamine refers to an alkyl-substituted amine group, and the arylheteroarylamine refers to an aryl- and heteroaryl-substituted amine group. The arylamine may be, for example, substituted or unsubstituted monoarylamine, substituted or unsubstituted diarylamine, or substituted or unsubstituted triarylamine. The aryl and/or heteroaryl groups in the arylamine and arylheteroarylamine groups may be monocyclic or polycyclic ones. The arylamine and arylheteroarylamine groups may include two or more aryl and/or heteroaryl groups. In this case, the aryl groups may be monocyclic and/or polycyclic ones and the heteroaryl groups may be monocyclic and/or polycyclic ones. The aryl and/or heteroaryl groups in the arylamine and arylheteroarylamine groups may be selected from those exemplified above.

The aryl groups in the aryloxy and arylthioxy groups are the same as those exemplified above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. Specific examples of the arylthioxy groups include, but are not limited to, phenylthioxy, 2-methylphenylthioxy, and 4-tert-butylphenylthioxy groups.

The halogen group may be, for example, fluorine, chlorine, bromine or iodine.

More specifically, the polycyclic compound represented by Formula A-1 according to the present invention may be selected from the following compounds 1 to 76:

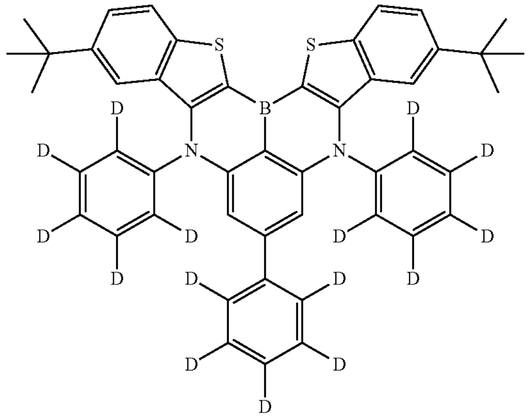

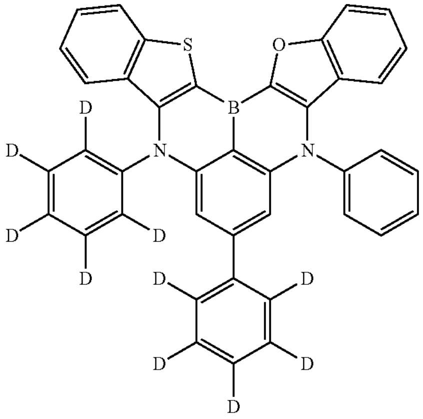

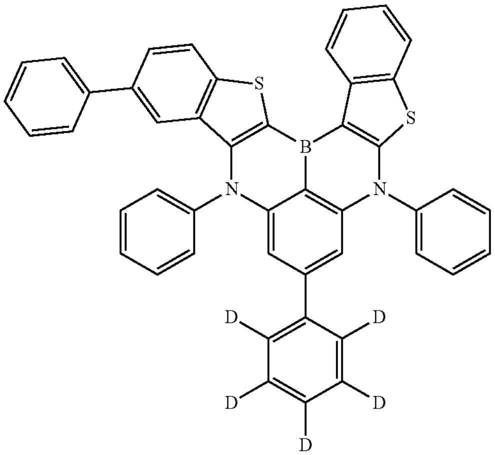

-continued
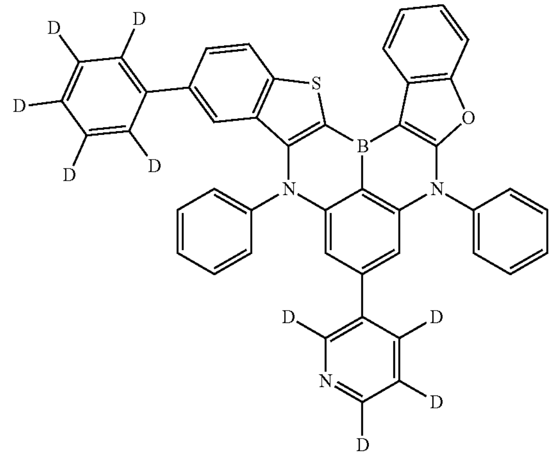
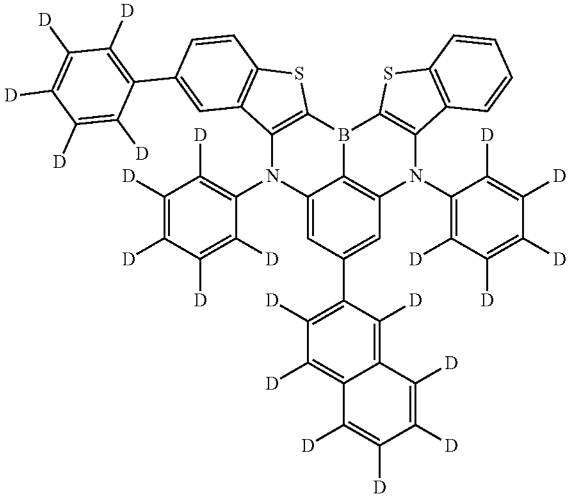
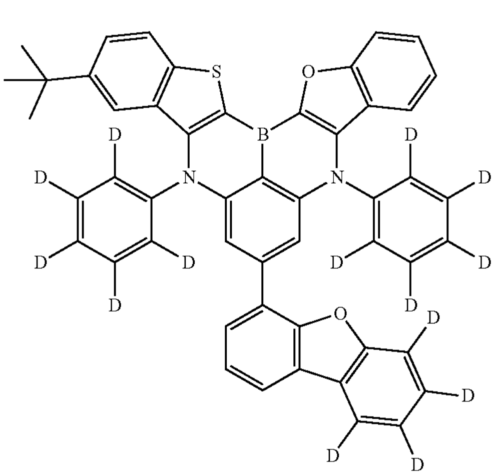
-continued
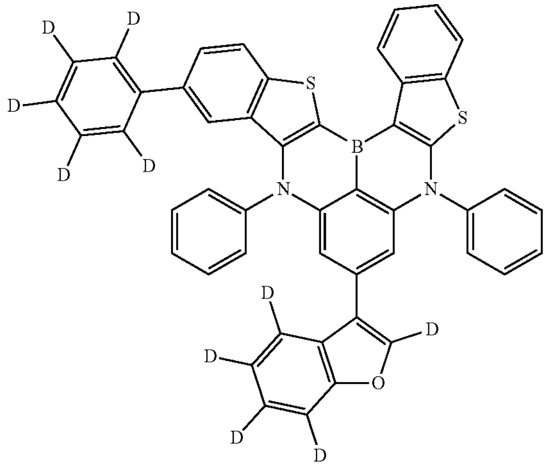
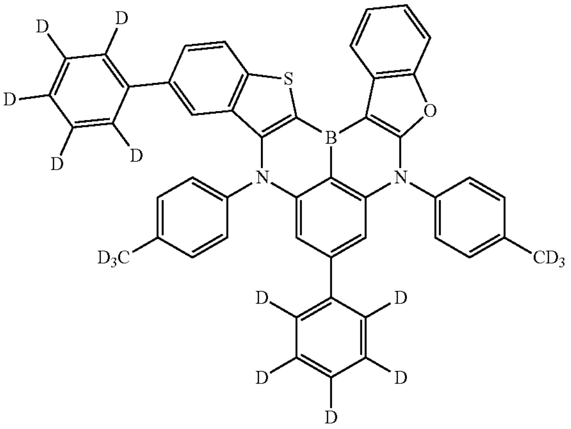
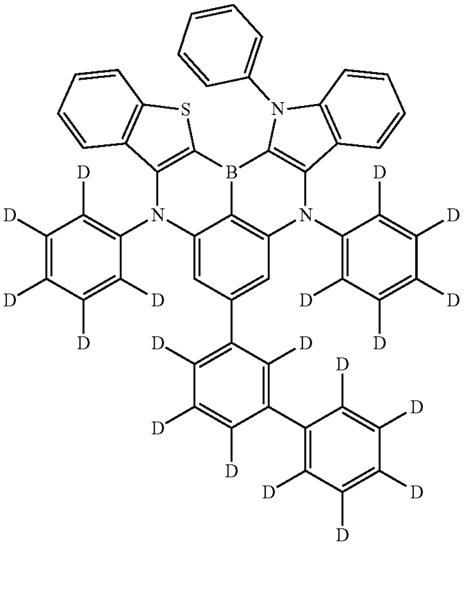

-continued
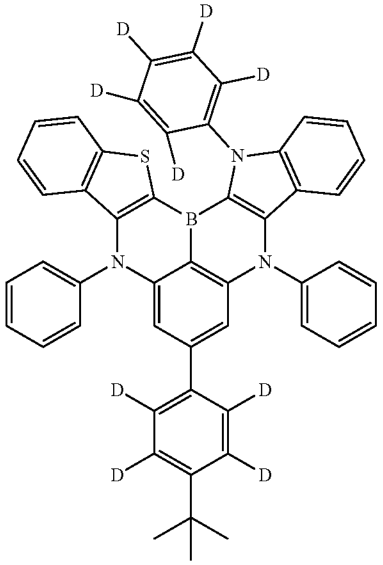
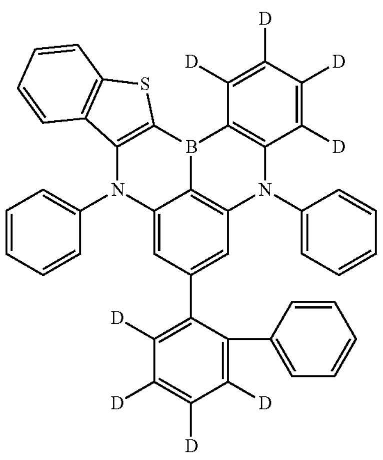
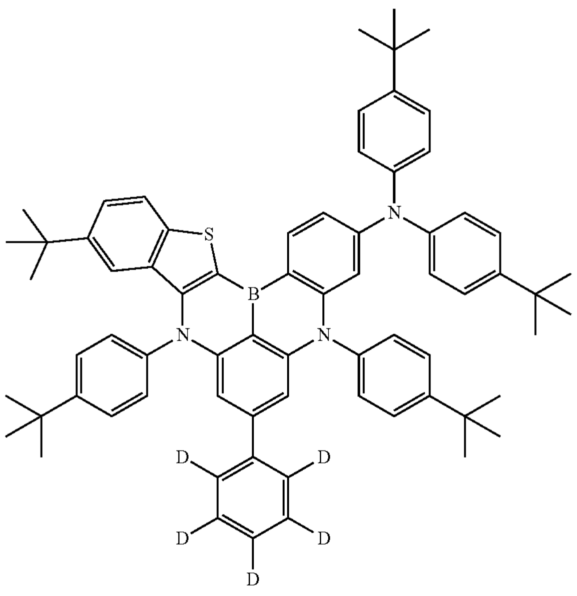
-continued
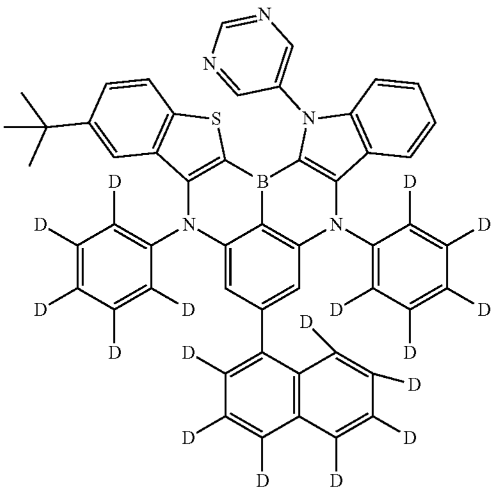
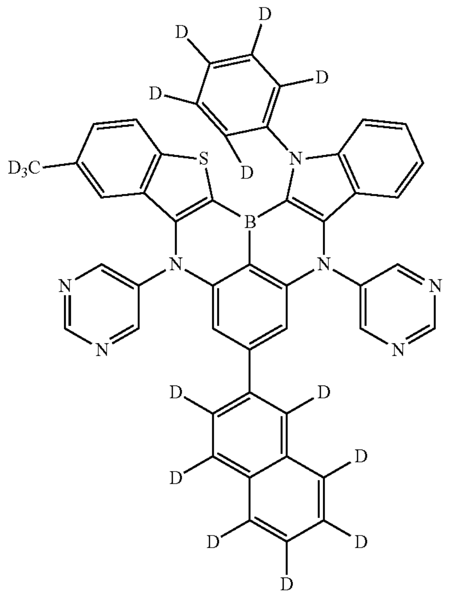
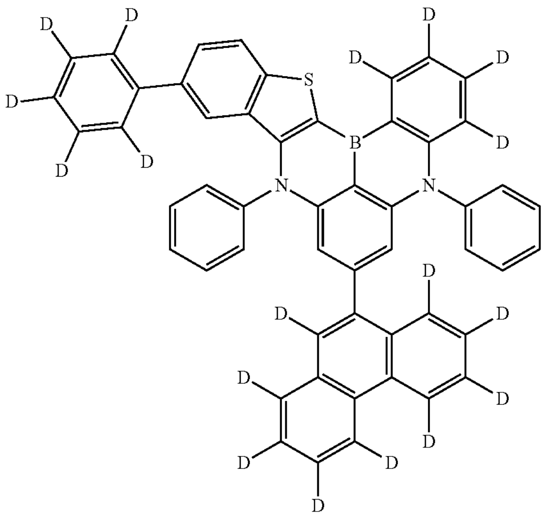

-continued
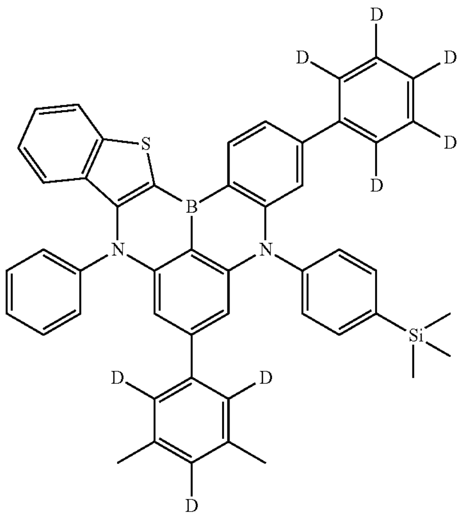
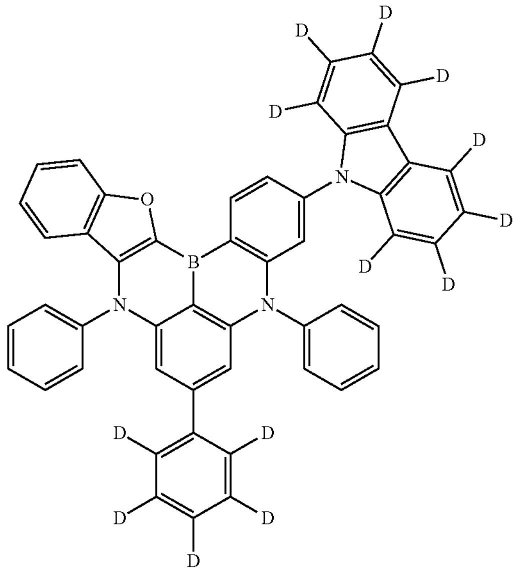
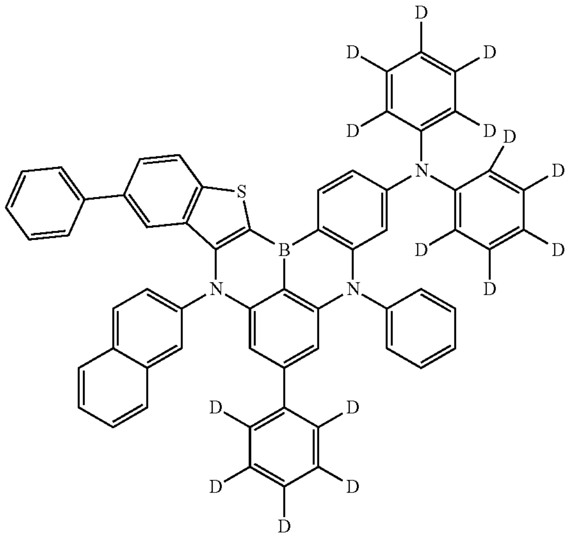
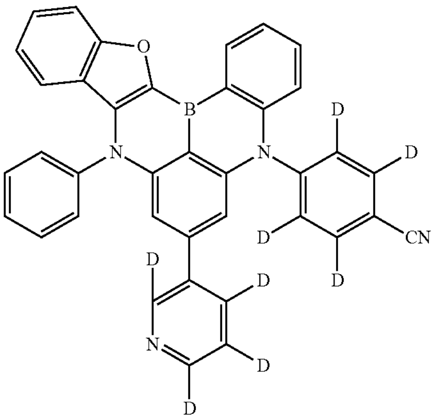
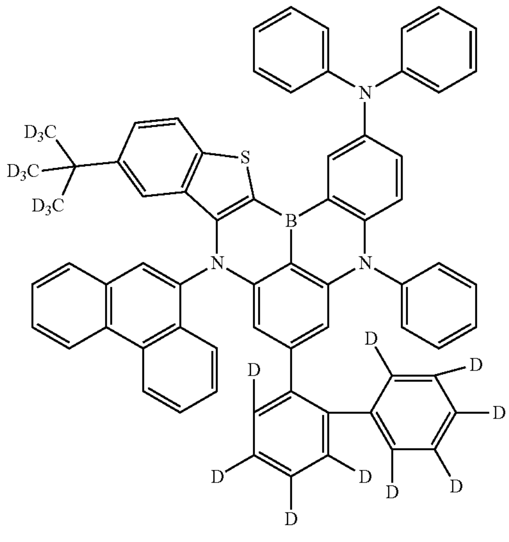
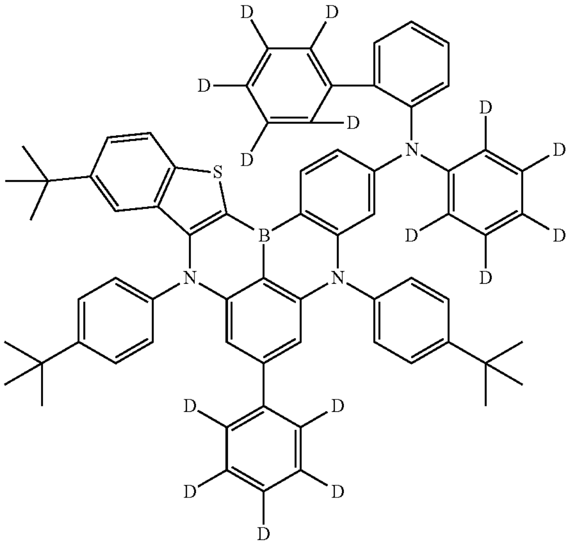

-continued
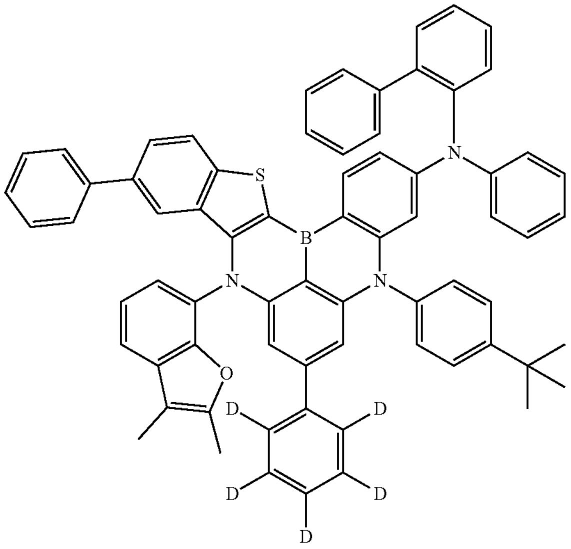
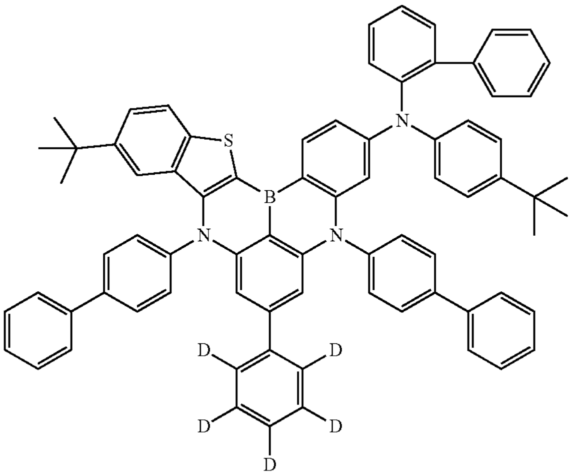
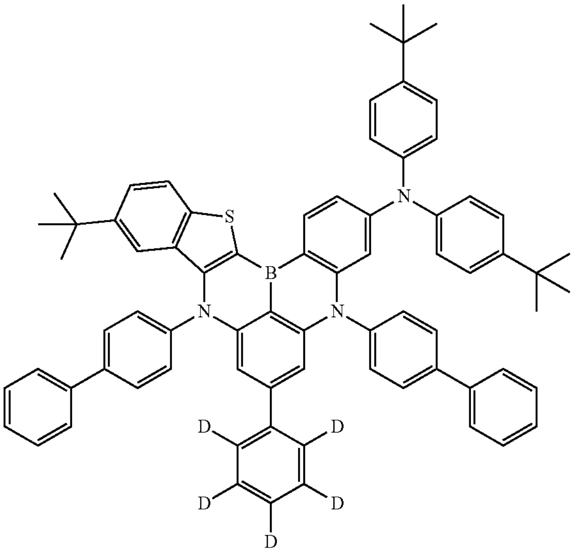
-continued
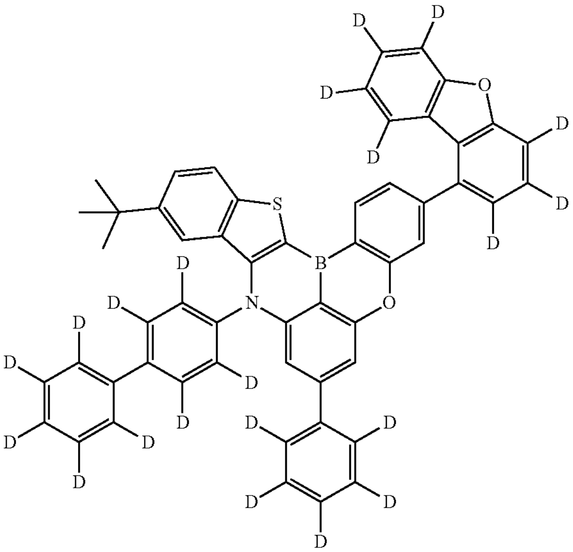
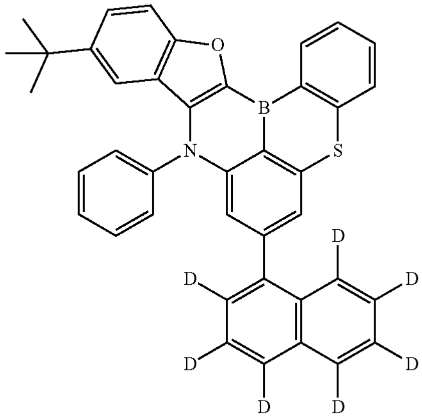
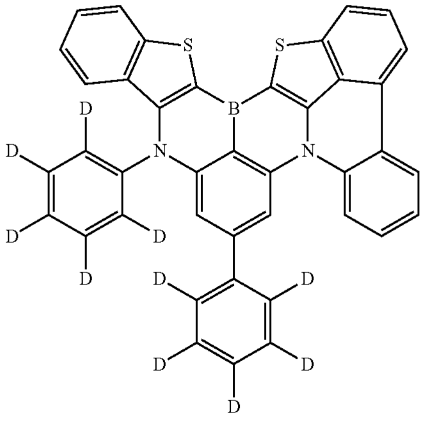

-continued
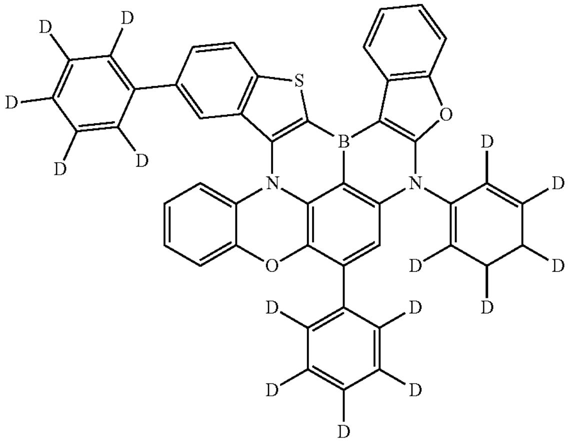
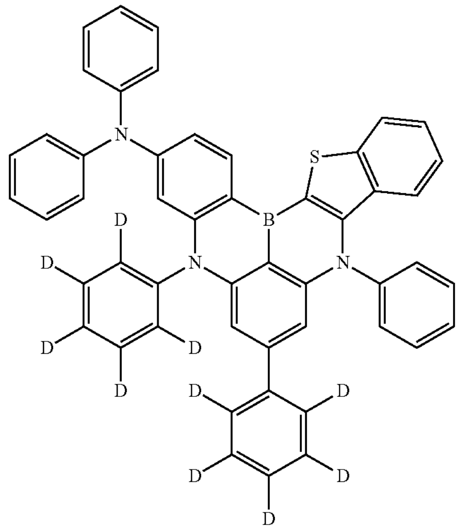
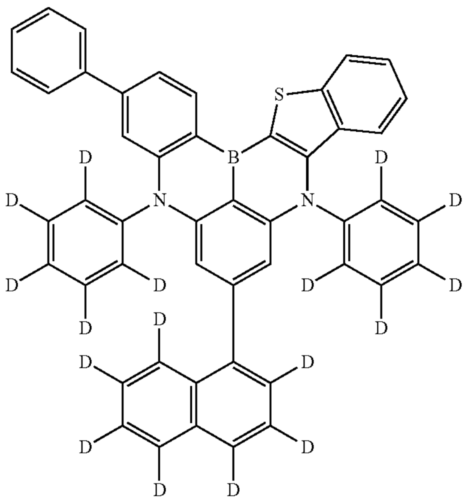
-continued
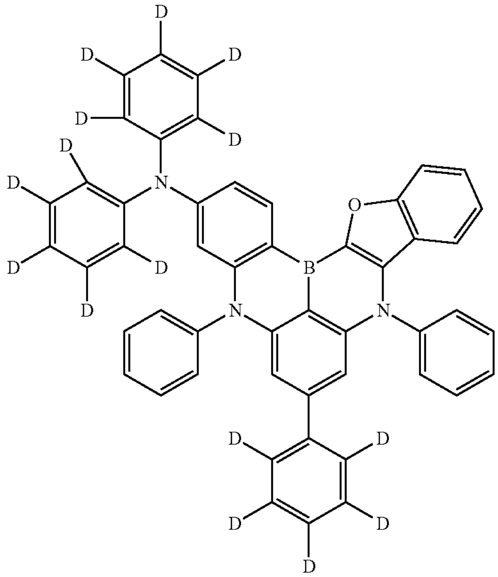
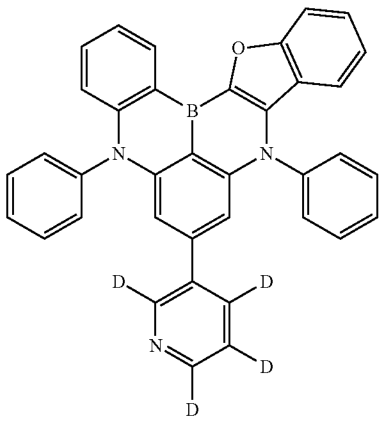
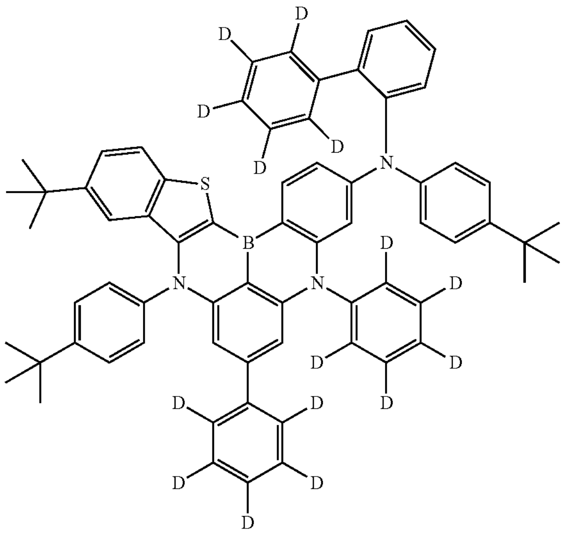

-continued
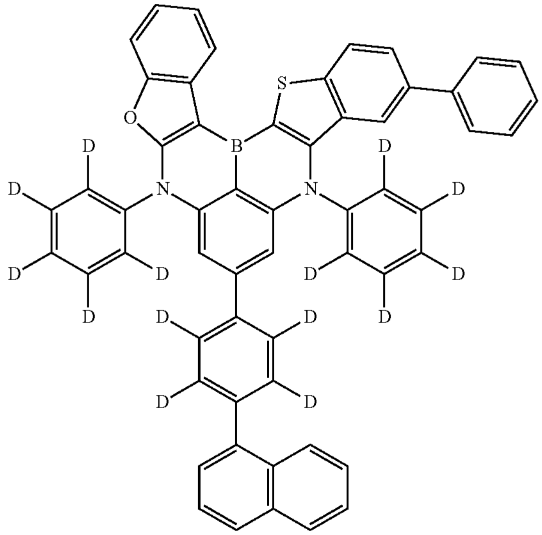
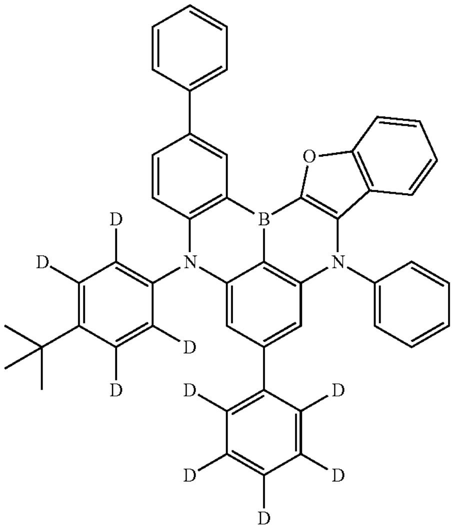
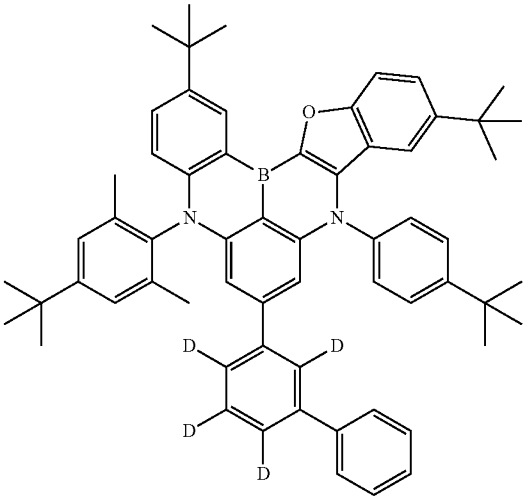
-continued
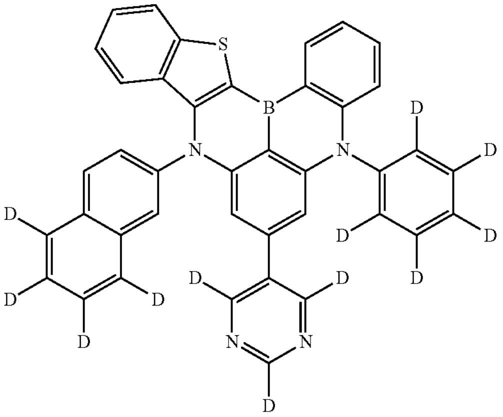
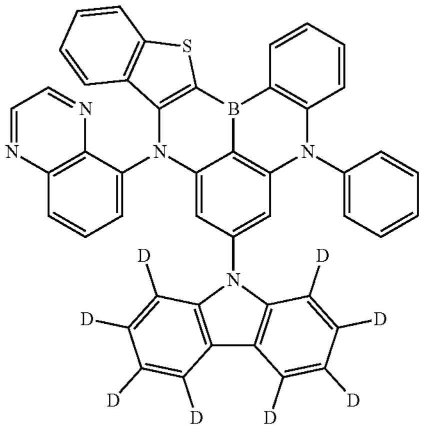
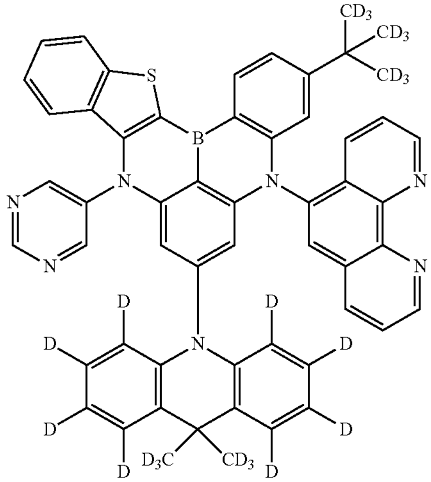

-continued
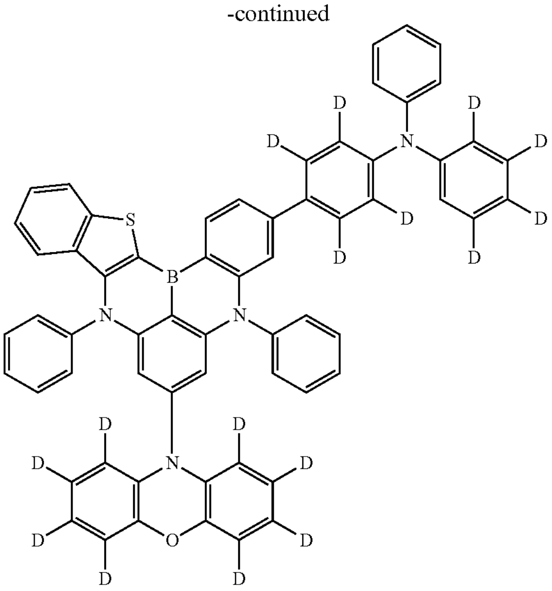
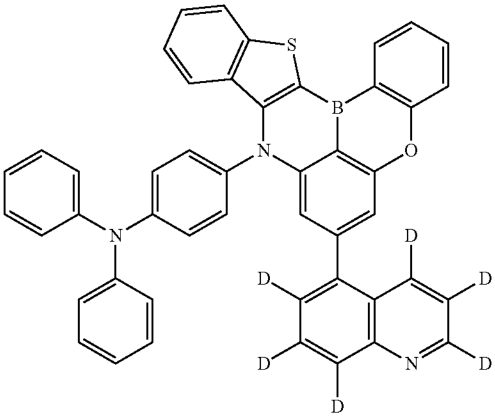
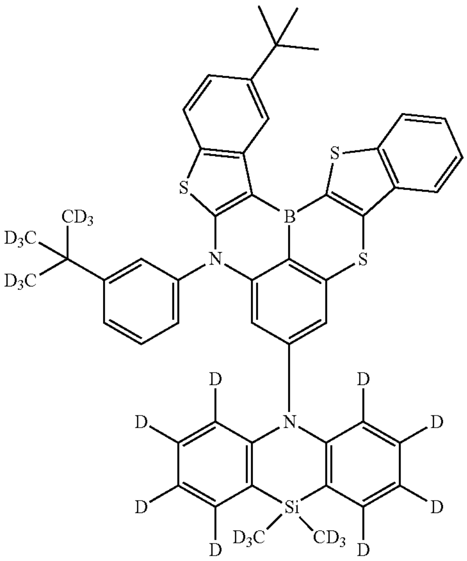
-continued
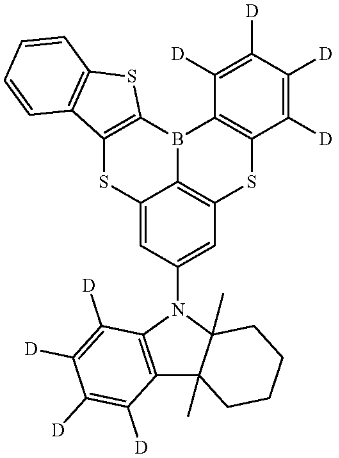
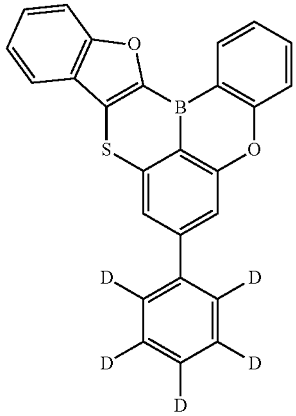
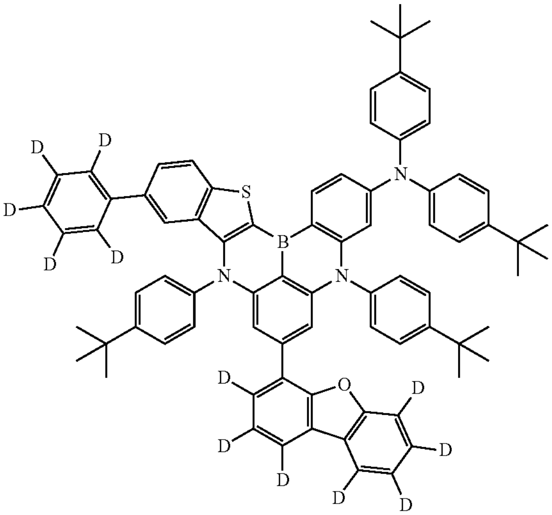

-continued
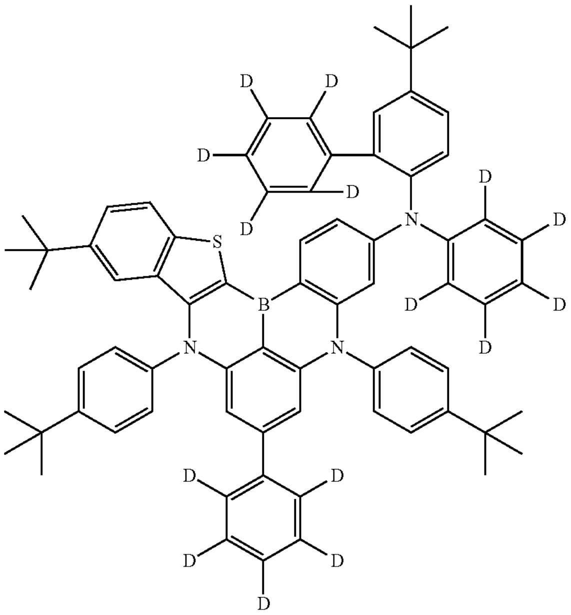
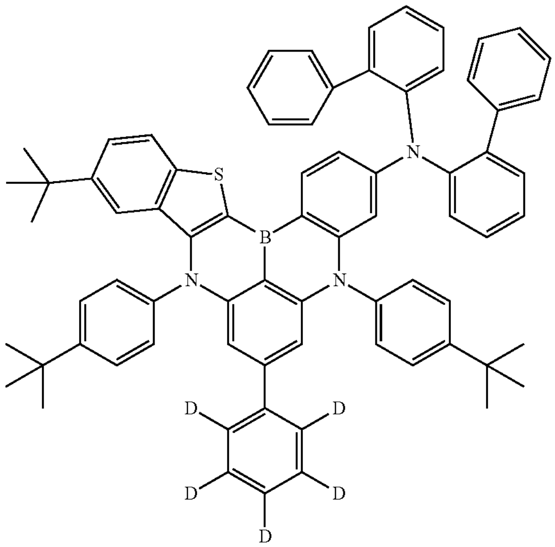
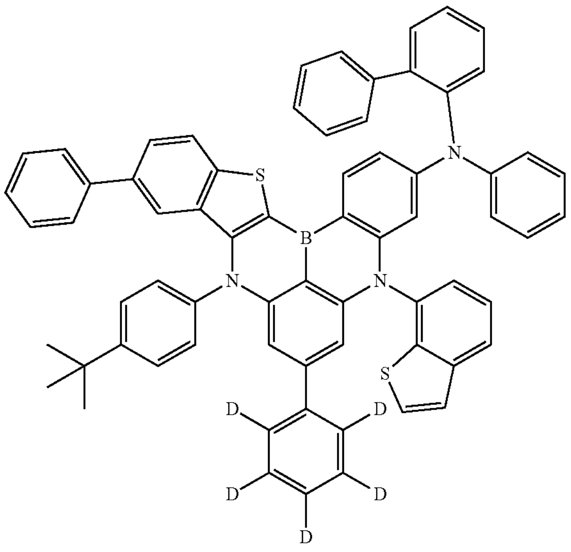
-continued
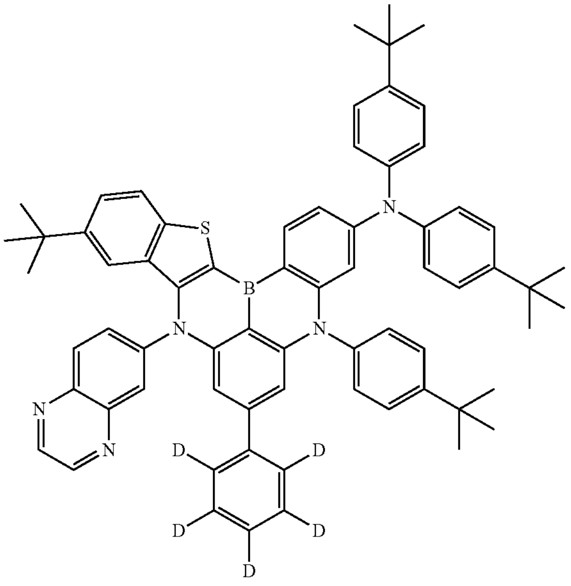
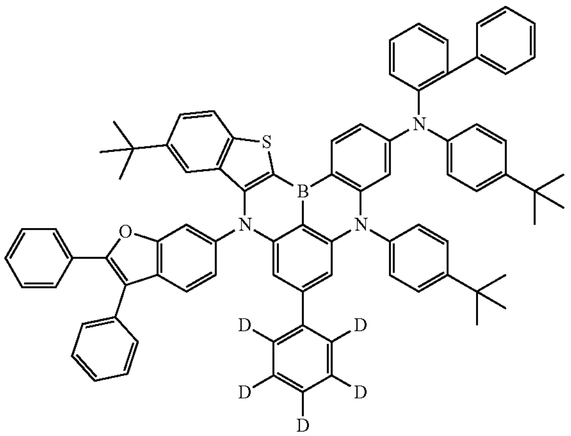
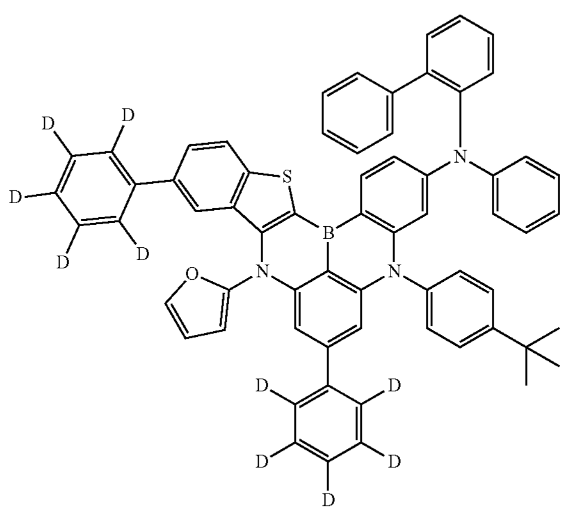

-continued
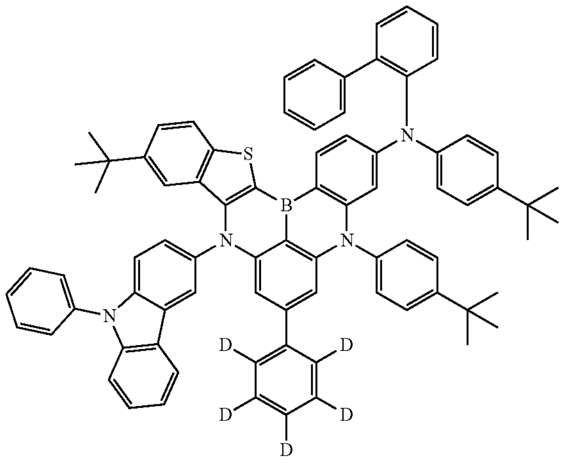
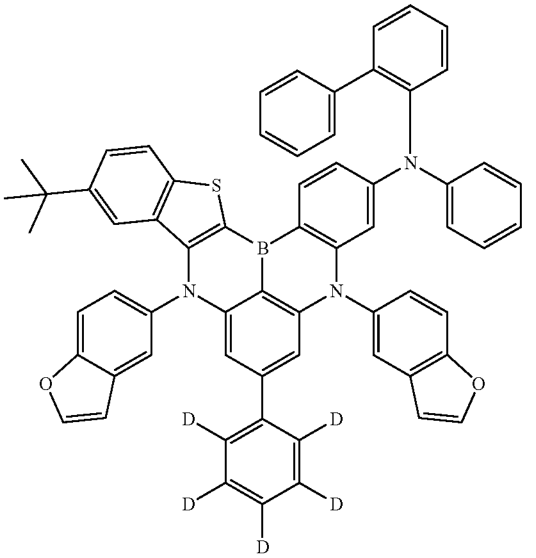
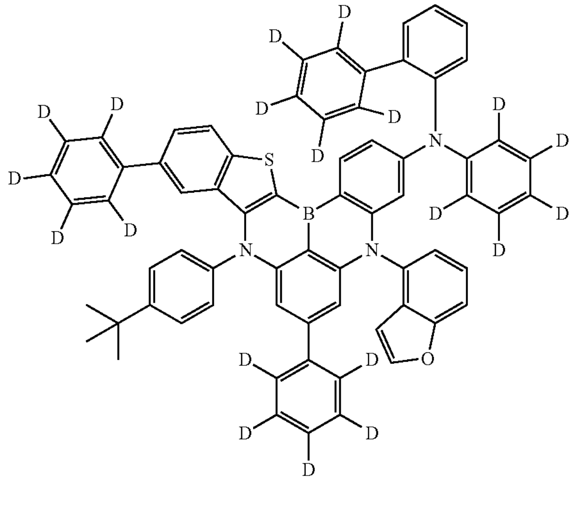
-continued
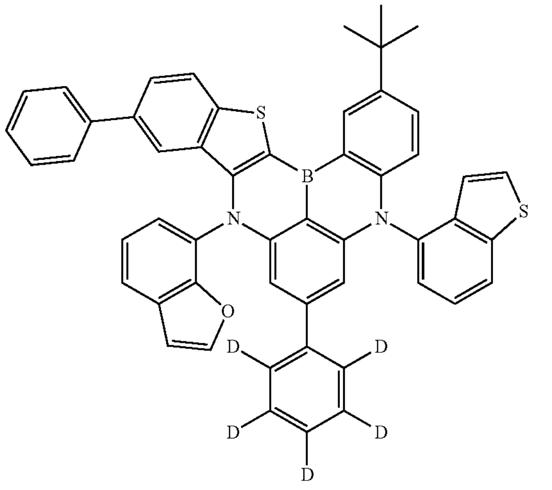
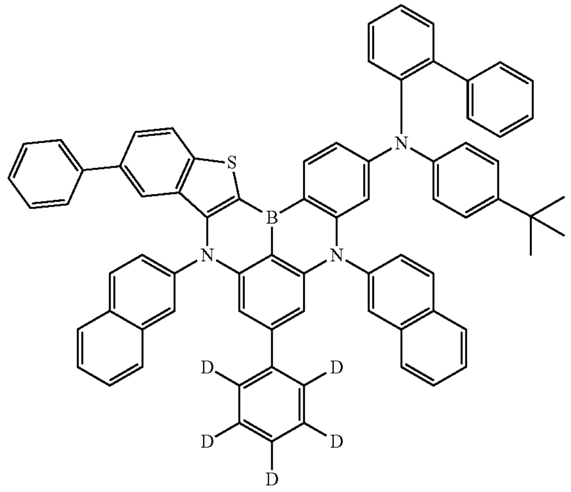
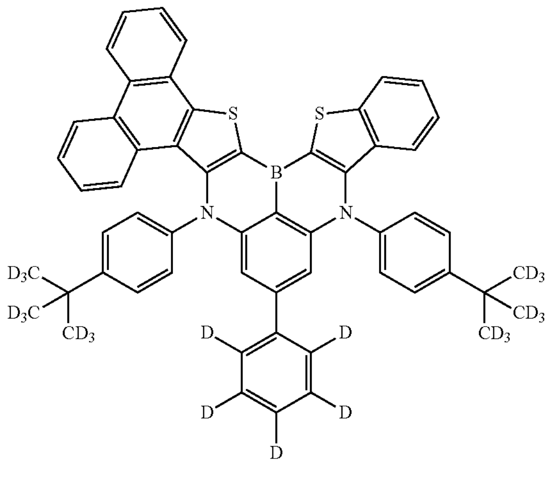

-continued
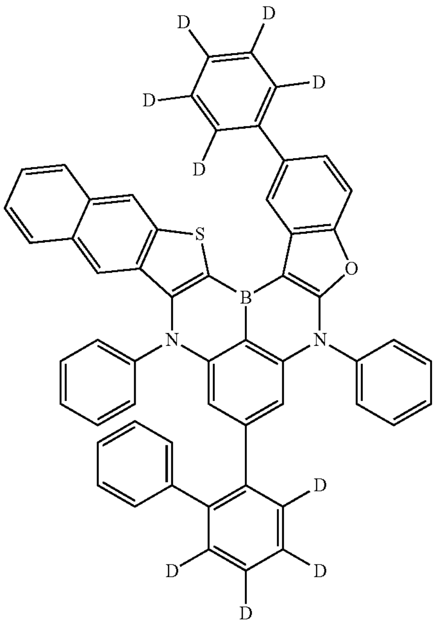
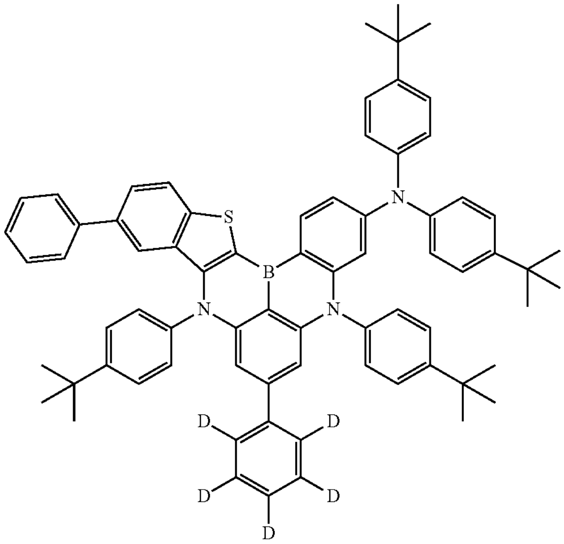
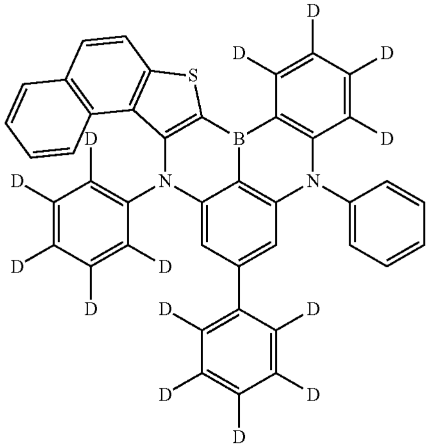
-continued
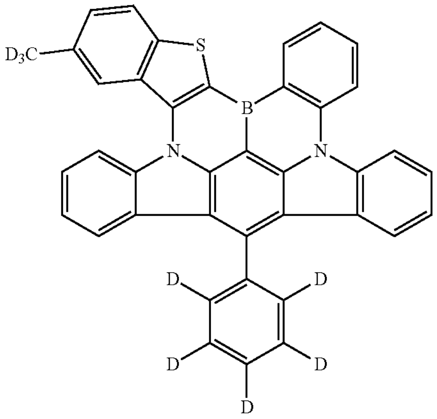
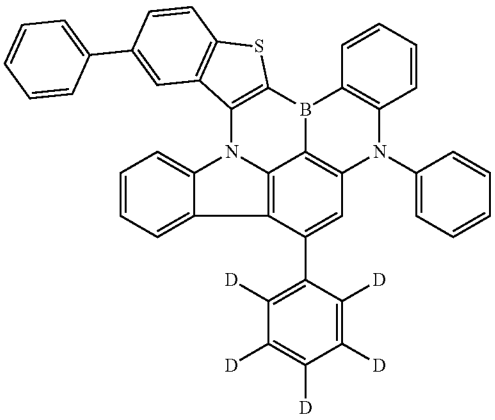
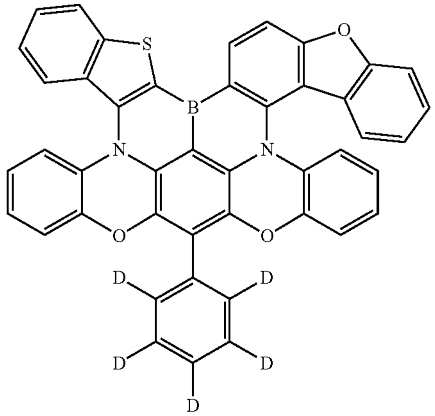
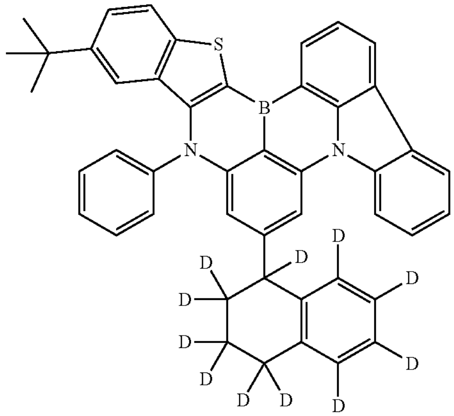

-continued
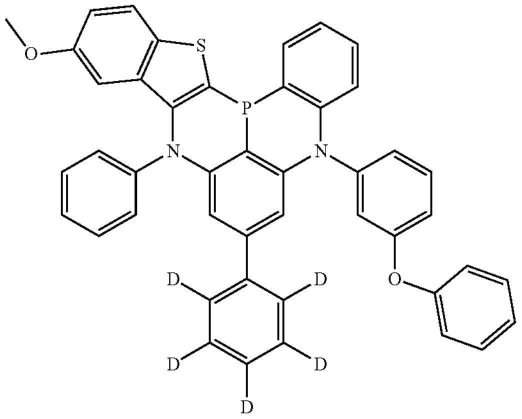
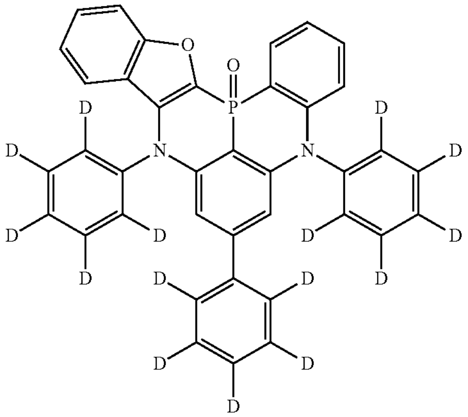
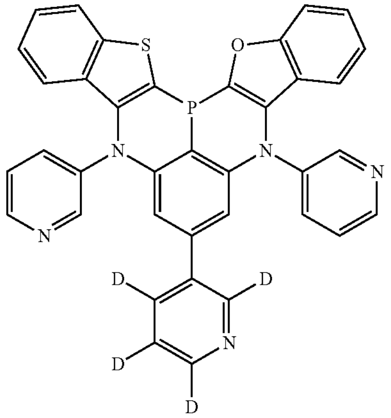
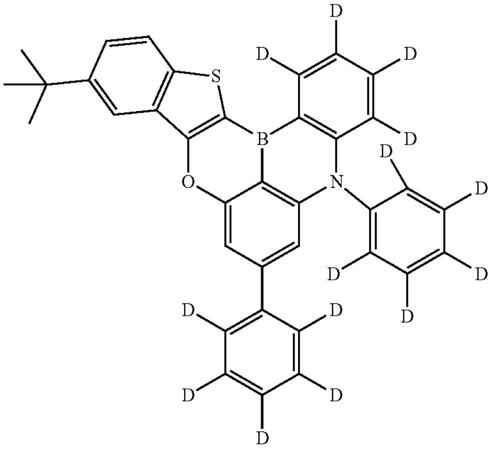
-continued
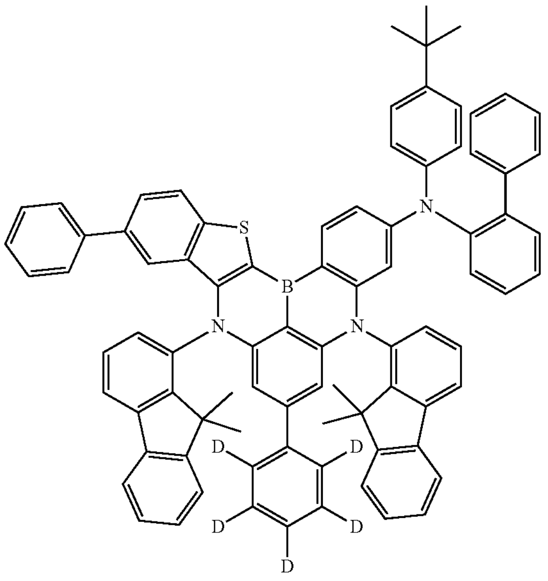
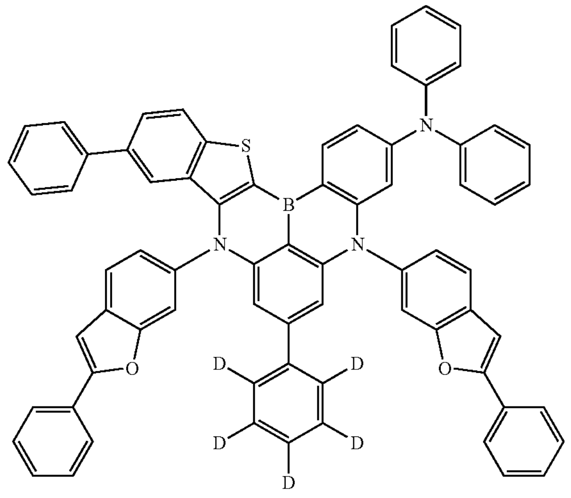
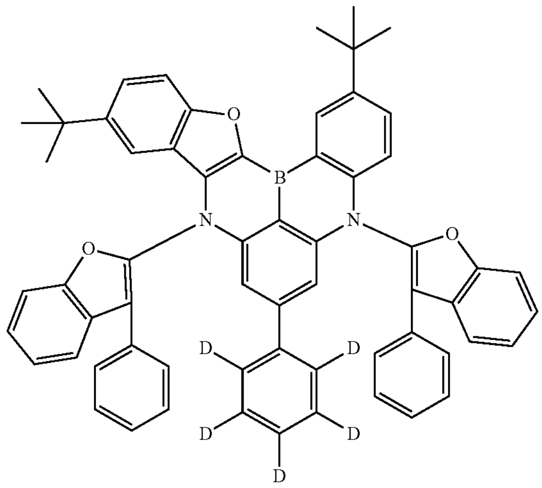

-continued

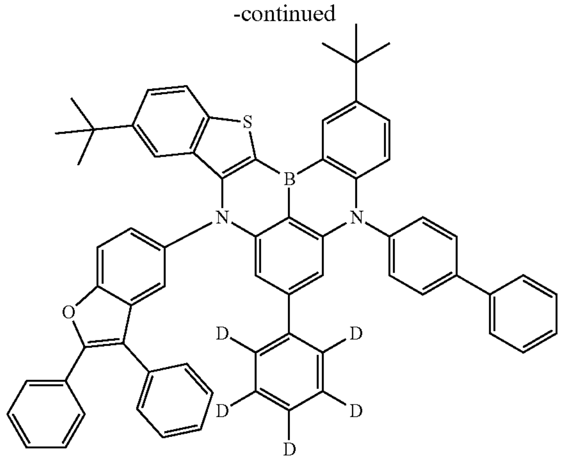

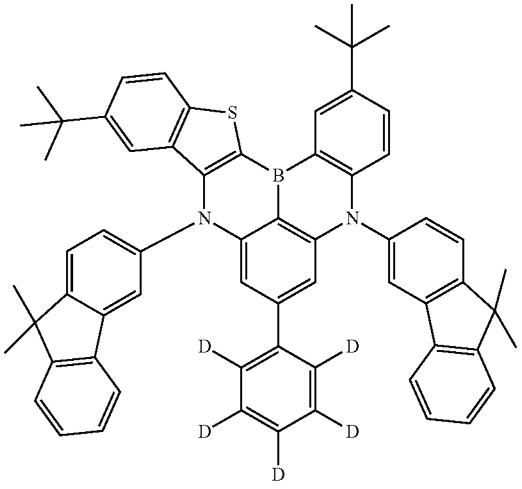

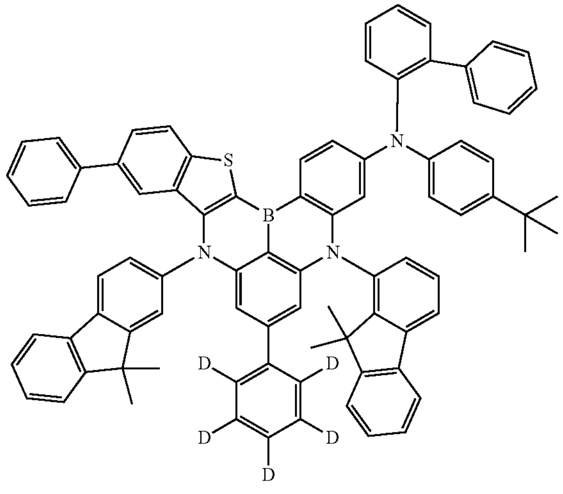

-continued

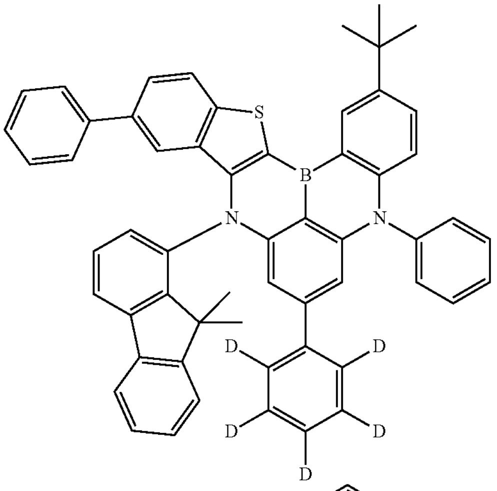

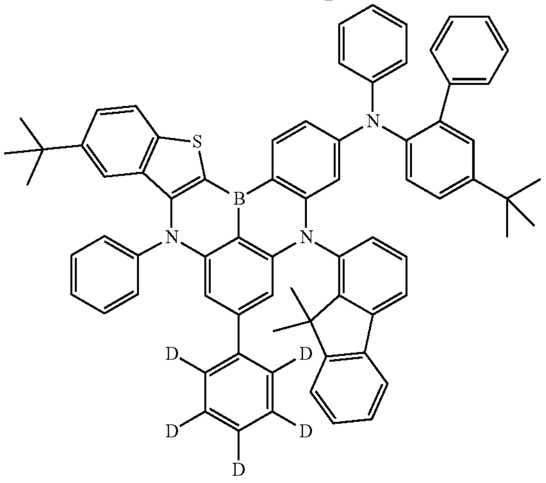

The specific substituents in Formula A-1 can be clearly seen from the structures of the compounds 1 to 76. However, the compounds 1 to 76 are not intended to limit the scope of Formula A-1.

Each of the above specific compounds contains boron (B), P═O or P═S and has a polycyclic structure. The introduction of specific substituents, including R substituted with at least one deuterium (D), into the polycyclic structure enables the synthesis of organic light emitting materials with inherent characteristics of the skeletal structure and the substituents. For example, the substituents are designed for use in materials for hole injecting layers, hole transport layers, light emitting layers, electron transport layers, electron injecting layers, electron blocking layers, and hole blocking layers, preferably light emitting layers, of organic light emitting devices. This introduction meets the requirements of materials for the organic layers, making the organic light emitting devices last longer.

A further aspect of the present invention is directed to an organic light emitting device including a first electrode, a second electrode, and one or more organic layers interposed between the first and second electrodes wherein one of the organic layers includes at least one of the compounds that can be represented by Formula A-1.

That is, according to one embodiment of the present invention, the organic light emitting device has a structure in which one or more organic layers are arranged between a first electrode and a second electrode. The organic light emitting device of the present invention may be fabricated by suitable methods and materials known in the art, except that the compound of Formula A-1 is used to form the corresponding organic layer.

The organic layers of the organic light emitting device according to the present invention may form a monolayer structure. Alternatively, the organic layers may be stacked together to form a multilayer structure. For example, the organic layers may have a structure including a hole injecting layer, a hole transport layer, a hole blocking layer, a light emitting layer, an electron blocking layer, an electron transport layer, and an electron injecting layer but are not limited to this structure. The number of the organic layers is not limited and may be increased or decreased. Preferred structures of the organic layers of the organic light emitting device according to the present invention will be explained in more detail in the Examples section that follows.

The organic light emitting device of the present invention includes an anode, a hole transport layer, a light emitting layer, an electron transport layer, and a cathode. The organic light emitting device of the present invention may optionally further include a hole injecting layer between the anode and the hole transport layer and an electron injecting layer between the electron transport layer and the cathode. If necessary, the organic light emitting device of the present invention may further include one or two intermediate layers such as a hole blocking layer or an electron blocking layer.

According to a preferred embodiment of the present invention, one of the organic layers interposed between the first and second electrodes may be a light emitting layer composed of a host and the compound represented by Formula A-1 as a dopant.

The content of the dopant in the light emitting layer is typically in the range of about 0.01 to about 20 parts by weight, based on about 100 parts by weight of the host but is not limited to this range.

According to one embodiment of the present invention, the host may be an anthracene derivative represented by Formula B:

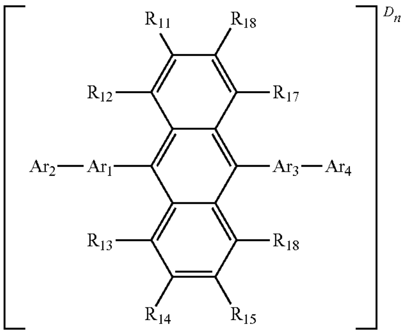

wherein $R_{11}$ to $R_{18}$ are the same as or different from each other and are each independently selected from hydrogen, substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted $C_3$-$C_{30}$ mixed aliphatic-aromatic cyclic groups, nitro, cyano, and halogen, $Ar_1$ and $Ar_3$ are the same as or different from each other and are each independently substituted or unsubstituted $C_6$-$C_{30}$ arylene, $Ar_2$ and $Ar_4$ are the same as or different from each other and are each independently selected from hydrogen, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, and substituted or unsubstituted $C_3$-$C_{30}$ mixed aliphatic-aromatic cyclic groups, $D_n$ represents the replacement of hydrogen with deuterium, and n is an integer from 0 to 50.

The anthracene host derivative represented by Formula B may be selected from the following compounds:

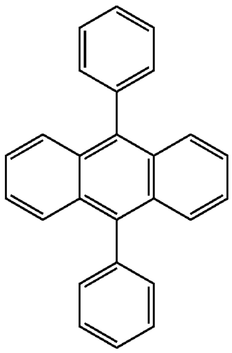

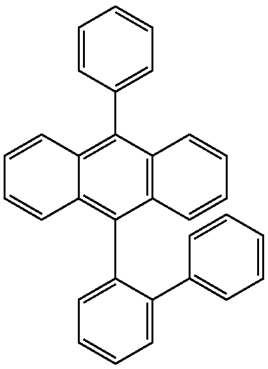

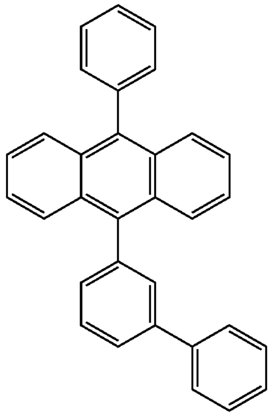

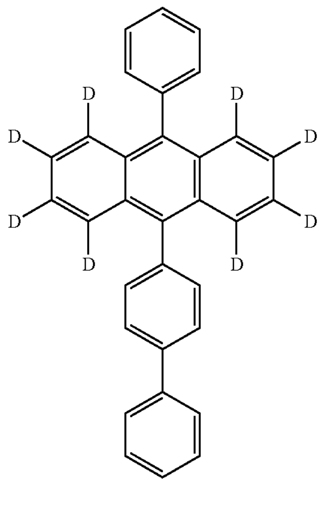

-continued
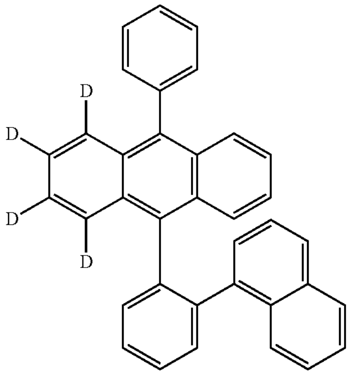
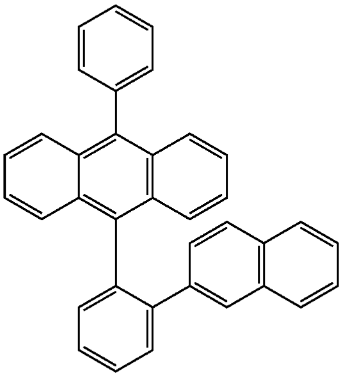
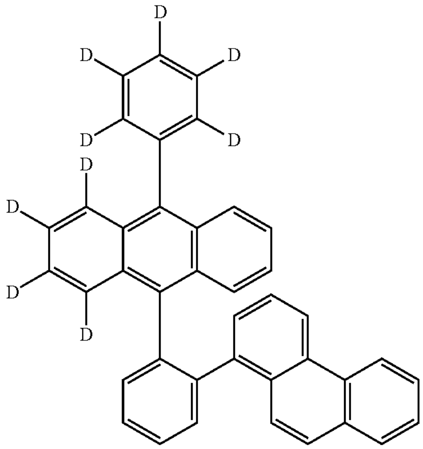
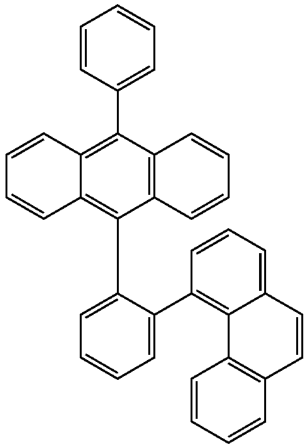
-continued
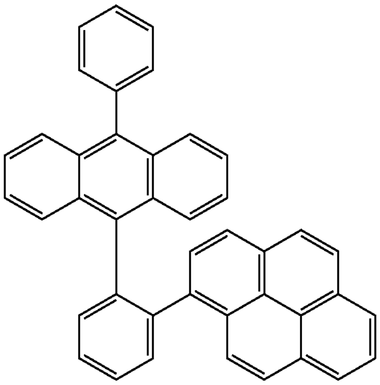
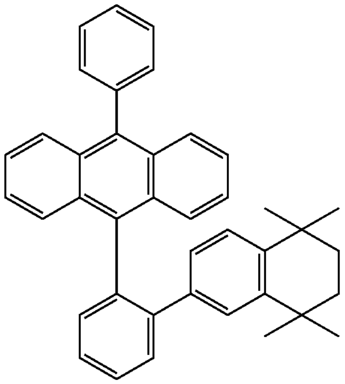
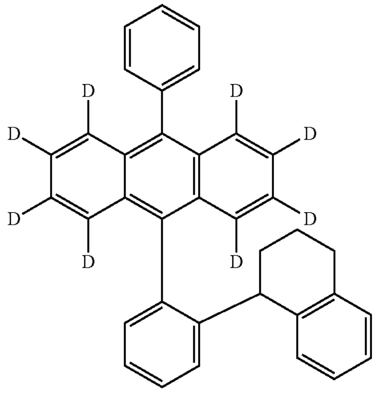
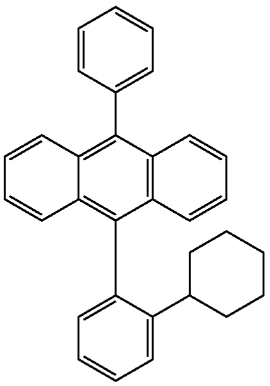
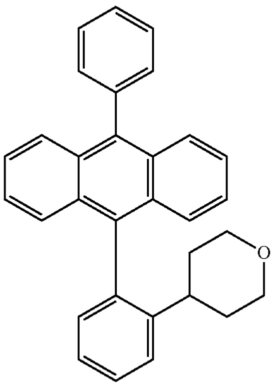

-continued
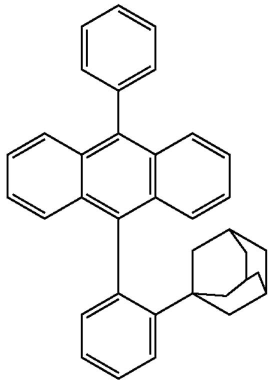
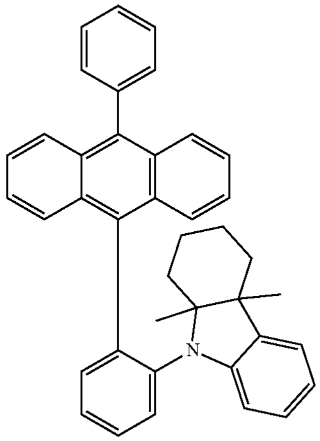
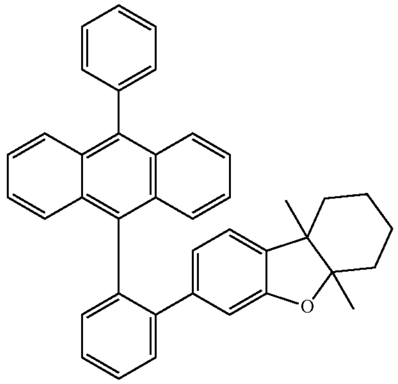
-continued
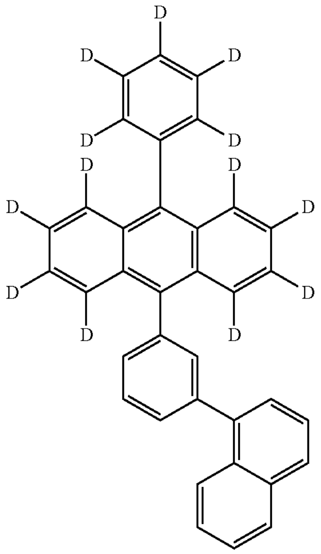
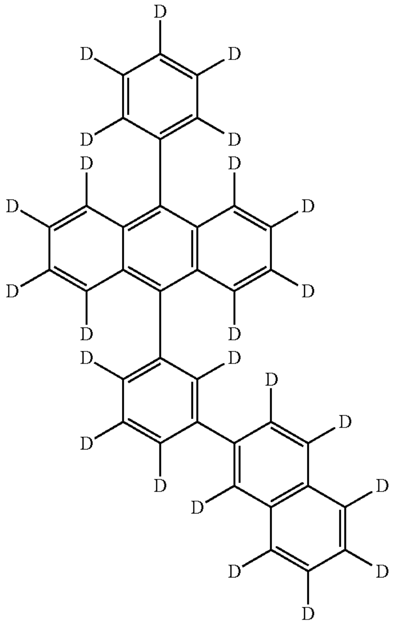
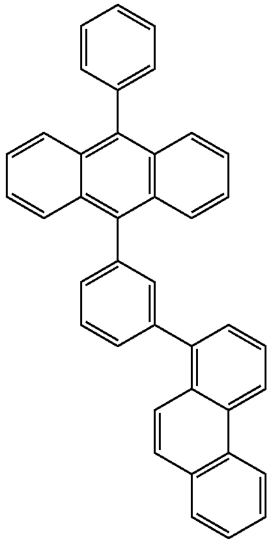
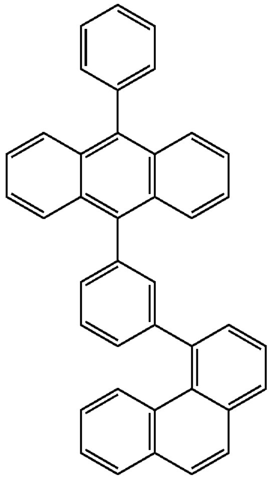

-continued
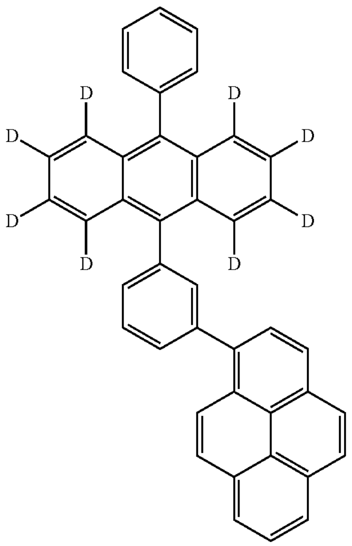
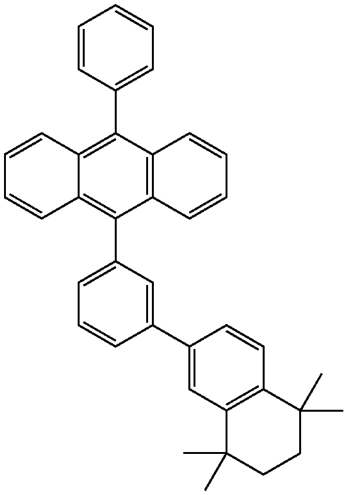
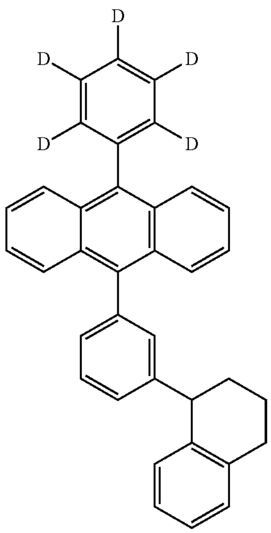
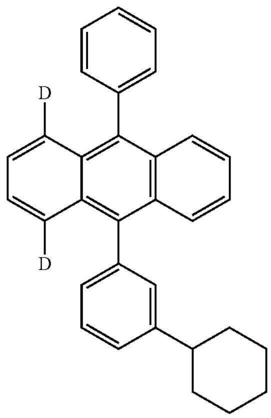
-continued
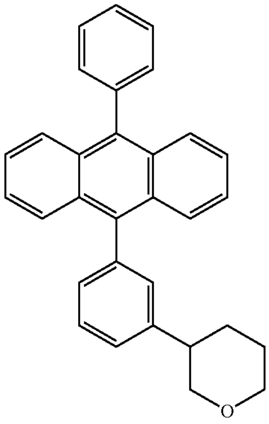
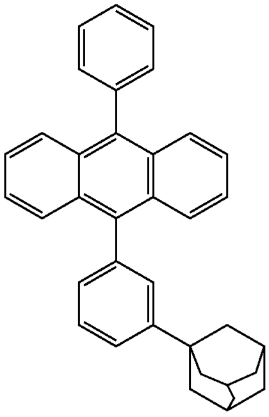
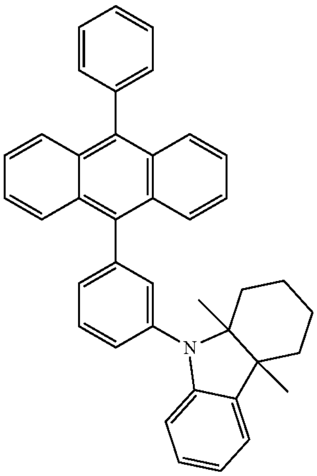
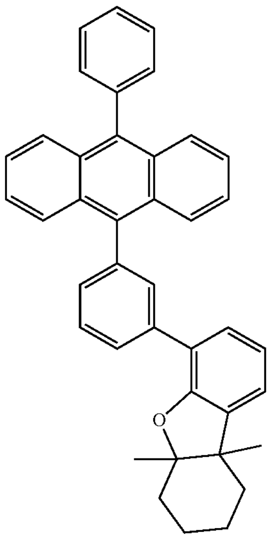

-continued
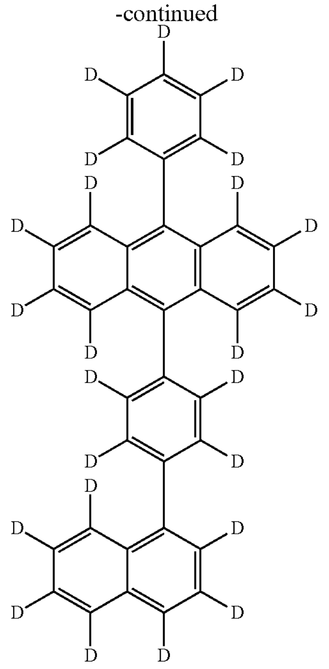
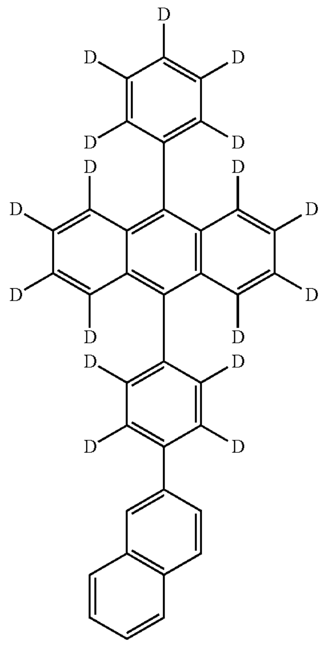
-continued
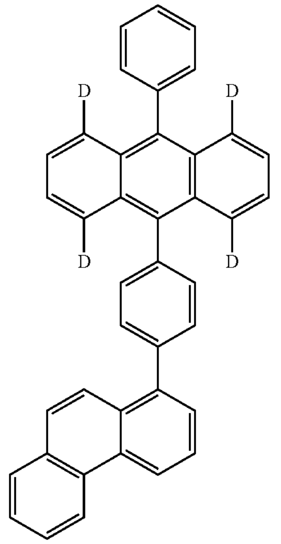
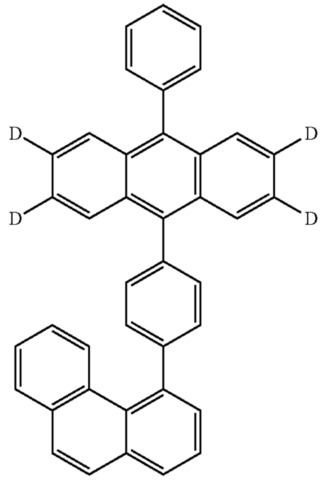
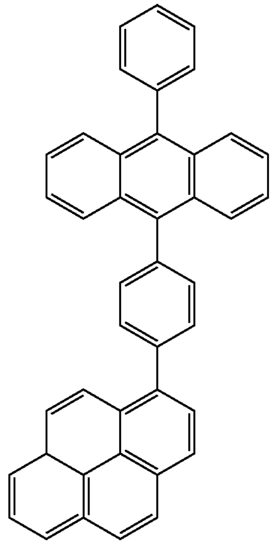
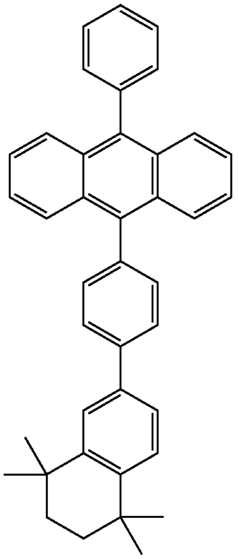

-continued
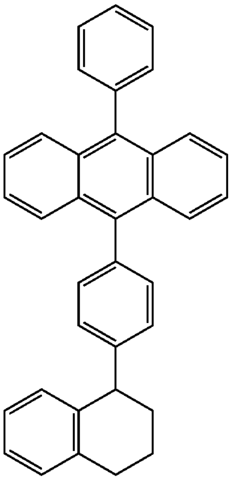
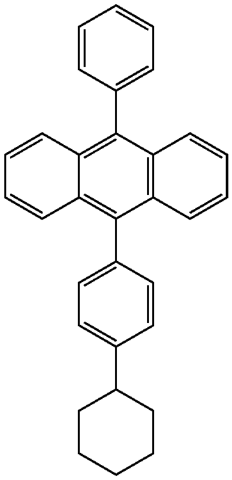
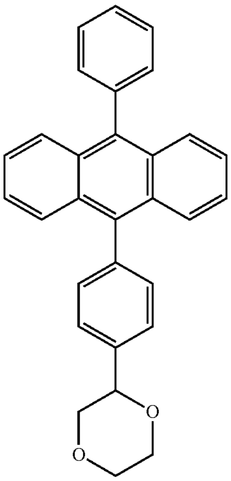
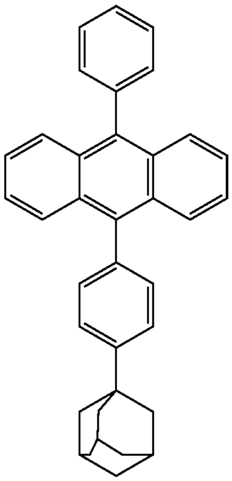
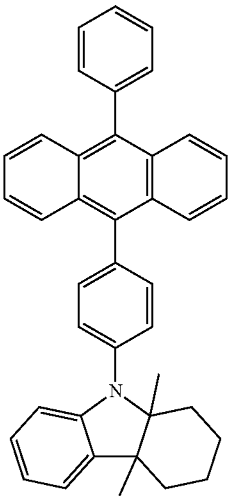
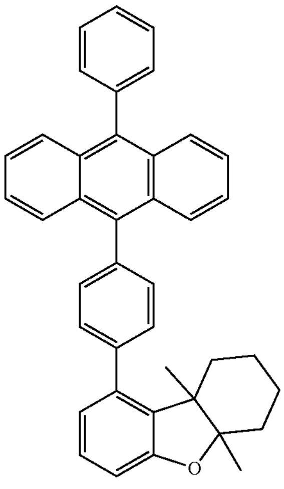
-continued
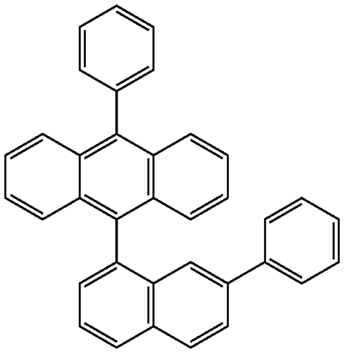
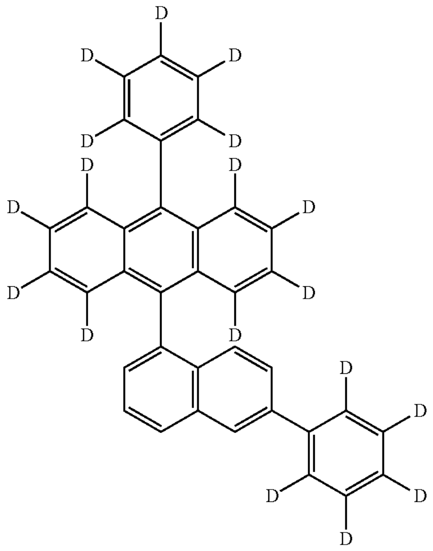
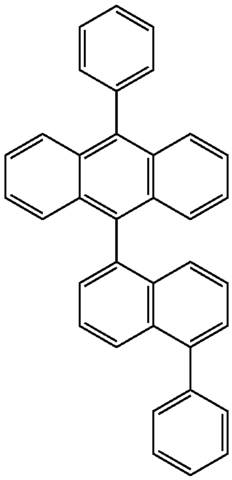
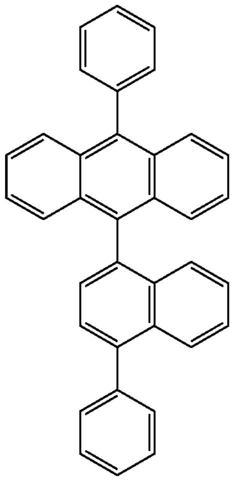

-continued
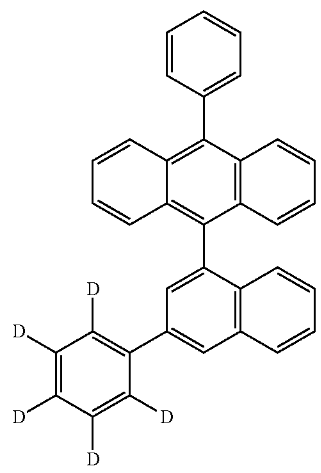
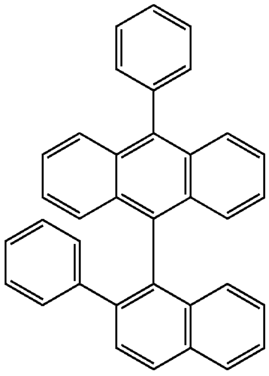
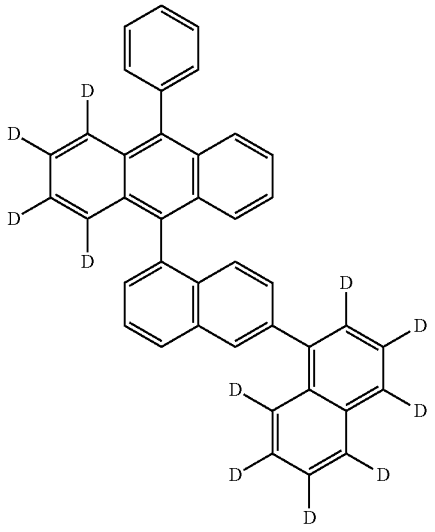
-continued
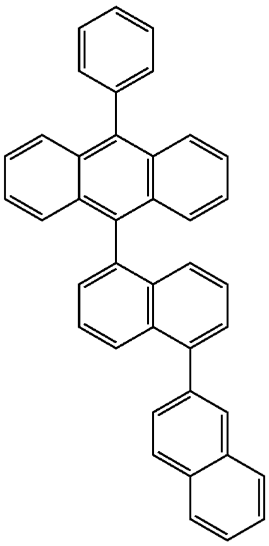
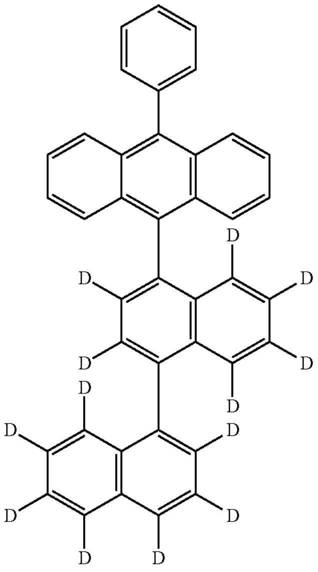
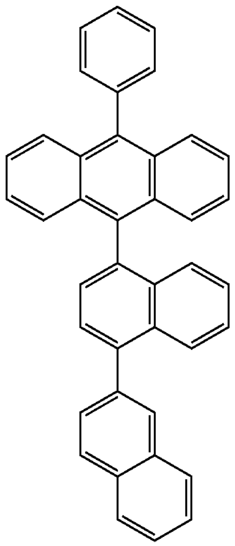
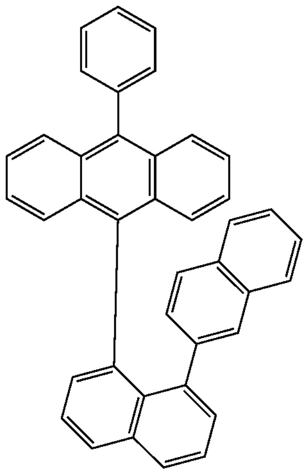

-continued
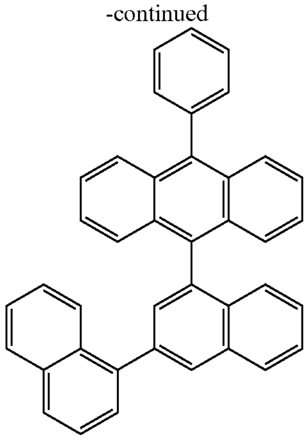
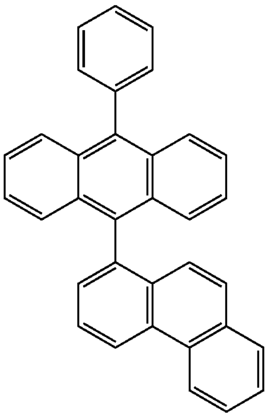
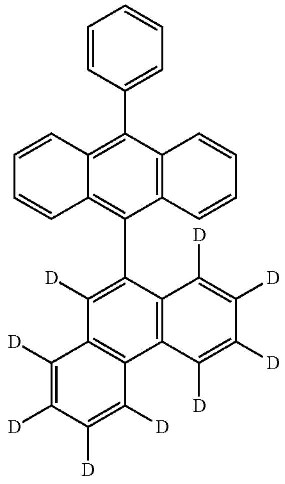
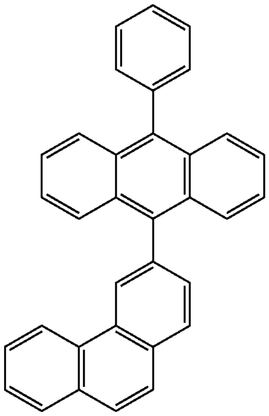
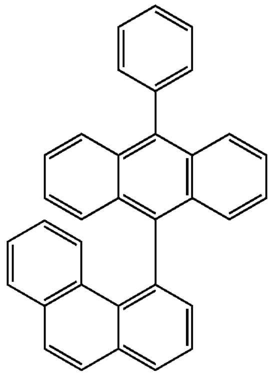
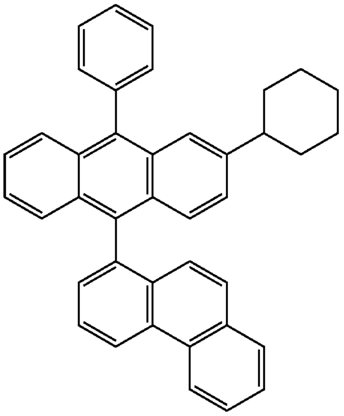
-continued
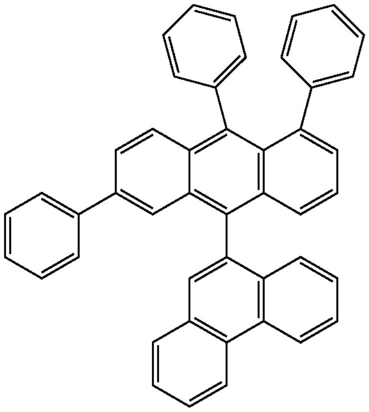
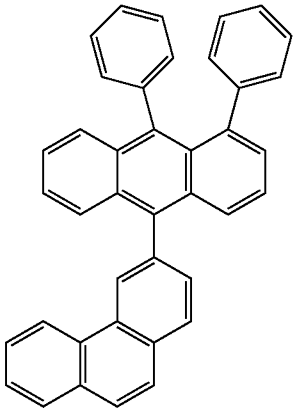
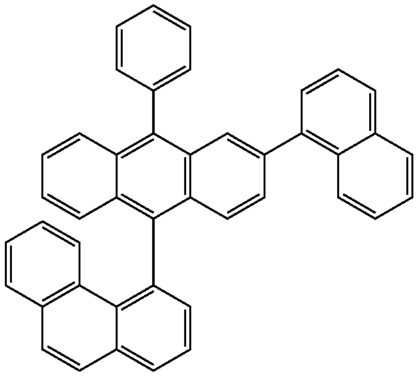
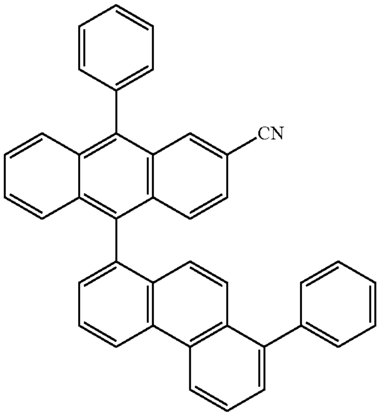

-continued
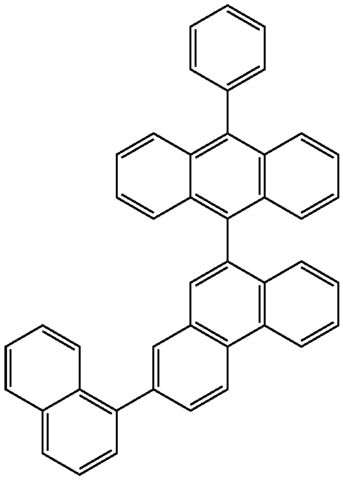
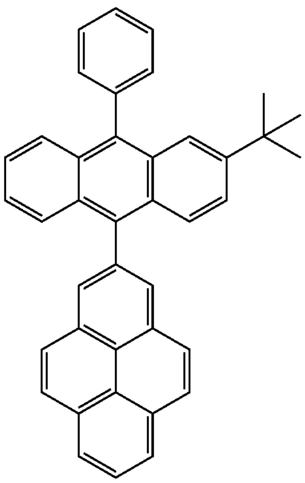
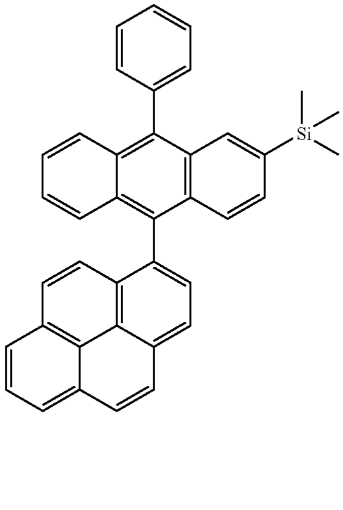
-continued
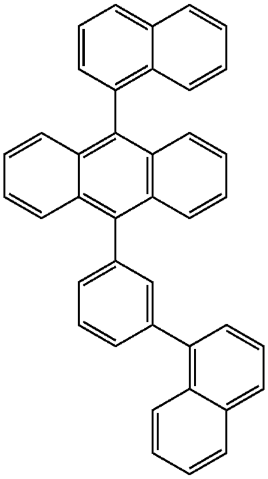
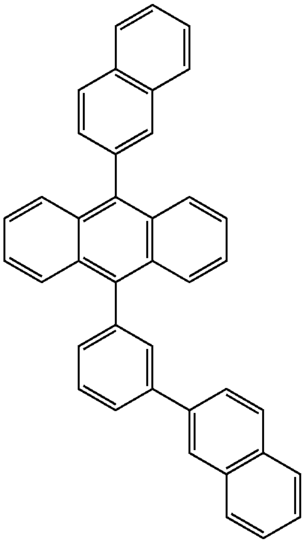
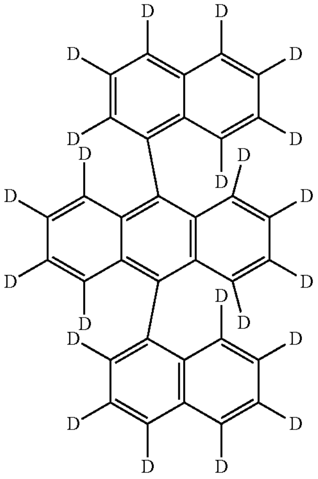
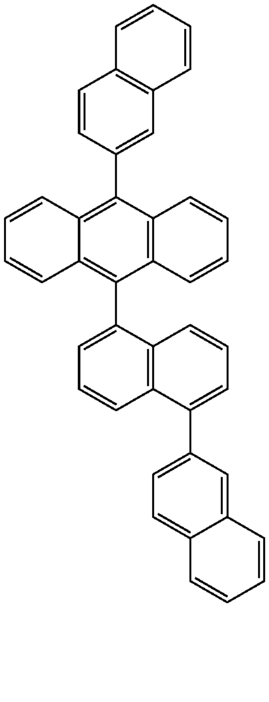

-continued
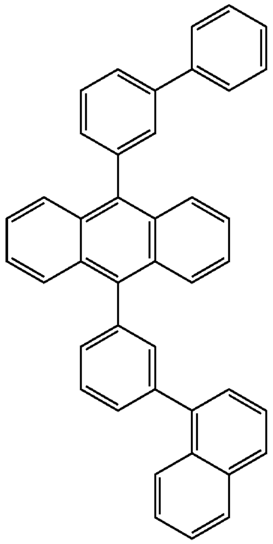
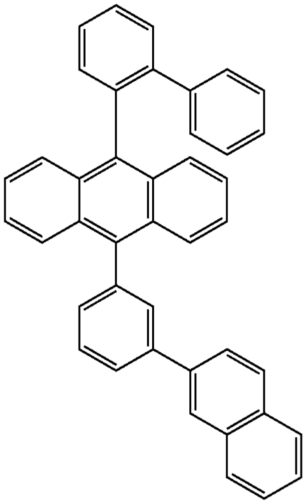
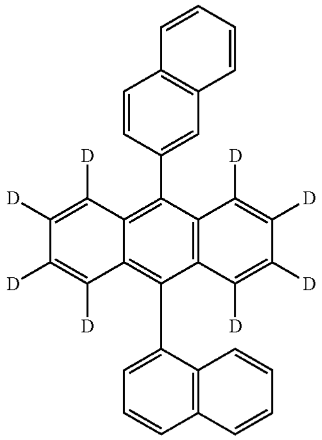
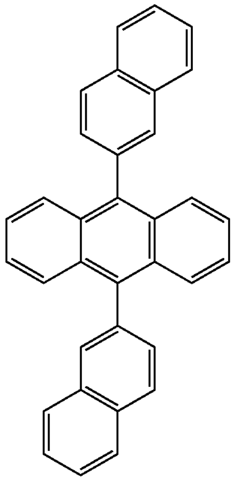
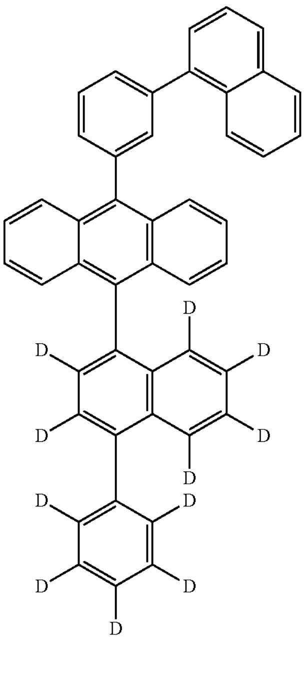
-continued
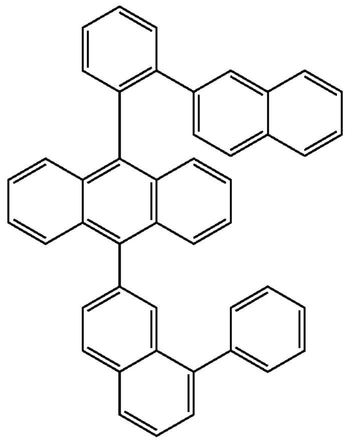
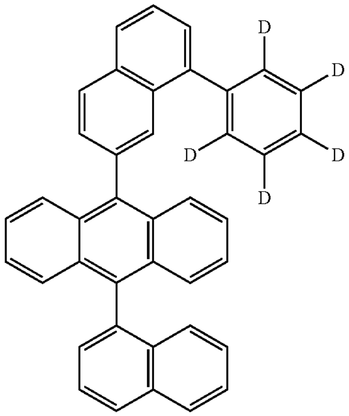
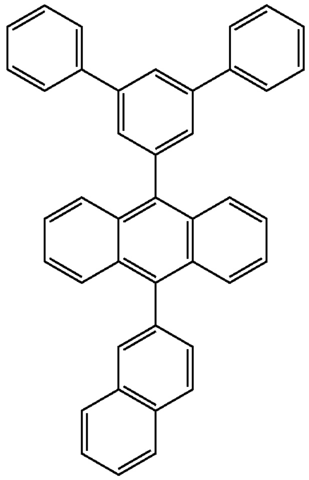

-continued

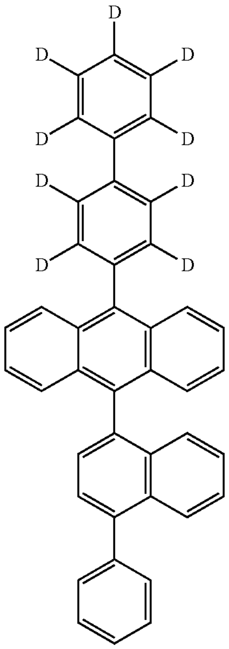

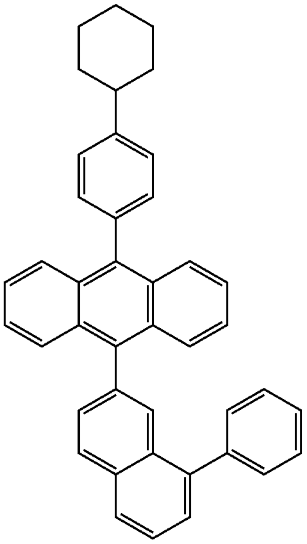

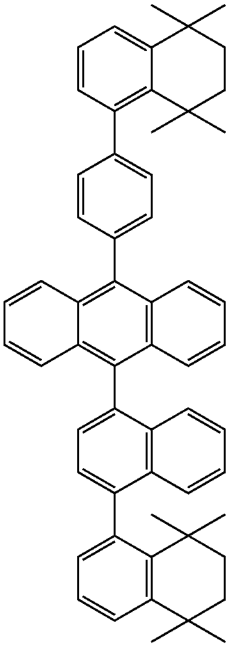

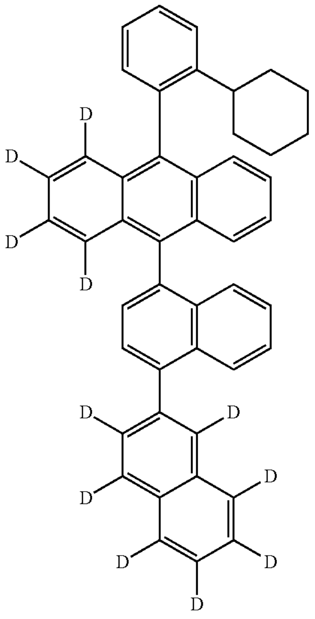

-continued

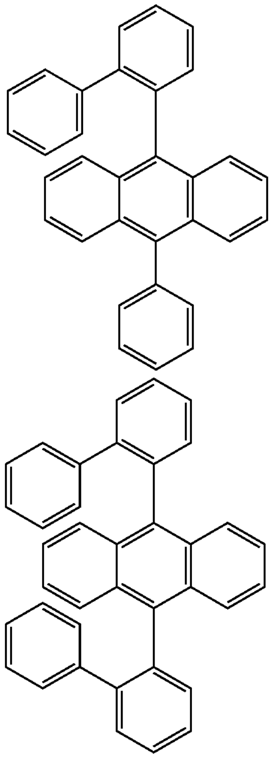

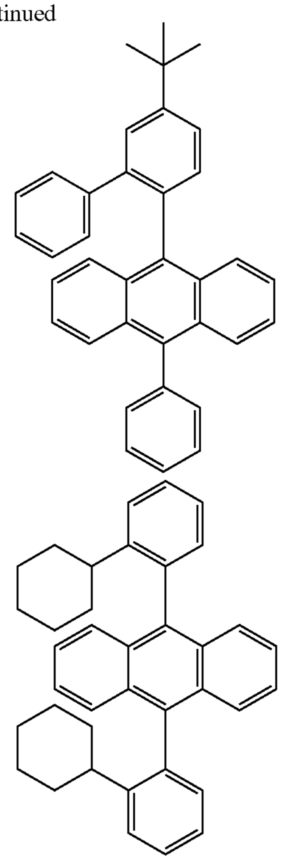

However, these compounds are not intended to limit the scope of Formula B.

The light emitting layer may further include various host materials and various dopant materials in addition to the dopant represented by Formula A-1 and the host represented by Formula B. One or more hosts other than the anthracene compound represented by Formula B may be mixed or stacked in the light emitting layer and one or more dopants other than the polycyclic compound represented by Formula A-1 may be mixed or stacked in the light emitting layer.

A specific structure of the organic light emitting device according to one embodiment of the present invention, a method for fabricating the device, and materials for the organic layers are as follows.

First, an anode material is coated on a substrate to form an anode. The substrate may be any of those used in general organic light emitting devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide ($SnO_2$) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited so long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3- methylphenyl)-1,1'-biphenyl-4,4'-diamine (TPD), N,N'-diphenyl-N,N'-bis(4-(phenyl-m-tolylamino)phenyl) biphenyl-4,4'-diamine (DNTPD), and 1,4,5,8,9,11-hexaazatriphenylenehexacarbonitrile (HAT-CN).

The hole transport material is not specially limited so long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine (α-NPD).

Subsequently, a hole auxiliary layer and a light emitting layer are sequentially stacked on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic light emitting device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic light emitting device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate) (Bebq2), and oxadiazole derivatives such as PBD, BMD, and BND.

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent and the mixture is then formed into a thin film by a suitable method such as ink-jet printing, roll-to-roll coating, screen printing, spray coating, dip coating or spin coating.

The organic light emitting device of the present invention can be used in a display or lighting system selected from flat panel displays, flexible displays, monochromatic flat panel lighting systems, white flat panel lighting systems, flexible monochromatic lighting systems, flexible white lighting systems, displays for automotive applications, displays for virtual reality, and displays for augmented reality.

MODE FOR CARRYING OUT THE INVENTION

Synthesis Example 1. Synthesis of 12

Synthesis Example 1-1: Synthesis of A-1

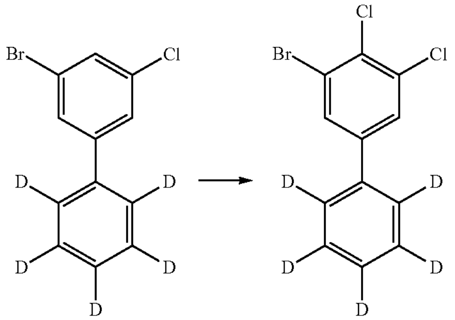

A-1a A-1

50 g of A-1a and 50 mL of tetrahydrofuran were placed in a reactor and 140 mL of a 2.0 M lithium diisopropylamide solution was added dropwise thereto at −78° C. After stirring at −78° C. for 3 h, hexachloroethane was slowly added. The mixture was allowed to warm to room temperature, followed by stirring for 16 h. To the reaction mixture were added ethyl acetate and water. The organic layer was separated and purified by silica gel chromatography to afford A-1 (42.5 g, 78.9%).

Synthesis Example 1-2: Synthesis of A-2

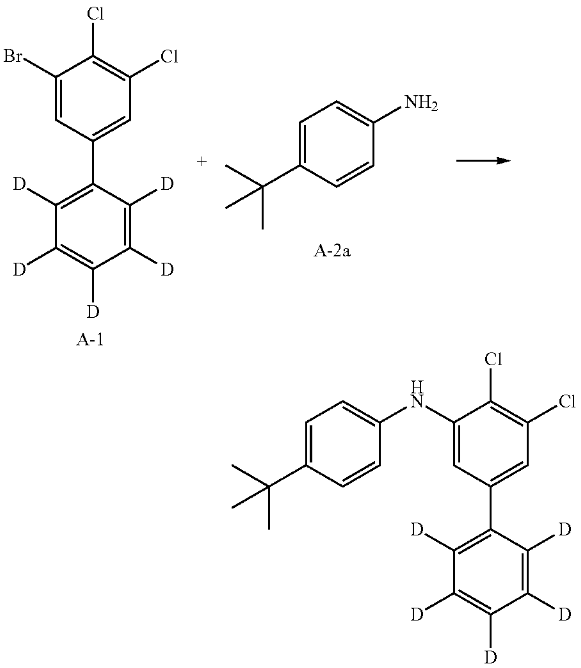

A-1 A-2a A-2

30 g of A-1, 14.6 g of A-2a, 1.79 g of palladium(II) acetate, 1.22 g of bis(diphenylphosphino)-1,1'-binaphthyl, 18.8 g of sodium tert-butoxide, and 300 mL of toluene were placed in a reactor. The mixture was stirred under reflux for 3 h. The reaction mixture was cooled to room temperature and ethyl acetate and water were added thereto. The organic layer was separated and purified by silica gel chromatography to afford A-2 (30.5 g, 73.5%).

Synthesis Example 1-3: Synthesis of A-3

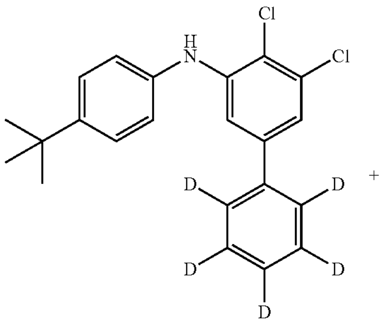

A-2

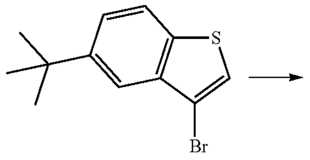

A-3a

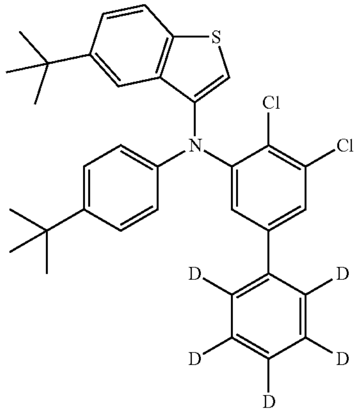

A-3

30.5 g of A-2, 21.9 g of A-3a, 0.83 g of bis(tri-tert-butylphosphine) palladium(0), 15.6 g of sodium tert-butoxide, and 300 mL of toluene were placed in a reactor. The mixture was stirred under reflux for 6 h. The reaction mixture was cooled to room temperature and ethyl acetate and water were added thereto. The organic layer was separated and purified by silica gel chromatography to afford A-3 (42 g, 91.5%).

Synthesis Example 1-4: Synthesis of A-4

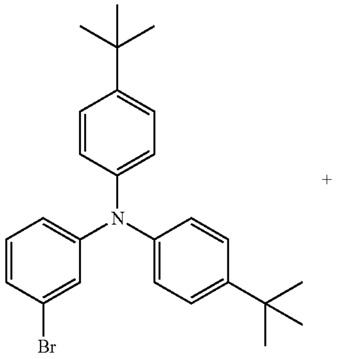

A-4a

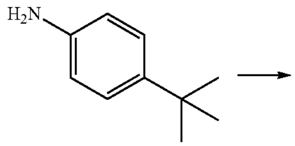

A-2a

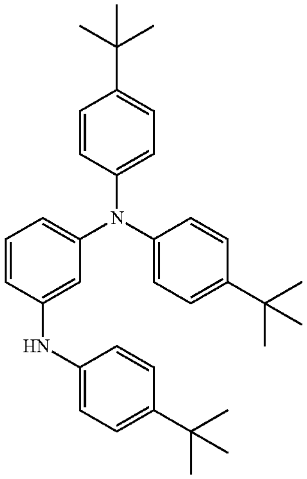

A-4

33 g of A-4a, 12.4 g of A-2a, 1.38 g of tris(dibenzylideneacetone) dipalladium(0), 14.5 g of sodium tert-butoxide, 0.9 g of bis(diphenylphosphino)-1, 1'-binaphthyl, and 280 mL of toluene were placed in a reactor. The mixture was stirred under reflux for 16 h. The reaction mixture was cooled to room temperature and ethyl acetate and water were added thereto. The organic layer was separated and purified by silica gel chromatography to afford A-4 (36 g, 92.6%).

Synthesis Example 1-5: Synthesis of A-5

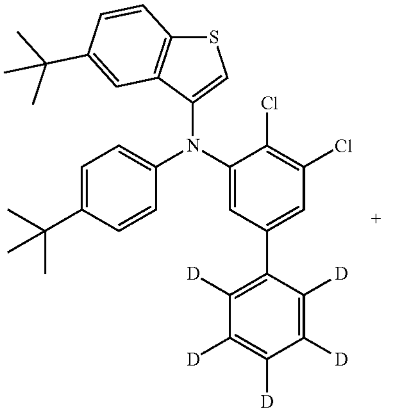

A-3

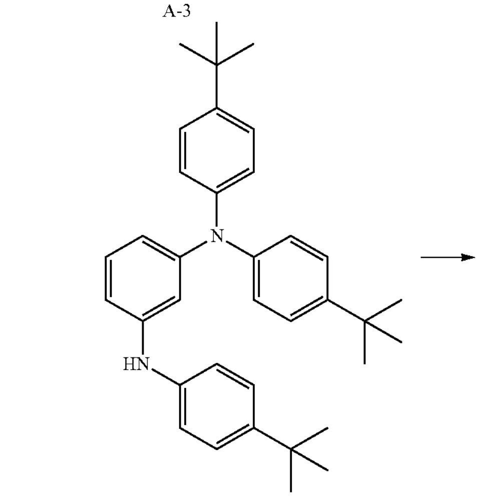

A-4

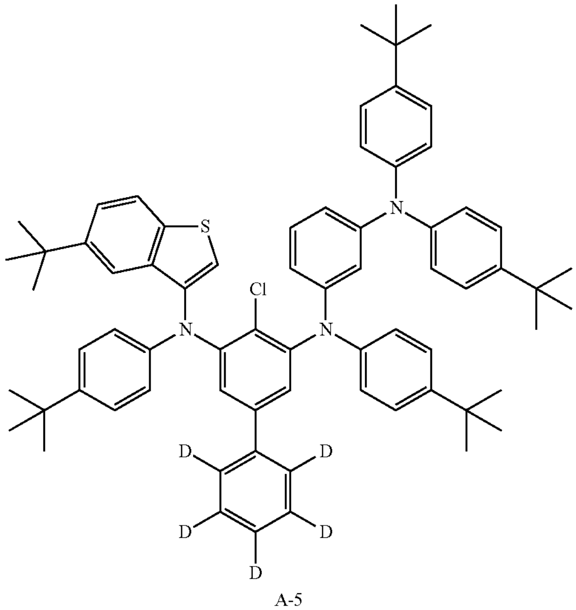

A-5

22 g of A-3, 19.7 g of A-4, 0.4 g of bis(tri-tert-butylphosphine)palladium(0), 7.5 g of sodium tert-butoxide, and 250 mL of toluene were placed in a reactor. The mixture was stirred under reflux for 16 h. The reaction mixture was cooled to room temperature and ethyl acetate and water were added thereto. The organic layer was separated and purified by silica gel chromatography to afford A-5 (22.1g, 54.8%).

Synthesis Example 1-6: Synthesis of 12

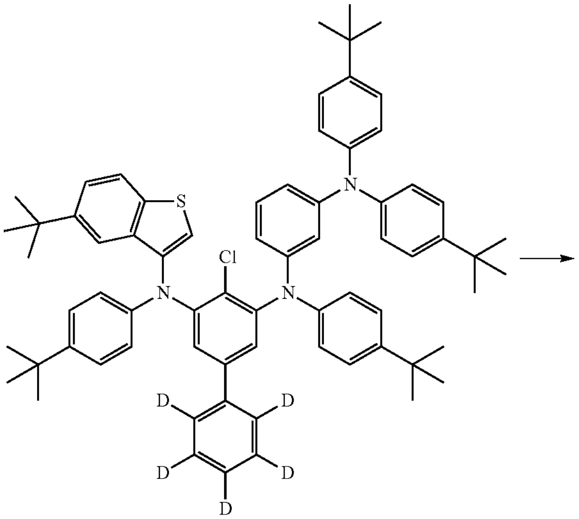

A-5

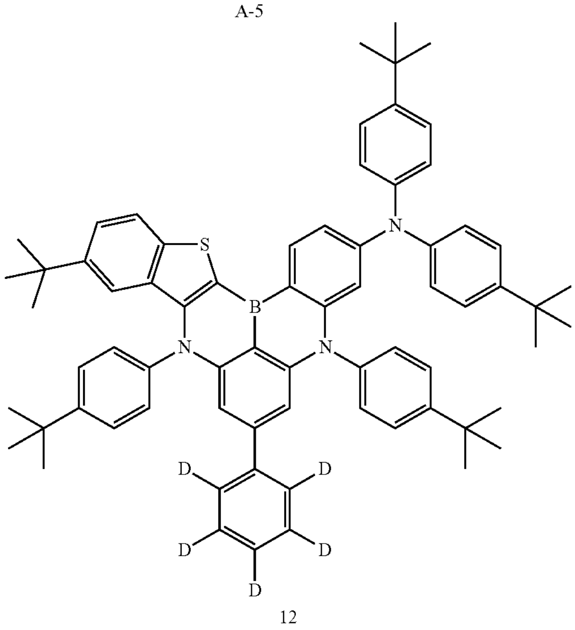

12

25 g of A-5 and 300 mL of tert-butylbenzene were placed in a reactor and 42 mL of a 1.7 M tert-butyllithium pentane solution was added dropwise thereto at −78° C. The mixture was heated to 60° C., followed by stirring for 2 h. Then, nitrogen was blown into the mixture at 60° C. to completely remove pentane. After cooling to −78° C., 4.0 mL of boron tribromide was added dropwise. The resulting mixture was allowed to warm to room temperature, followed by stirring for 2 h. After cooling to 0° C., 8.0 mL of N,N-diisopropylethylamine was added dropwise. The mixture was heated to 120° C., followed by stirring for 16 h. The reaction mixture was cooled to room temperature and a 10% aqueous solution of sodium acetate and ethyl acetate were added thereto. The organic layer was separated, concentrated under reduced pressure, and purified by silica gel chromatography to afford 12 (2.8 g, 11.5%).

MS (MALDI-TOF): m/z 1004.60 [$M^+$]

Synthesis Example 2. Synthesis of 21

Synthesis Example 2-1: Synthesis of B-1

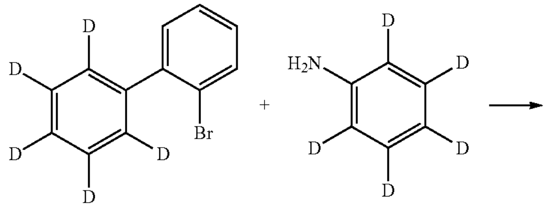

B-1a B-1b

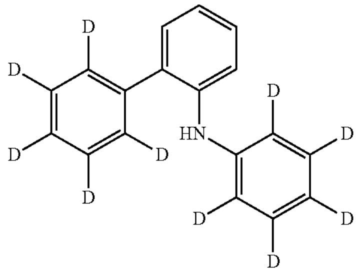

B-1

B-1 (yield 91.2%) was synthesized in the same manner as in Synthesis Example 1-4, except that B-1a and B-1b were used instead of A-4a and A-2a, respectively.

Synthesis Example 2-2: Synthesis of B-2

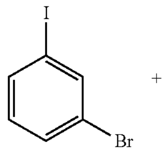

B-2a

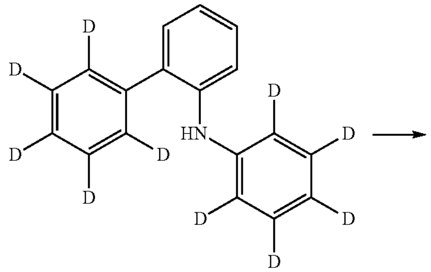

B-1

-continued

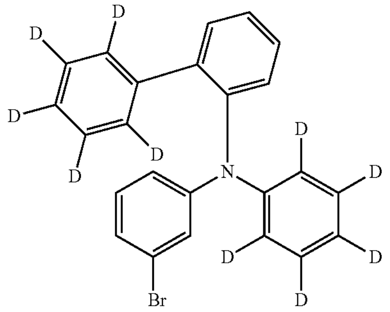

B-2

44 g of B-2a, 31.8 g of B-1, 0.7 g of palladium (II) acetate, 1.8 g of Xantphos, 22.4 g of sodium tert-butoxide, and 330 ml of toluene were placed in a reactor. The mixture was stirred under reflux for 16 h. The reaction mixture was cooled to room temperature and ethyl acetate and water were added thereto. The organic layer was separated and purified by silica gel chromatography to afford B-2 (18 g, 28.2%).

Synthesis Example 2-3: Synthesis of B-3

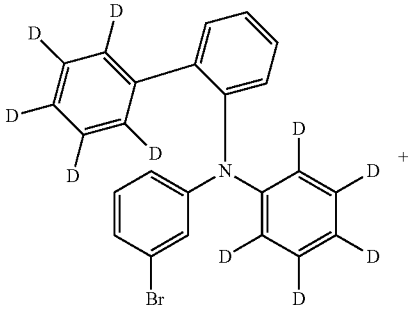

B-2

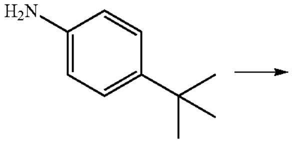

A-2a

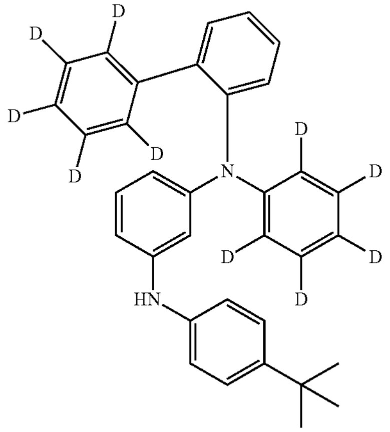

B-3

B-3 (yield 92%) was synthesized in the same manner as in Synthesis Example 1-4, except that B-2 was used instead of A-4a.

Synthesis Example 2-4: Synthesis of B-4

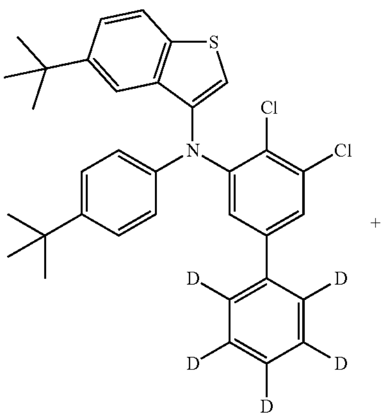

A-3

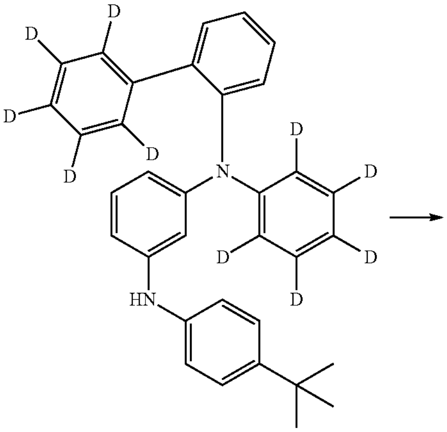

B-3

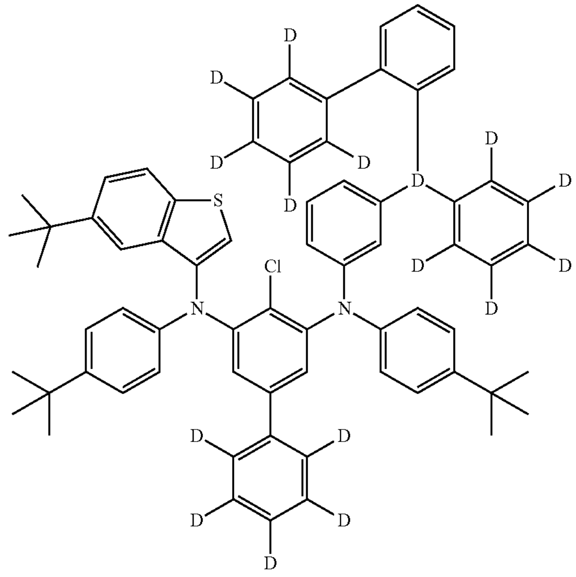

B-4

B-4 (yield 82%) was synthesized in the same manner as in Synthesis Example 1-5, except that B-3 was used instead of A-4.

Synthesis Example 2-5: Synthesis of 21

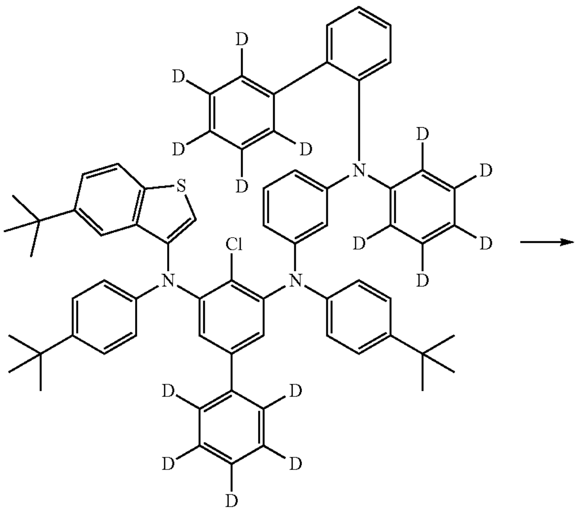

B-4

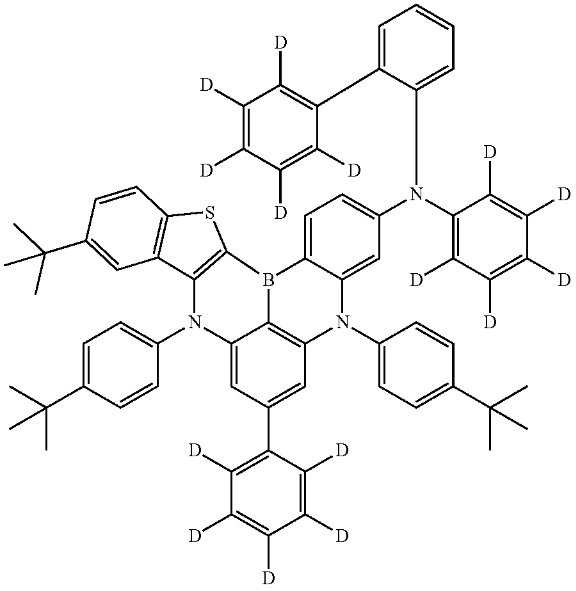

21

21 (yield 9.1%) was synthesized in the same manner as in Synthesis Example 1-6, except that B-4 was used instead of A-5.

MS (MALDI-TOF): m/z 978.57 [$M^+$]

Synthesis Example 3. Synthesis of 22

Synthesis Example 3-1: Synthesis of C-1

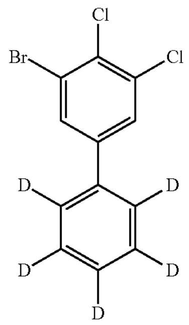

A-1

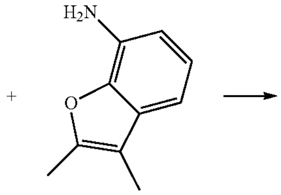

C-1a

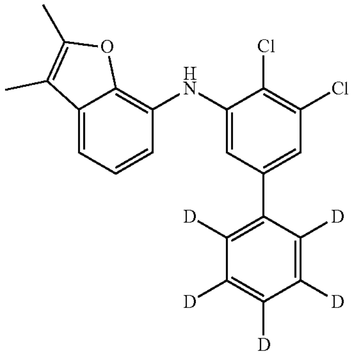

C-1

C-1 (yield 90.7%) was synthesized in the same manner as in Synthesis Example 1-2, except that C-1a was used instead of A-2a.

Synthesis Example 3-2: Synthesis of C-2

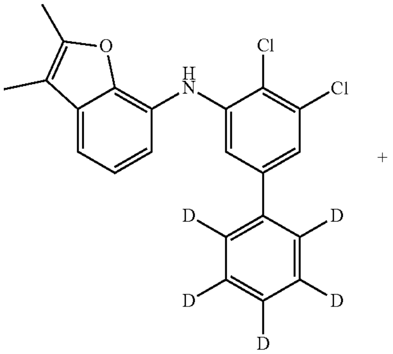

C-1

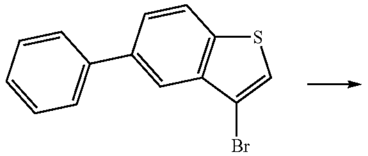

C-2a

-continued

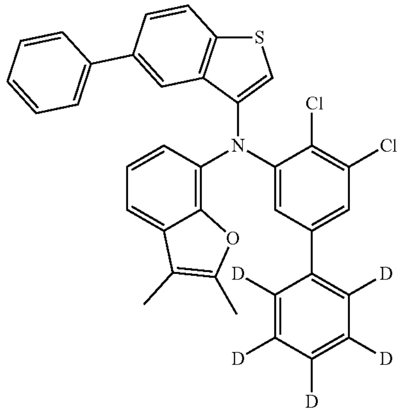

C-2

C-2 (yield 60.4%) was synthesized in the same manner as in Synthesis Example 1-3, except that C-1 and C-2a were used instead of A-2 and A-3a, respectively.

Synthesis Example 3-3: Synthesis of C-3

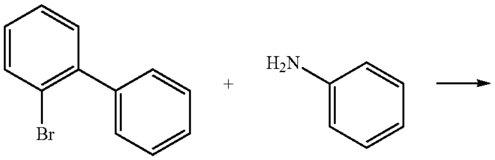

C-3a C-3b

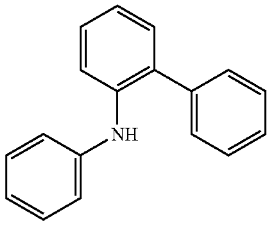

C-3

C-3 (yield 93.2%) was synthesized in the same manner as in Synthesis Example 1-4, except that C-3a and C-3b were used instead of A-4a and A-2a, respectively.

Synthesis Example 3-4: Synthesis of C-4

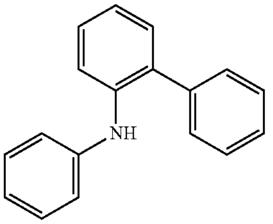

C-3

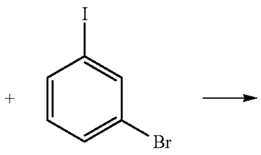

B-2a

-continued

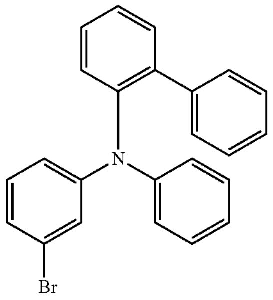

C-4

C-4 (yield 29.6%) was synthesized in the same manner as in Synthesis Example 2-2, except that C-3 was used instead of B-1.

Synthesis Example 3-5: Synthesis of C-5

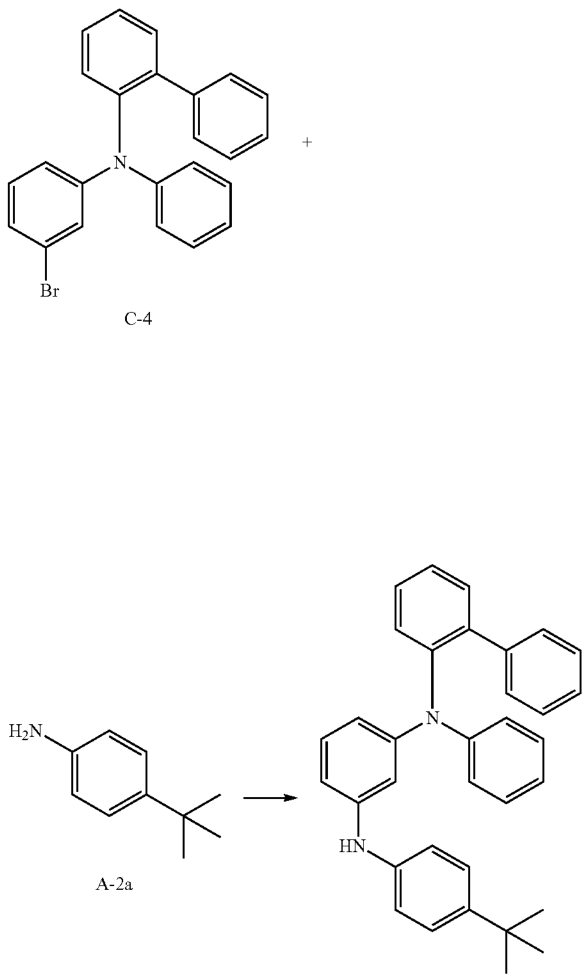

C-4

A-2a

C-5

C-5 (yield 93%) was synthesized in the same manner as in Synthesis Example 1-4, except that C-4 was used instead of A-4a.

Synthesis Example 3-6: Synthesis of C-6

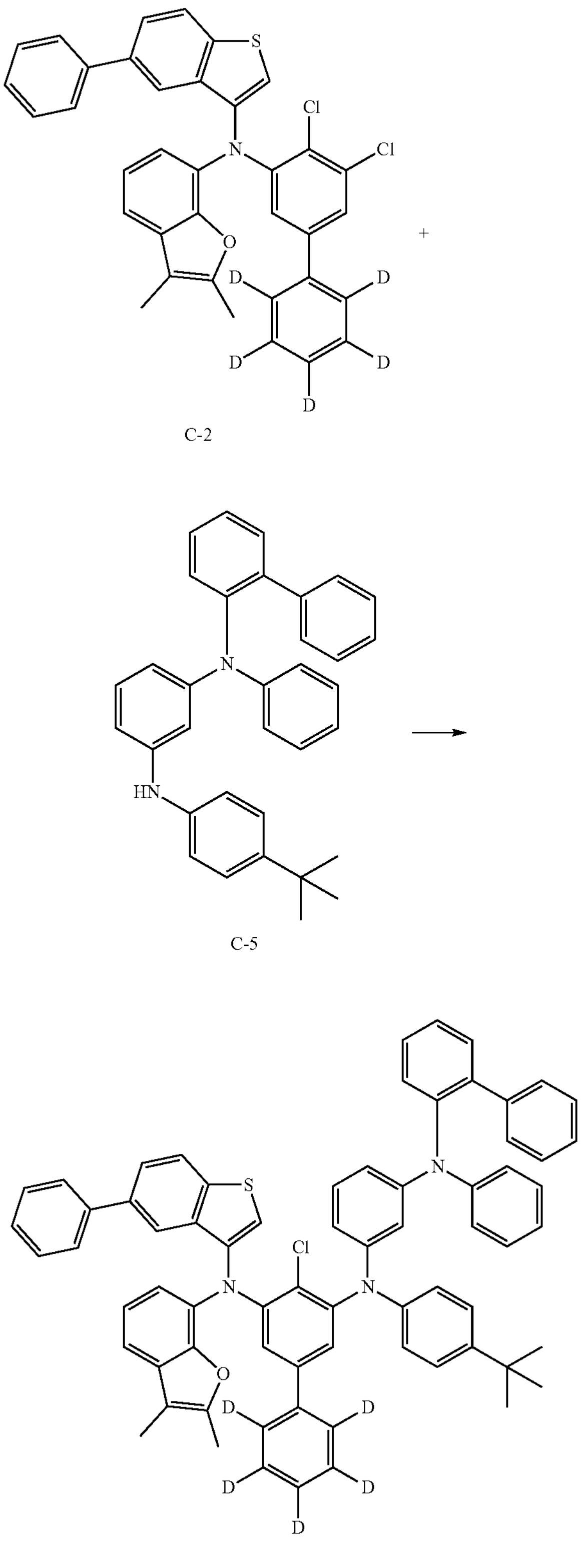

C-2

C-5

C-6

C-6 (yield 93.7%) was synthesized in the same manner as in Synthesis Example 1-5, except that C-2 and C-5 were used instead of A-3 and A-4, respectively.

Synthesis Example 3-7: Synthesis of 22

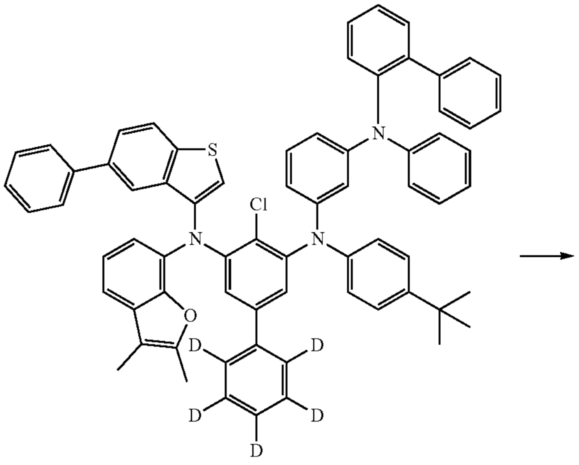

C-6

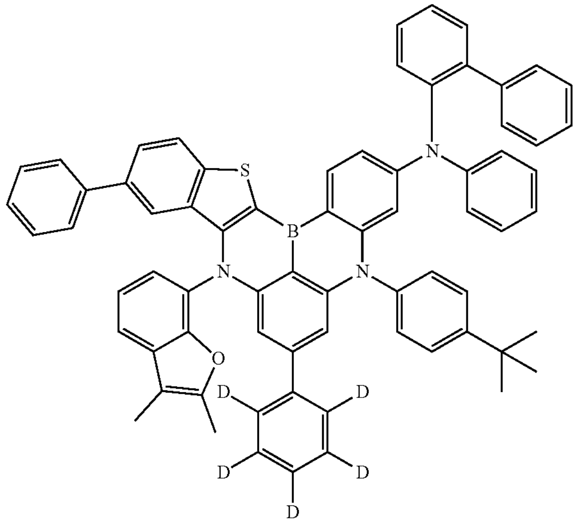

22

22 (yield 7.1%) was synthesized in the same manner as in Synthesis Example 1-6, except that C-6 was used instead of A-5.

MS (MALDI-TOF): m/z 1000.44 [$M^+$]

Synthesis Example 4. Synthesis of 23

Synthesis Example 4-1: Synthesis of D-1

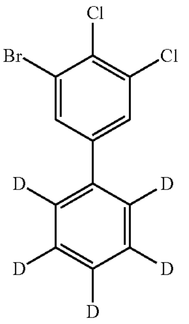

A-1

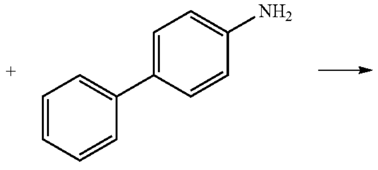

D-1a

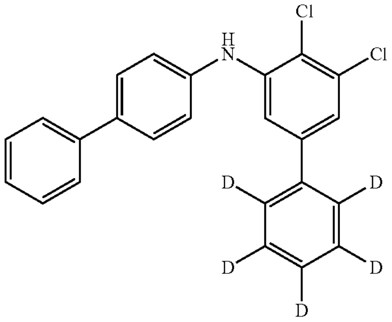

D-1

D-1 (yield 74.2%) was synthesized in the same manner as in Synthesis Example 1-2, except that D-1a was used instead of A-2a.

Synthesis Example 4-2: Synthesis of D-2

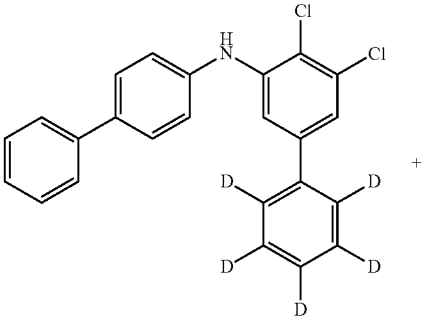

D-1

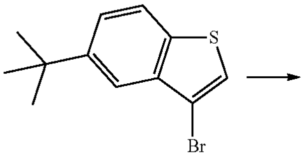

A-3a

-continued

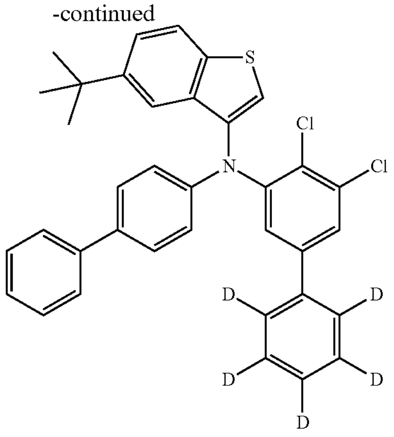

D-2

D-2 (yield 89.4%) was synthesized in the same manner as in Synthesis Example 1-3, except that D-1 was used instead of A-2.

Synthesis Example 4-3: Synthesis of D-3

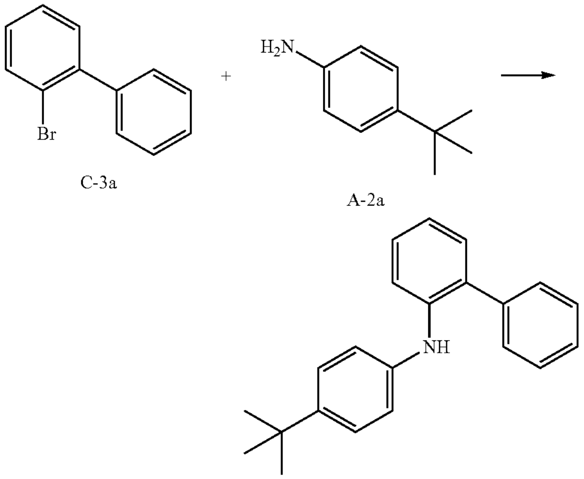

C-3a

A-2a

D-3

D-3 (yield 91.2%) was synthesized in the same manner as in Synthesis Example 1-4, except that C-3a was used instead of A-4a.

Synthesis Example 4-4: Synthesis of D-4

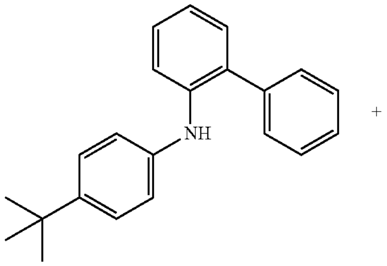

D-3

-continued

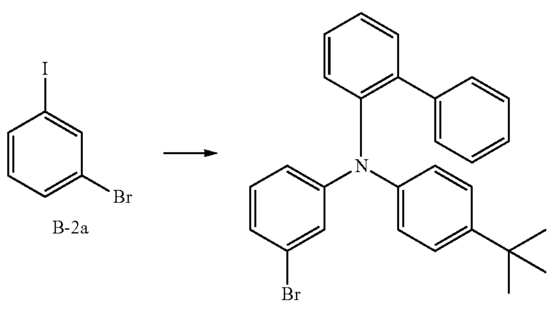

B-2a

D-4

D-4 (yield 28.6%) was synthesized in the same manner as in Synthesis Example 2-2, except that D-3 was used instead of B-1.

Synthesis Example 4-5: Synthesis of D-5

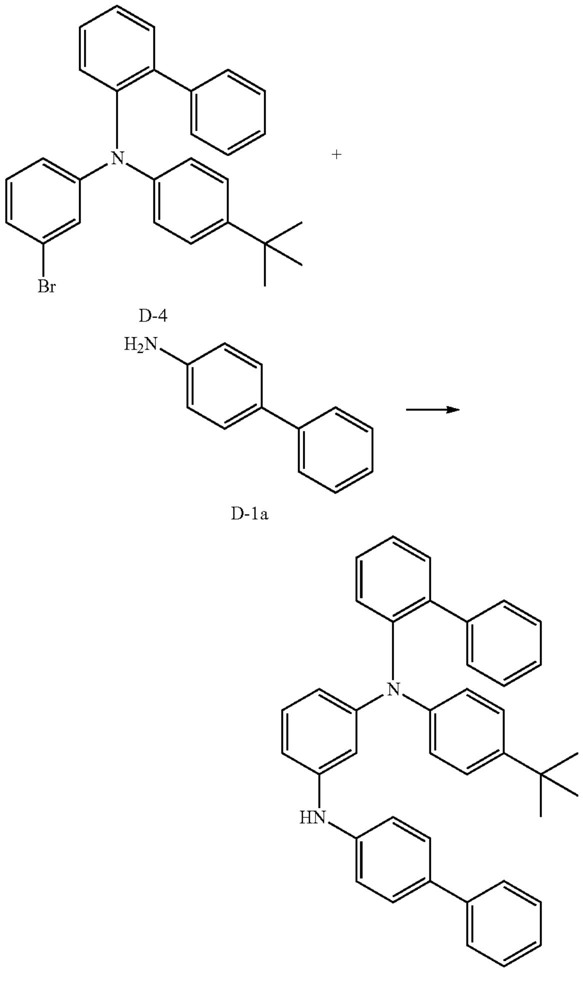

D-4

D-1a

D-5

D-5 (yield 89.4%) was synthesized in the same manner as in Synthesis Example 1-4, except that D-4 and D-1a were used instead of A-4a and A-2a, respectively.

Synthesis Example 4-6: Synthesis of D-6

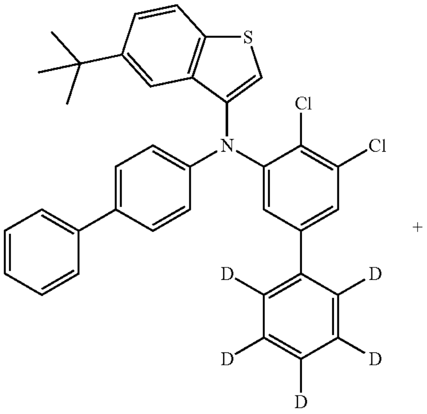

D-2

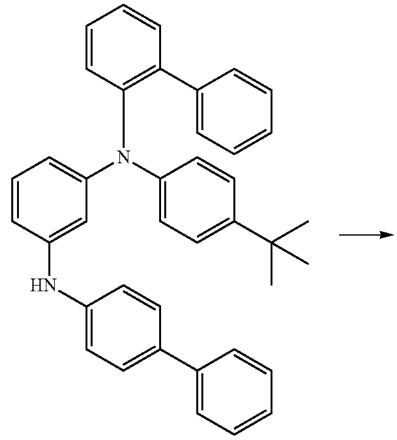

D-5

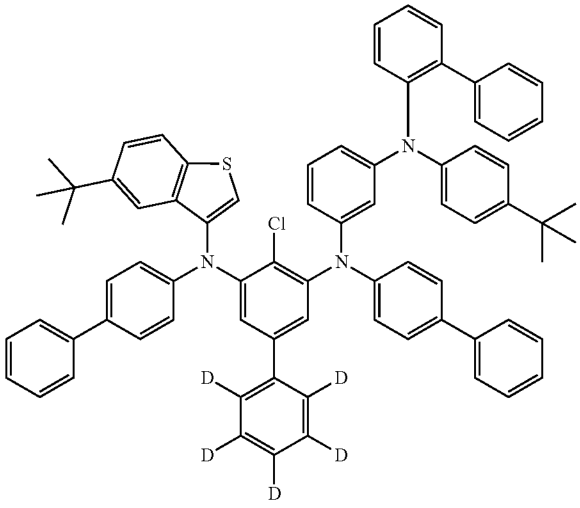

D-6

D-6 (yield 81.5%) was synthesized in the same manner as in Synthesis Example 1-5, except that D-2 and D-5 were used instead of A-3 and A-4, respectively.

Synthesis Example 4-7: Synthesis of 23

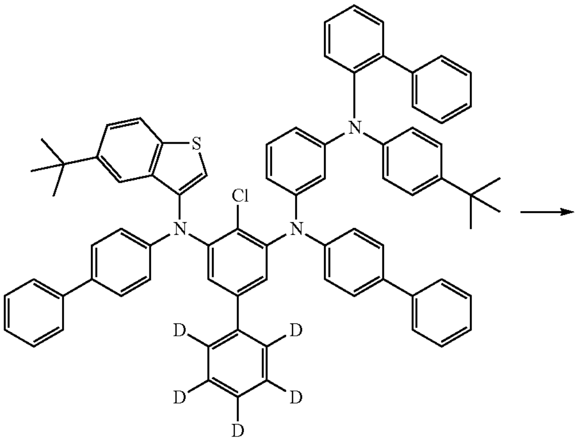

D-6

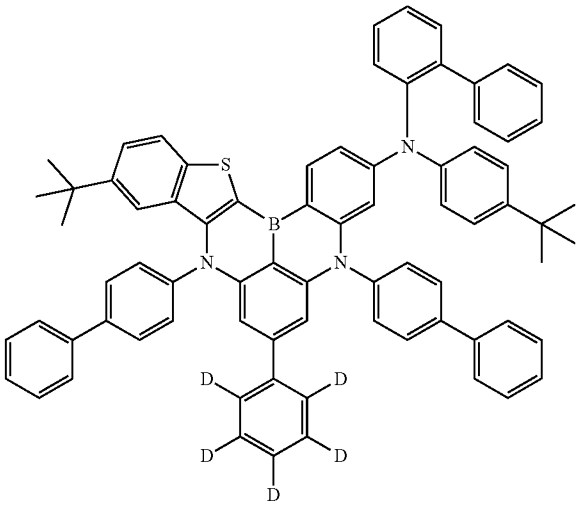

23

23 (yield 10.1%) was synthesized in the same manner as in Synthesis Example 1-6, except that D-6 was used instead of A-5.

MS (MALDI-TOF): m/z 1064.51 [$M^+$]

Synthesis Example 5. Synthesis of 59

Synthesis Example 5-1: Synthesis of 59

59 (yield 10.7%) was synthesized in the same manner as in Synthesis Example 1, except that C-2a was used instead of A-3a.

MS (MALDI-TOF): m/z 1024.57 [$M^+$]

Examples 1-7: Fabrication of Organic Light Emitting Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. DNTPD (700 Å) and the compound represented by Formula H (250 Å) were sequentially formed into layers on the ITO. A mixture of the host represented by BH-1 and the inventive compound (3 wt %)

shown in Table 1 was formed into a 250 Å thick light emitting layer. Thereafter, a mixture of the compound represented by Formula E-1 and the compound represented by Formula E-2 in a ratio of 1:1 was formed into a 300 Å thick electron transport layer on the light emitting layer. The compound represented by Formula E-1 was formed into a 5 Å thick electron injecting layer on the electron transport layer. Al was formed into a 1000 Å thick electrode on the electron injecting layer, completing the fabrication of an organic light emitting device. The luminescent properties of the organic light emitting device were measured at 10 mA/$cm^2$.

DNTPD

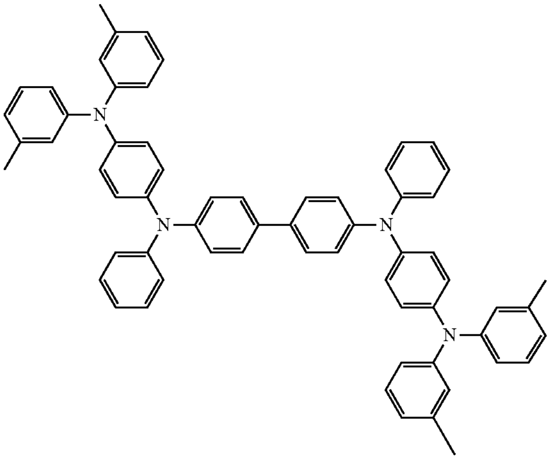

Formula H

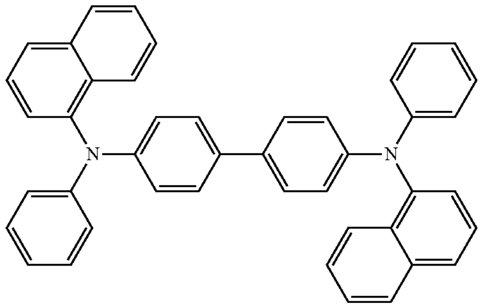

Formula E-1

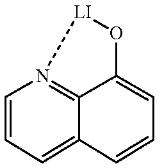

-continued

Formula E-2

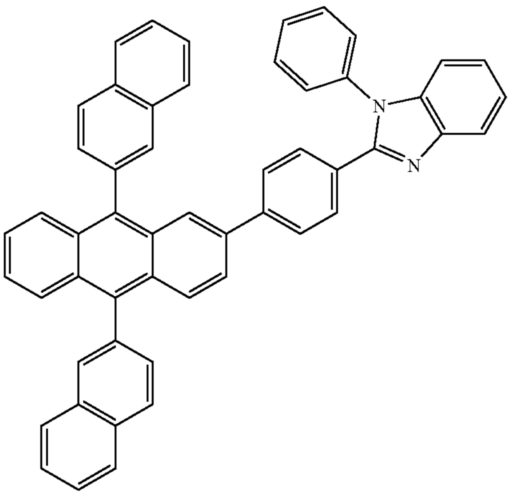

BH-1

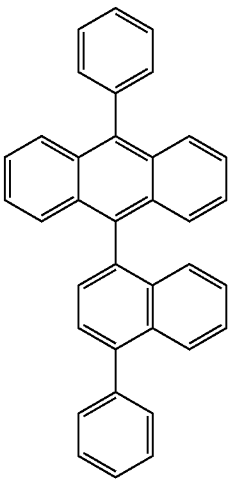

Comparative Examples 1-3

Organic light emitting devices were fabricated in the same manner as in Examples 1-7, except that BD1, BD2 or BD3 was used as a dopant compound instead of the inventive compound. The luminescent properties of the organic light emitting devices were measured at 10 mA/$cm^2$. The structures of BD1, BD2, and BD3 are as follow:

[BD-1]

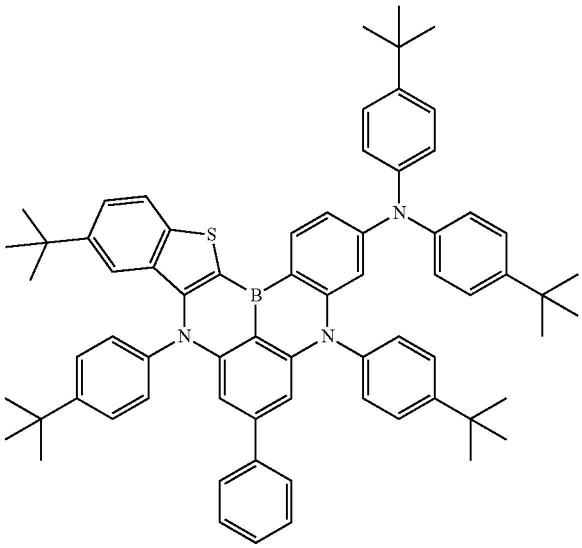

[BD-2]

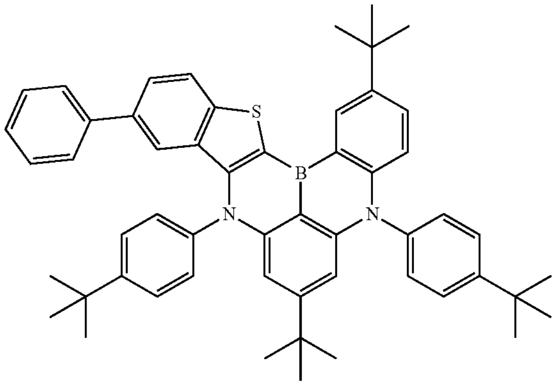

[BD-3]

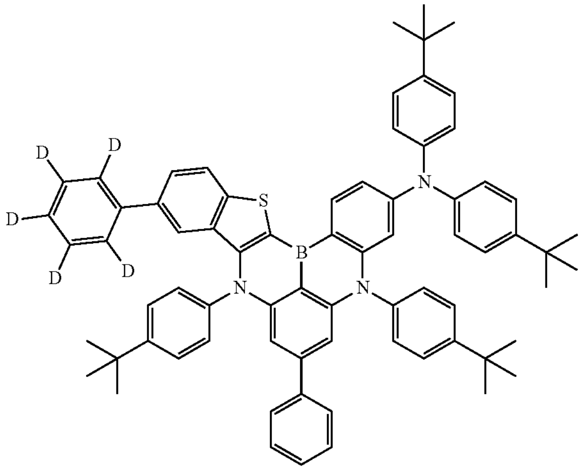

TABLE 1

| Example No. | Dopant | Current density (mA/cm$^2$) | Voltage (V) | Lifetime (T97, hr) |
|---|---|---|---|---|
| Example 1 | 12 | 10 | 4.0 | 160 |
| Example 2 | 21 | 10 | 4.0 | 169 |
| Example 3 | 22 | 10 | 4.0 | 156 |
| Example 4 | 23 | 10 | 3.9 | 180 |
| Example 5 | 24 | 10 | 3.9 | 178 |
| Example 6 | 33 | 10 | 4.0 | 174 |
| Example 7 | 59 | 10 | 4.0 | 158 |
| Comparative Example 1 | BD-1 | 10 | 4.0 | 114 |
| Comparative Example 2 | BD-2 | 10 | 4.0 | 104 |
| Comparative Example 3 | BD-3 | 10 | 4.0 | 130 |

As can be seen from the results in Table 1, the devices of Examples 1-7, each of which employed the inventive polycyclic compound including, as a dopant, R substituted with at least one deuterium in the light emitting layer, showed significantly improved life characteristics compared to the devices of Comparative Examples 1-3, which employed BD-1, BD-2, and BD-3, respectively.

Examples 8-14: Fabrication of Organic Light Emitting Devices

Organic light emitting devices were fabricated in the same manner as in Examples 1-7, except that BH-2 was used as a host compound to form a light emitting layer instead of BH-1. The luminescent properties of the organic light emitting devices were measured at 10 mA/cm$^2$. The structure of BH-2 is as follows:

[BH-2]

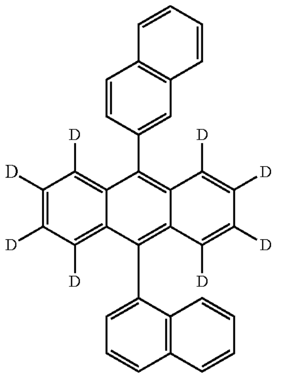

Comparative Examples 4-6

Organic light emitting devices were fabricated in the same manner as in Comparative Examples 1-3, except that BH-2 was used as a host compound to form a light emitting layer instead of BH-1. The luminescent properties of the organic light emitting devices were measured at 10 mA/cm$^2$.

TABLE 2

| Example No. | Dopant | Current density (mA/cm$^2$) | Voltage (V) | Lifetime (T97, hr) |
|---|---|---|---|---|
| Example 8 | 12 | 10 | 4.0 | 181 |
| Example 9 | 21 | 10 | 4.0 | 189 |
| Example 10 | 22 | 10 | 4.0 | 174 |

TABLE 2-continued

| Example No. | Dopant | Current density (mA/cm²) | Voltage (V) | Lifetime (T97, hr) |
|---|---|---|---|---|
| Example 11 | 23 | 10 | 4.0 | 198 |
| Example 12 | 24 | 10 | 4.0 | 187 |
| Example 13 | 33 | 10 | 4.0 | 193 |
| Example 14 | 59 | 10 | 4.0 | 182 |
| Comparative Example 4 | BD-1 | 10 | 4.0 | 125 |
| Comparative Example 5 | BD-2 | 10 | 4.0 | 114 |
| Comparative Example 6 | BD-3 | 10 | 4.0 | 142 |

As can be seen from the results in Table 2, the devices of Examples 8-14, each of which employed the inventive polycyclic compound including, as a dopant, R substituted with at least one deuterium and the deuterated anthracene derivative as a host compound in the light emitting layer, showed further significantly improved life characteristics compared to the devices of Comparative Examples 4-6, which employed BD-1, BD-2, and BD-3 as dopants, respectively, and the undeuterated anthracene compound as a host.

INDUSTRIAL APPLICABILITY

The polycyclic compound of the present invention can be employed in an organic layer of an organic light emitting device to achieve long lifetime of the device. Therefore, the polycyclic compound of the present invention can find useful industrial applications in various displays, including flat panel displays, flexible displays, displays for automotive applications, displays for virtual reality, and displays for augmented reality, and lighting systems, including monochromatic flat panel lighting systems, white flat panel lighting systems, flexible monochromatic lighting systems, and flexible white lighting systems.

What is claimed is:

1. A polycyclic compound represented by Formula A-1:

[Formula A-1]

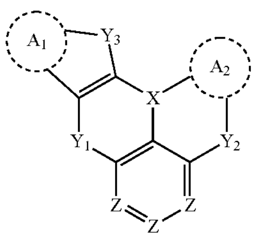

wherein X is selected from B, P═O, and P═S, each Z is independently N or CR, with the proviso that at least one of the moieties Z is CR, $Y_1$ and $Y_2$ are each independently selected from $NR_1$, $CR_2R_3$, O, S, Se, and Si $R_4R_5$, $Y_3$ is O or S, $A_1$ and $A_2$ are each independently selected from substituted or unsubstituted $C_6$-$C_{50}$ aromatic hydrocarbon rings and substituted or unsubstituted $C_2$-$C_{50}$ aromatic heterocyclic rings, $R_1$ to $R_5$ are the same as or different from each other and are each independently selected from hydrogen, deuterium (D), substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted amine, substituted or unsubstituted silyl, nitro, cyano, and halogen, provided that when both $Y_1$ and $Y_2$ are $NR_1$ and at least one of the two groups $R_1$ is heteroaryl, $C_{12+}$ heteroaryl containing O or S as a heteroatom is excluded, with the proviso that each of $R_1$ to $R_5$ are optionally bonded to one or more of the rings $A_1$ and $A_2$ to form an alicyclic or aromatic monocyclic or polycyclic ring, and the groups R are the same as or different from each other and are each independently selected from hydrogen, substituted or unsubstituted $C_6$-$C_{50}$ aryl, substituted or unsubstituted $C_2$-$C_{50}$ heteroaryl, substituted or unsubstituted $C_3$-$C_{30}$ cycloalkyl, substituted or unsubstituted $C_3$-$C_{30}$ heterocycloalkyl, and substituted or unsubstituted $C_3$-$C_{30}$ mixed aliphatic-aromatic rings, with the proviso that at least one of the groups R is an aryl, heteroaryl or mixed aliphatic-aromatic cyclic group substituted with at least one deuterium (D), the substituents of each of the rings $A_1$ and $A_2$ are optionally linked to each other to form an alicyclic or aromatic monocyclic or polycyclic ring, $R_2$ and $R_3$ are optionally linked to each other to form an alicyclic or aromatic monocyclic or polycyclic ring, and $R_4$ and $R_5$ are optionally linked to each other to form an alicyclic or aromatic monocyclic or polycyclic ring.

2. The polycyclic compound according to claim 1, wherein the degree of deuteration of the compound represented by Formula A-1 is at least 5%.

3. The polycyclic compound according to claim 1, wherein R is deuterated $C_6$-$C_{30}$ aryl.

4. The polycyclic compound according to claim 1, wherein the ring $A_2$ is substituted with substituted or unsubstituted amine.

5. The polycyclic compound according to claim 4, wherein the amine is substituted or unsubstituted diarylamine.

6. The polycyclic compound according to claim 1, wherein the compound represented by Formula A-1 is selected from the following compounds:

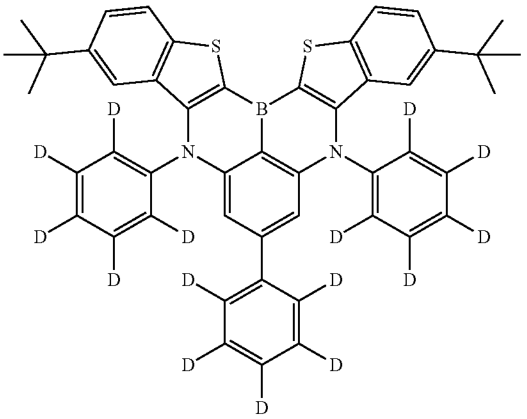

-continued
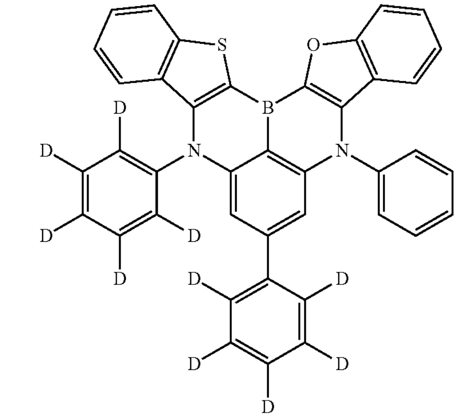
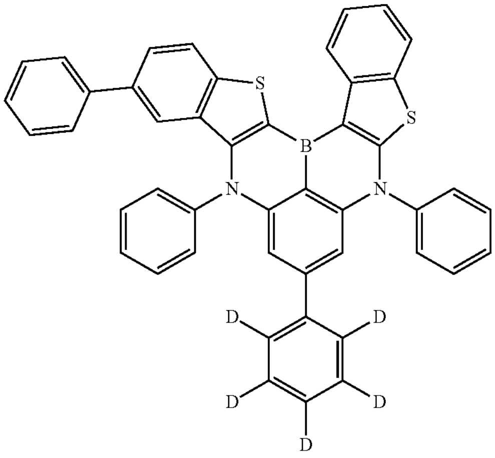
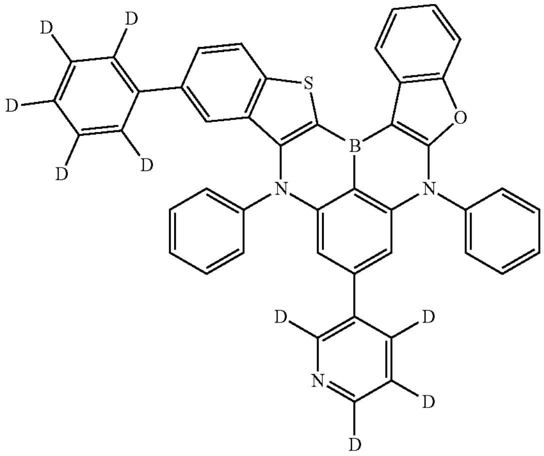
-continued
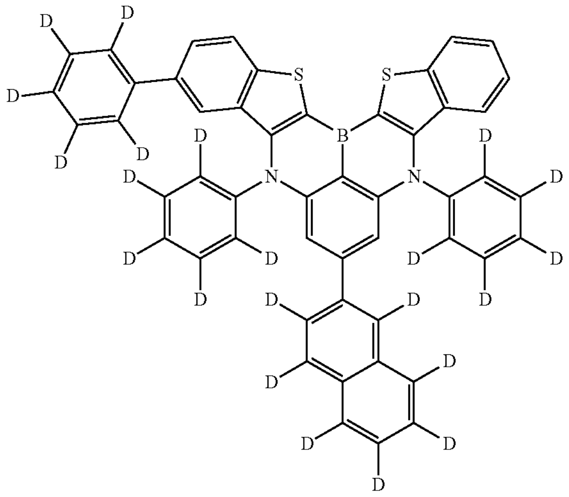
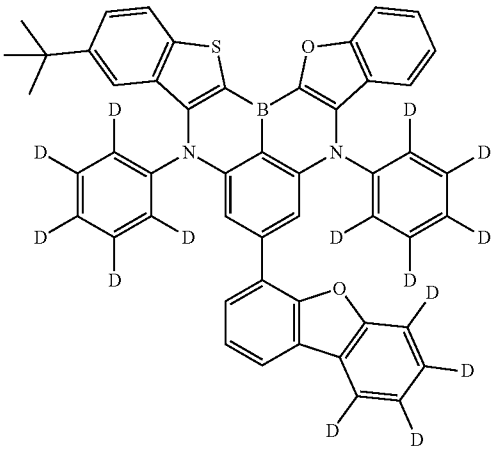
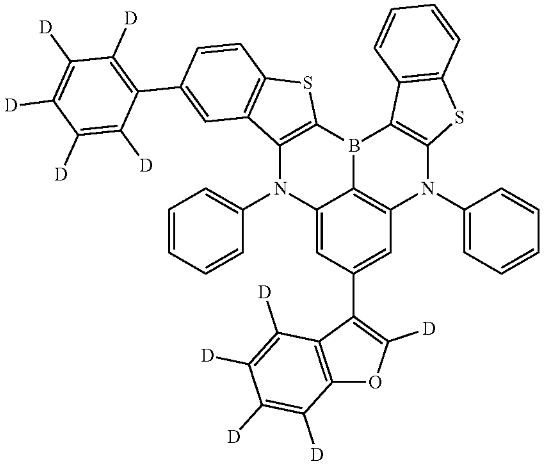

-continued
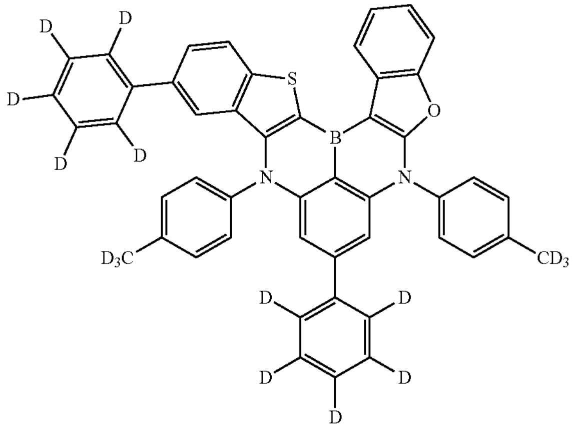
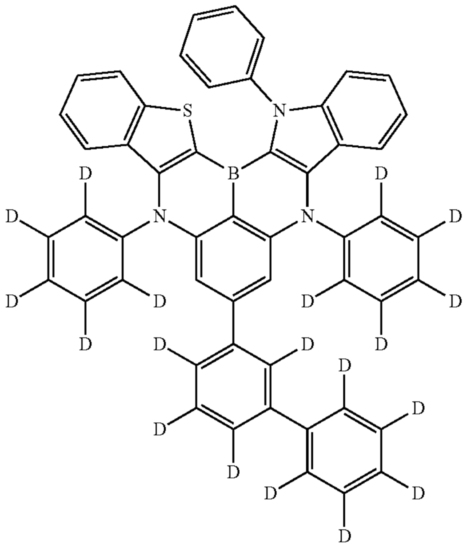
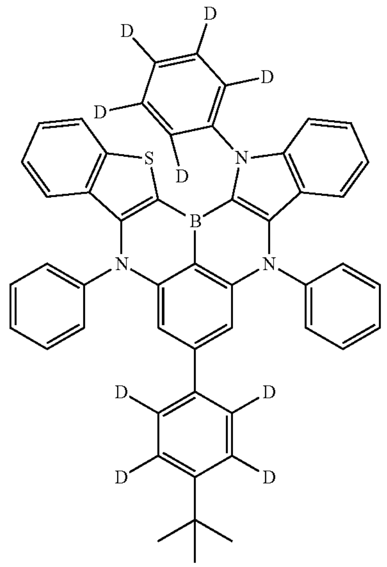
-continued
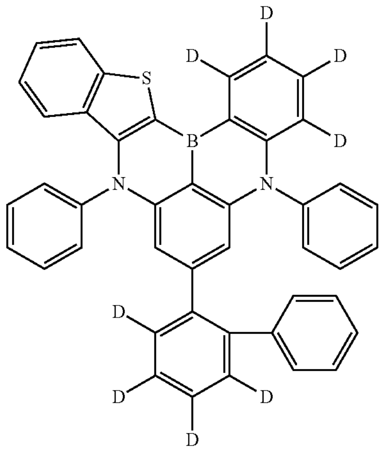
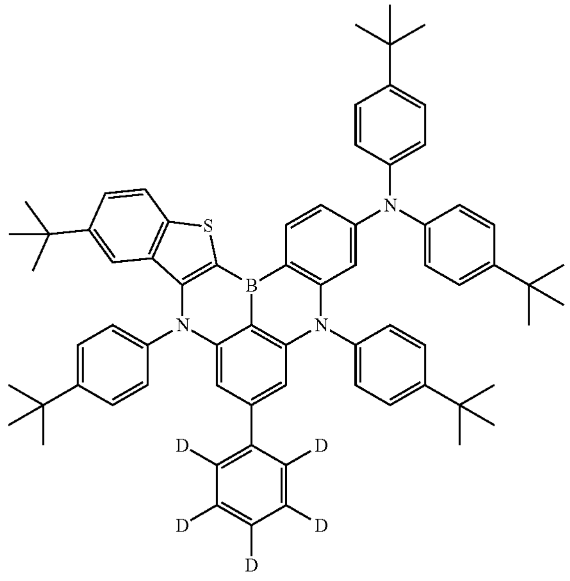 [SMILES: [2H]c1c([2H])c([2H])c(-c2cc3c4c(c2)N(c2ccc(C(C)(C)C)cc2)c2c(sc5ccc(C(C)(C)C)cc25)B4c2ccc(N(c4ccc(C(C)(C)C)cc4)c4ccc(C(C)(C)C)cc4)cc2N3c2ccc(C(C)(C)C)cc2)c([2H])c1[2H]]
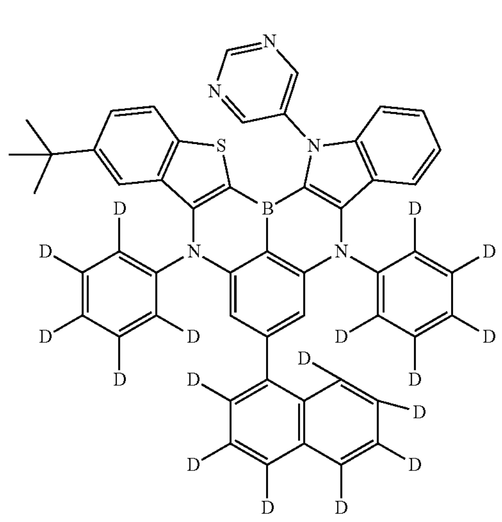

-continued
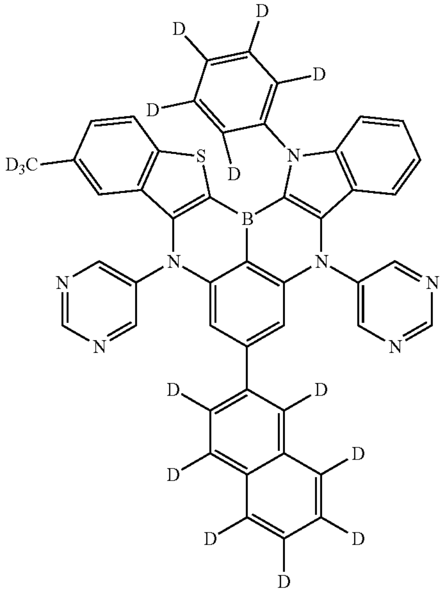
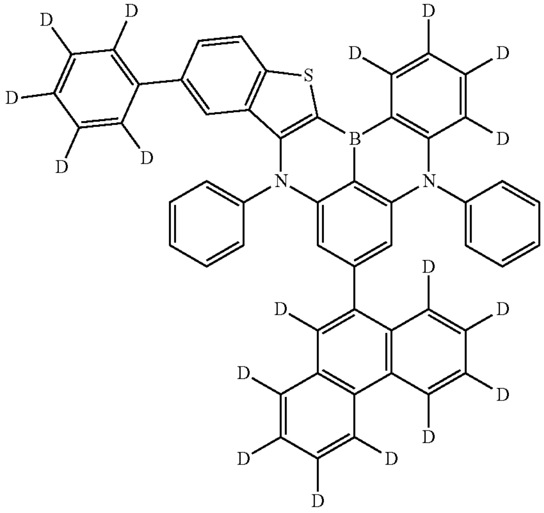
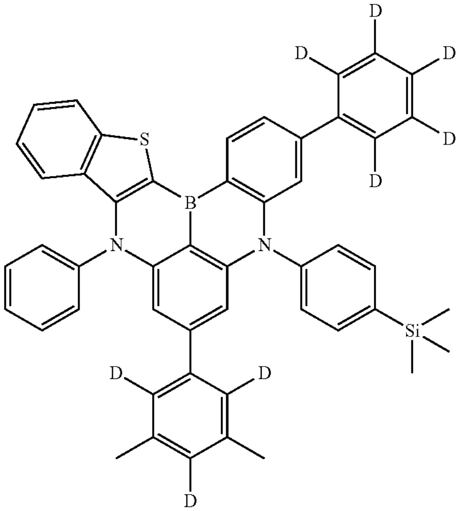 [SMILES: [2H]c1c([2H])c([2H])c(-c2ccc3c(c2)N(c2ccc([Si](C)(C)C)cc2)c2cc(-c4c([2H])c(C)c([2H])c(C)c4[2H])cc4c2B3c2sc3ccccc3c2N4c2ccccc2)c([2H])c1[2H]]
-continued
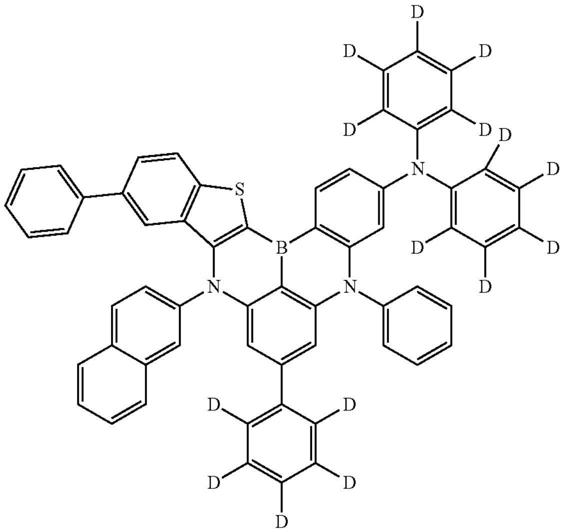
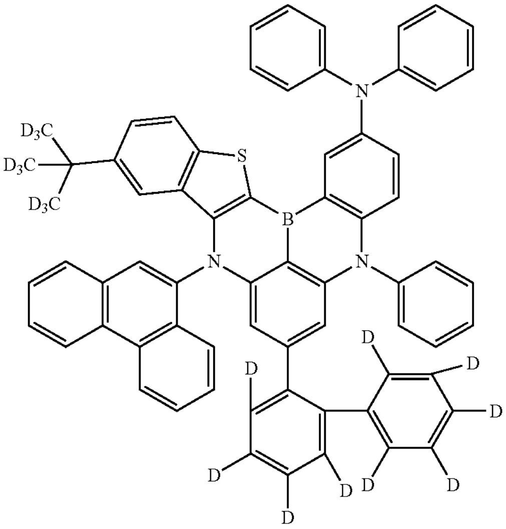
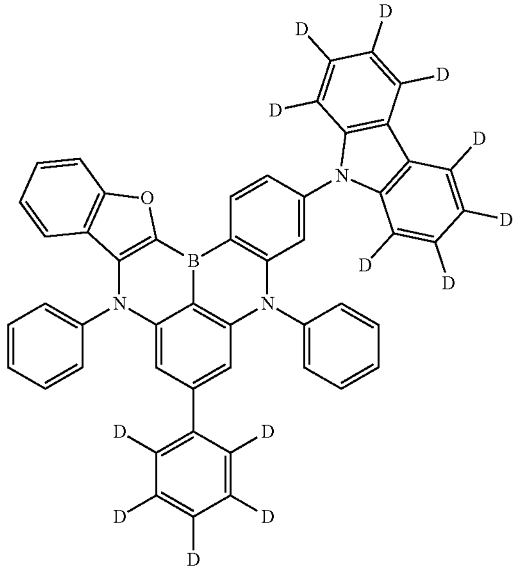

-continued
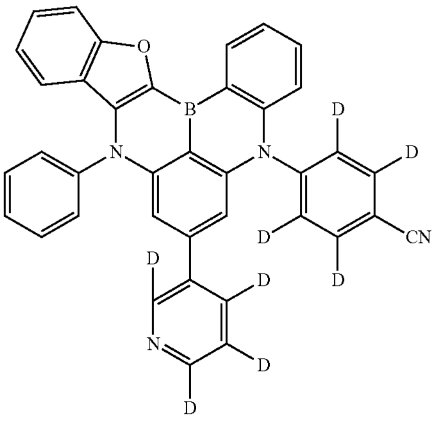 [SMILES: [2H]c1nc([2H])c(-c2cc3c4c(c2)N(c2ccccc2)c2c(oc5ccccc25)B4c2ccccc2N3c2c([2H])c([2H])c(C#N)c([2H])c2[2H])c([2H])c1[2H]]
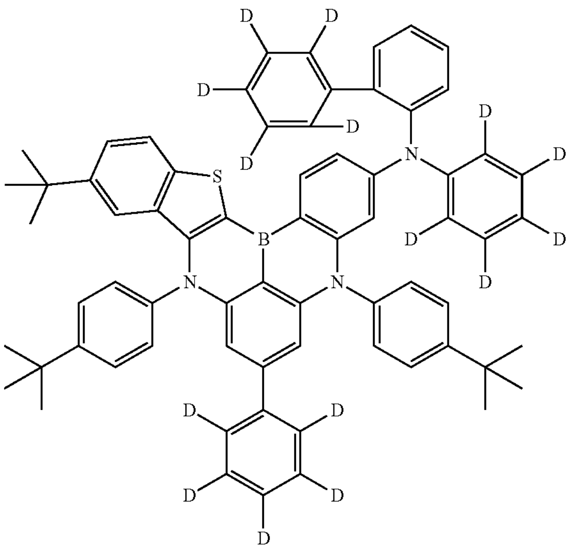
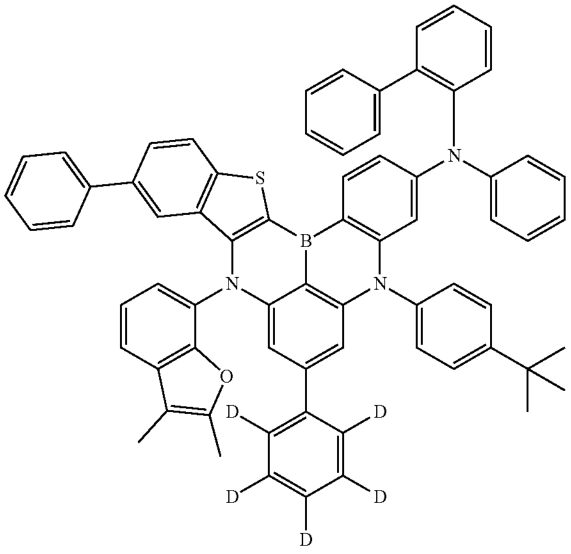
-continued
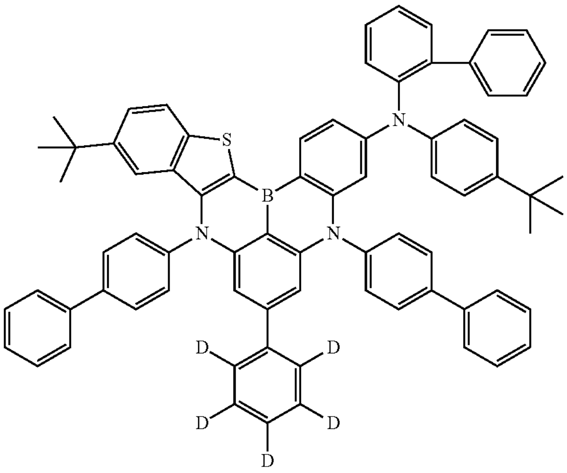
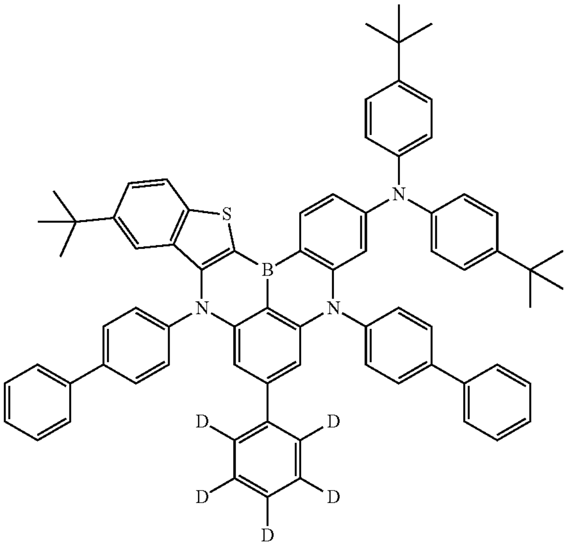 [SMILES: [2H]c1c([2H])c([2H])c(-c2cc3c4c(c2)N(c2ccc(-c5ccccc5)cc2)c2c(sc5ccc(C(C)(C)C)cc25)B4c2ccc(N(c4ccc(C(C)(C)C)cc4)c4ccc(C(C)(C)C)cc4)cc2N3c2ccc(-c3ccccc3)cc2)c([2H])c1[2H]]
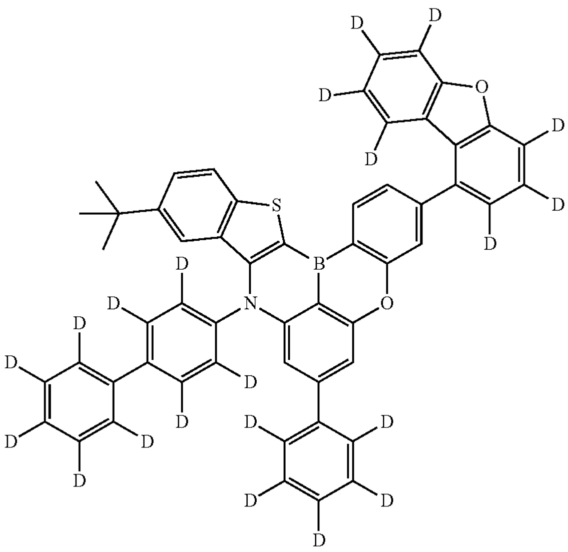

-continued
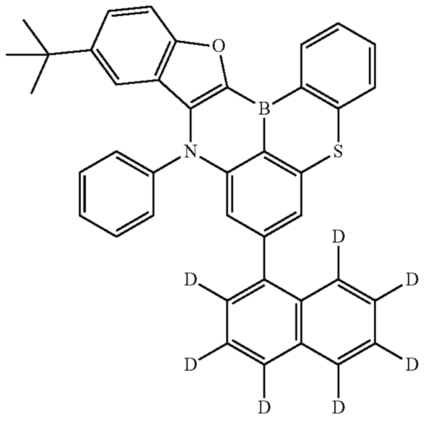
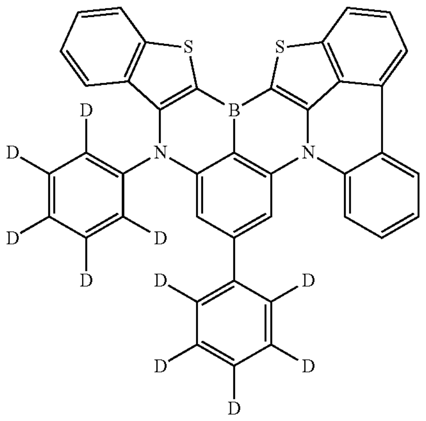
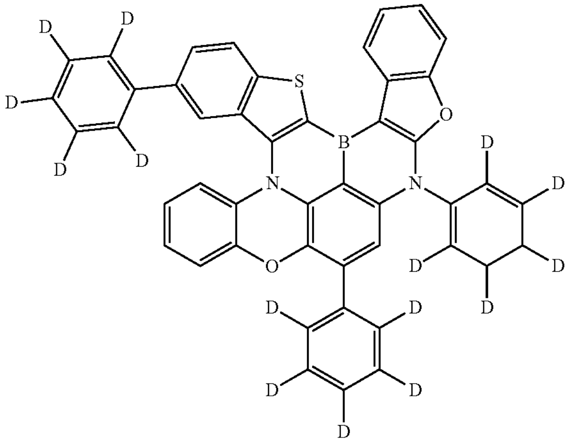
-continued
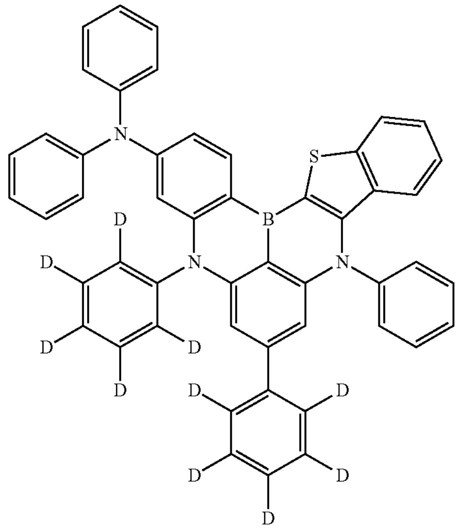
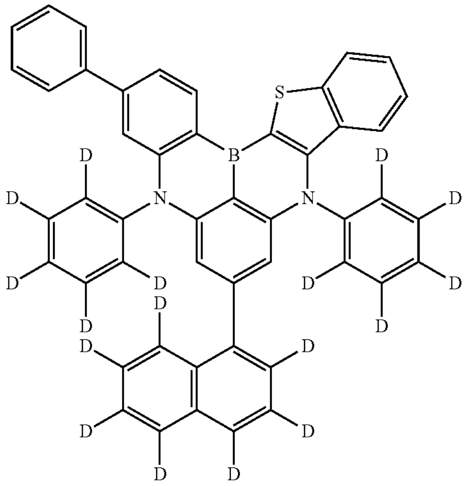
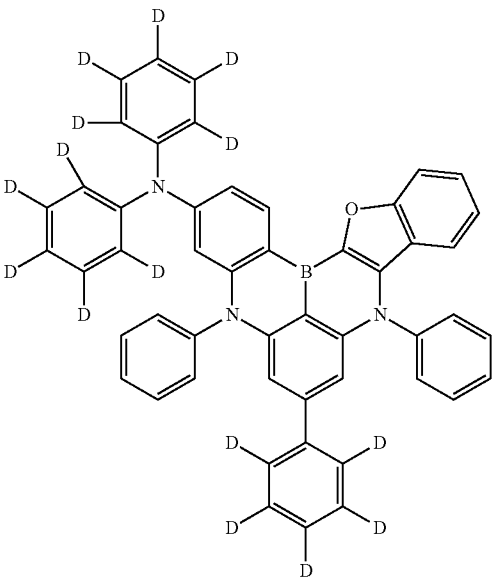

-continued
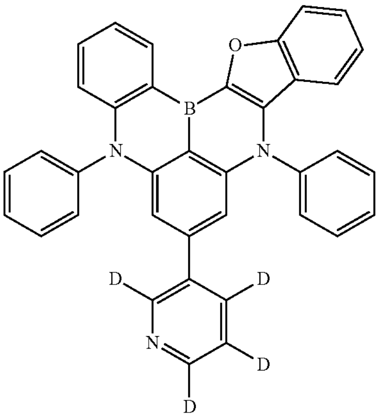 [SMILES: [2H]c1nc([2H])c(-c2cc3c4c(c2)N(c2ccccc2)c2c(oc5ccccc25)B4c2ccccc2N3c2ccccc2)c([2H])c1[2H]]
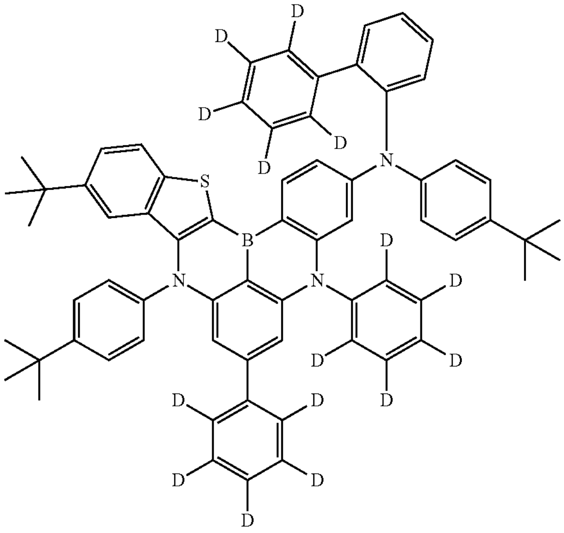
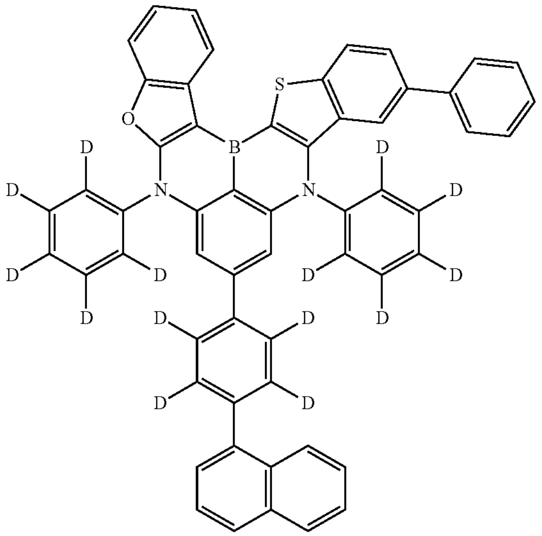
-continued
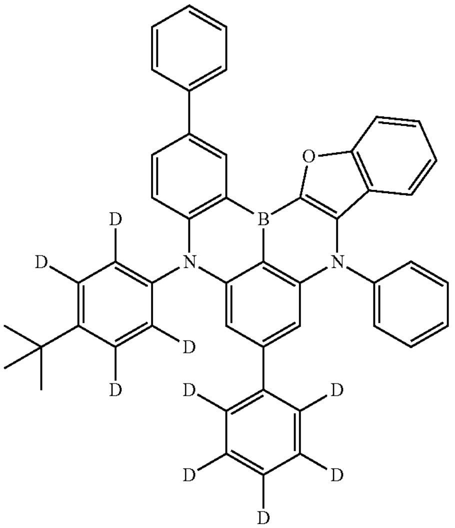
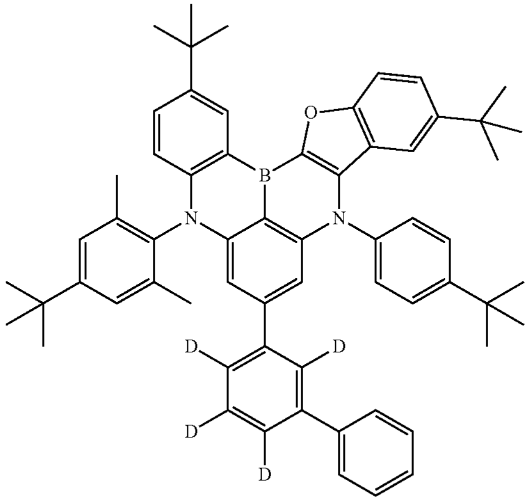 [SMILES: [2H]c1c([2H])c(-c2ccccc2)c([2H])c(-c2cc3c4c(c2)N(c2ccc(C(C)(C)C)cc2)c2c(oc5ccc(C(C)(C)C)cc25)B4c2cc(C(C)(C)C)ccc2N3c2c(C)cc(C(C)(C)C)cc2C)c1[2H]]
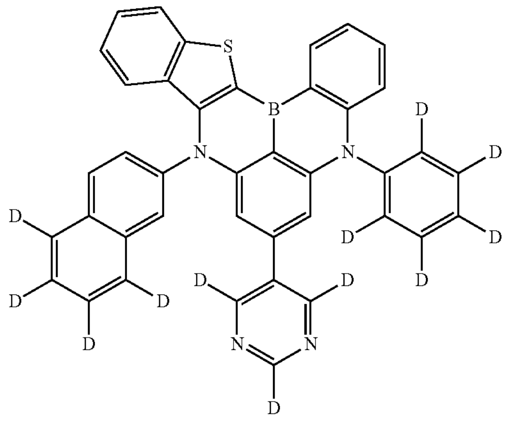

-continued
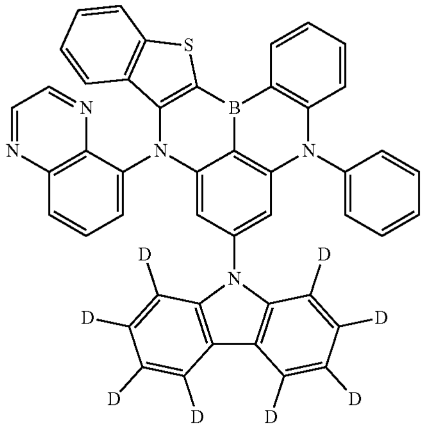
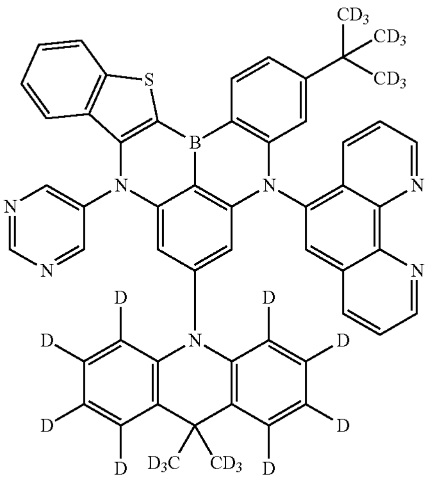
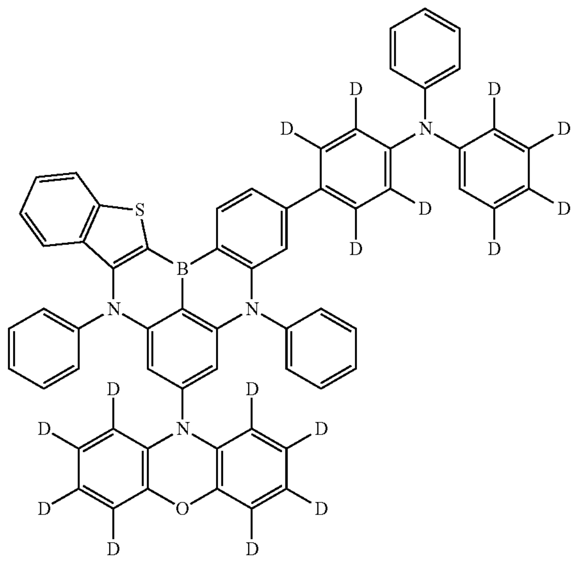
-continued
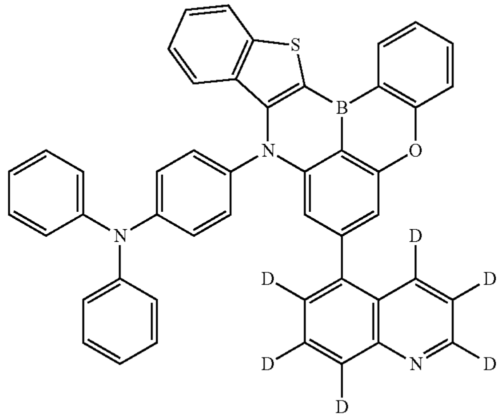
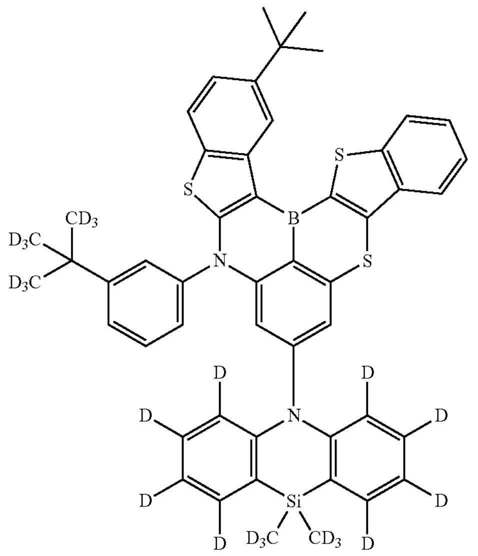
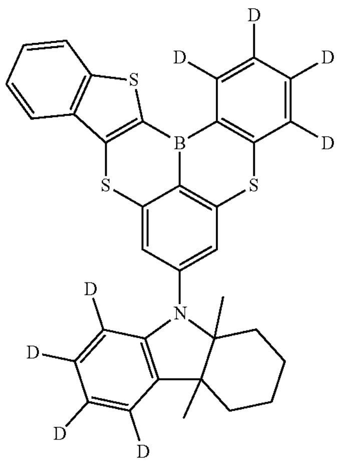

-continued
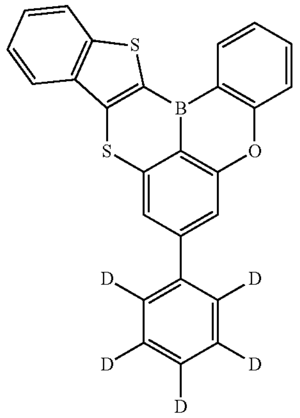
-continued
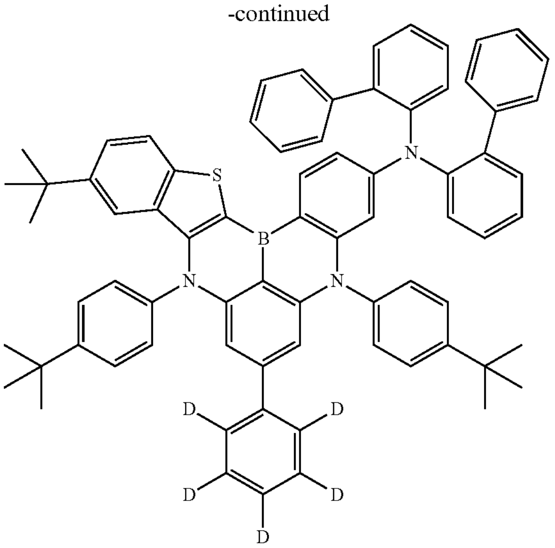
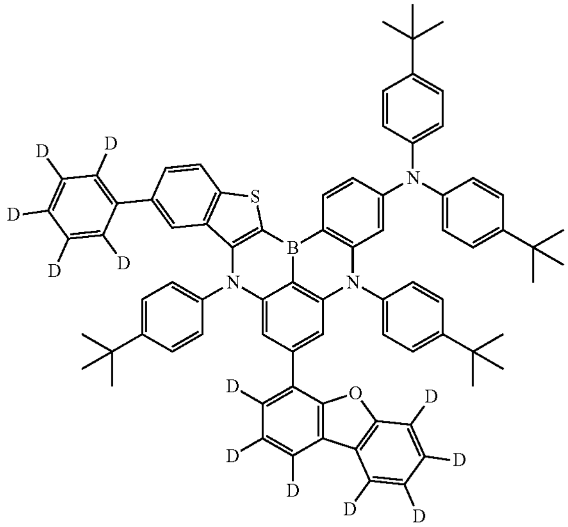
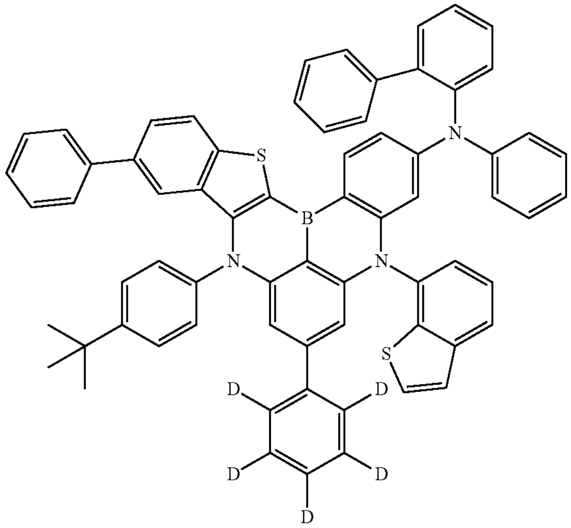 [SMILES: [2H]c1c([2H])c([2H])c(-c2cc3c4c(c2)N(c2cccc5ccsc25)c2cc(N(c5ccccc5)c5ccccc5-c5ccccc5)ccc2B4c2sc4ccc(-c5ccccc5)cc4c2N3c2ccc(C(C)(C)C)cc2)c([2H])c1[2H]]
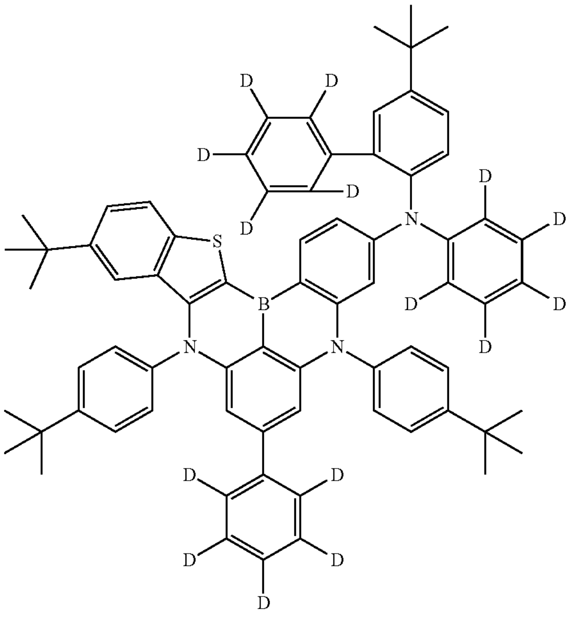
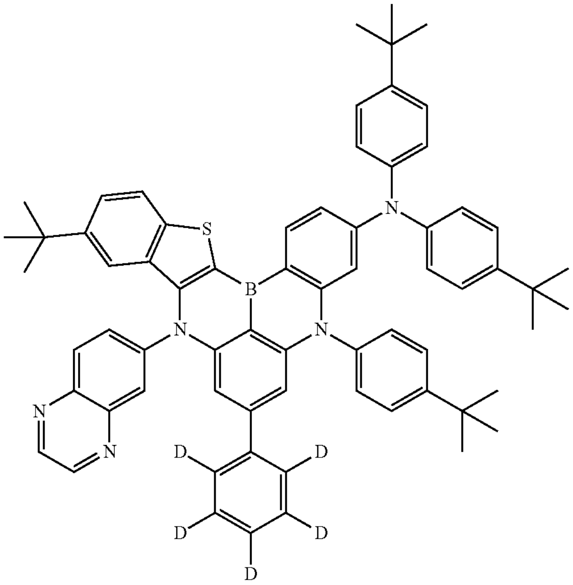

-continued
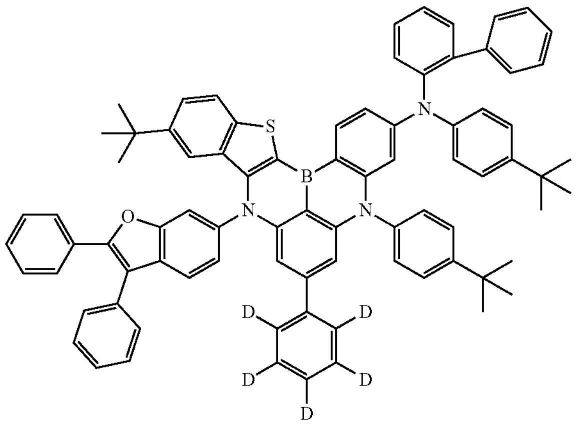
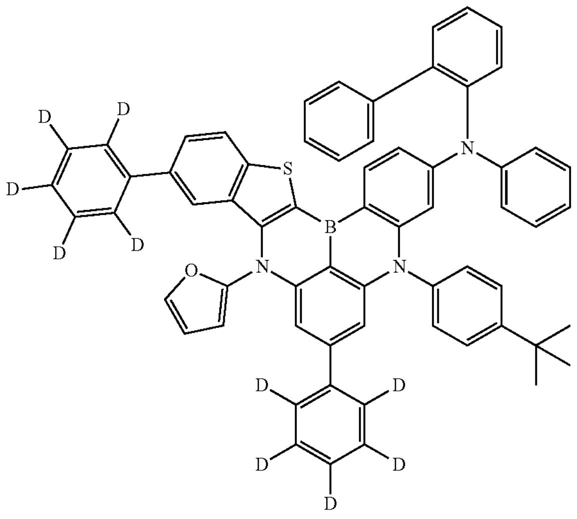
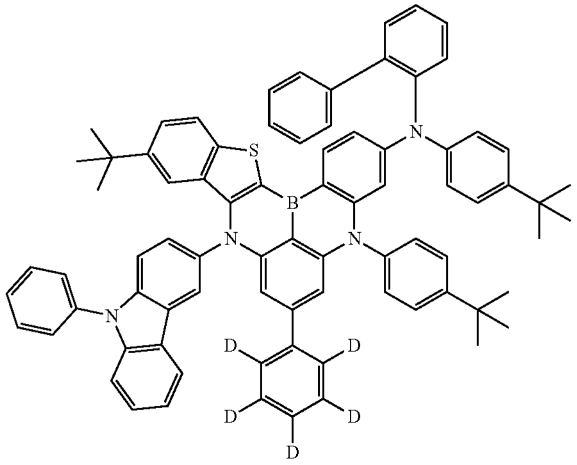
-continued
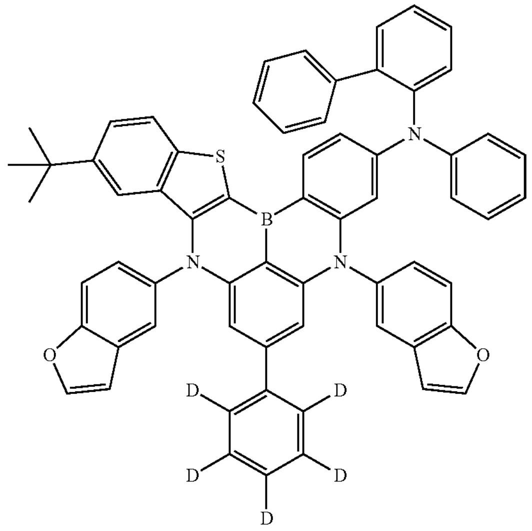
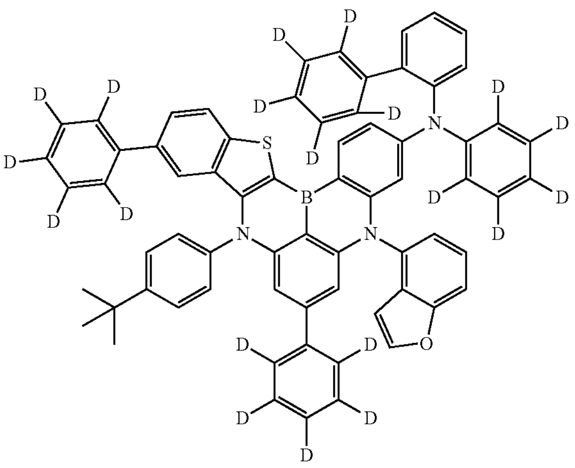
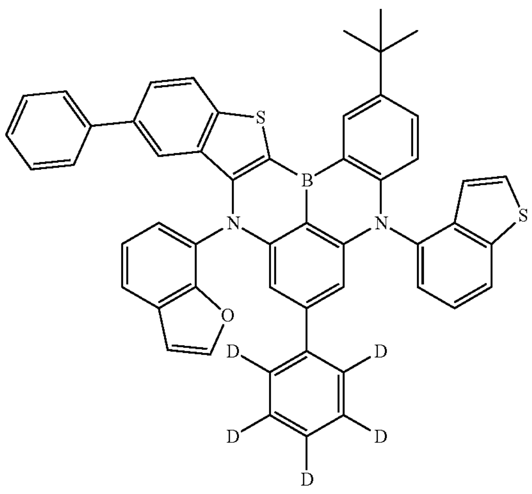

-continued
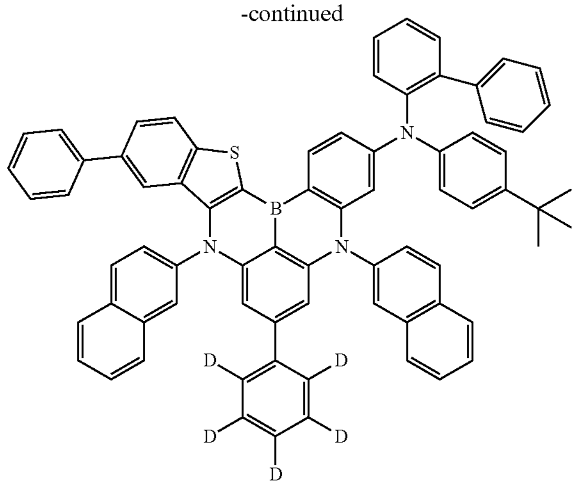
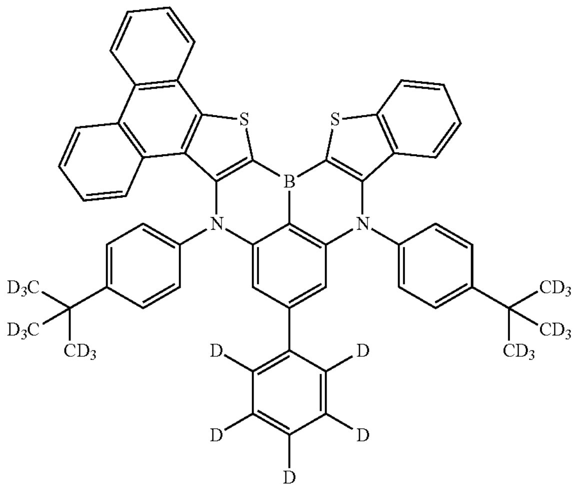
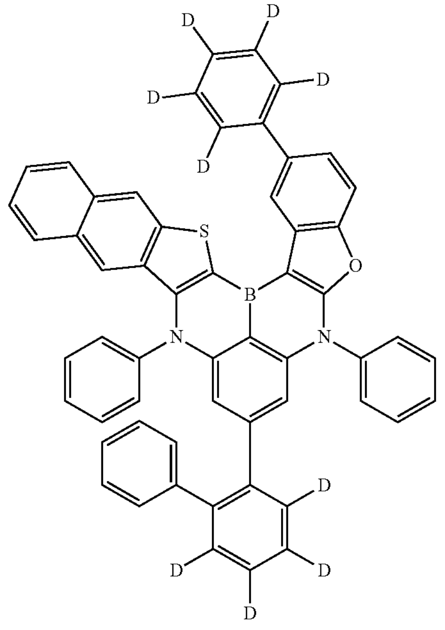
-continued
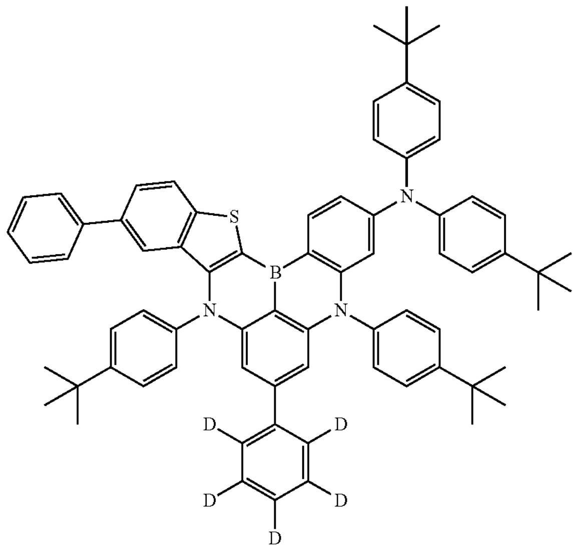
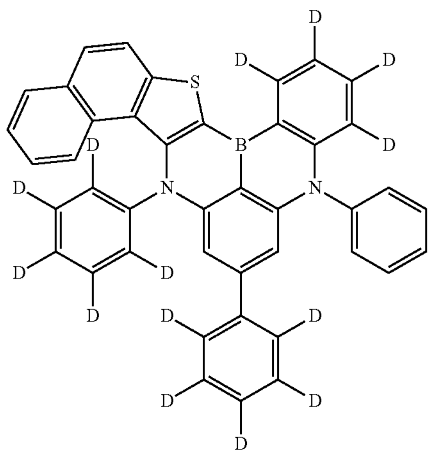
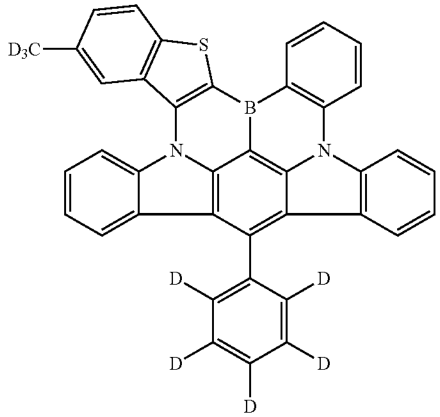

-continued
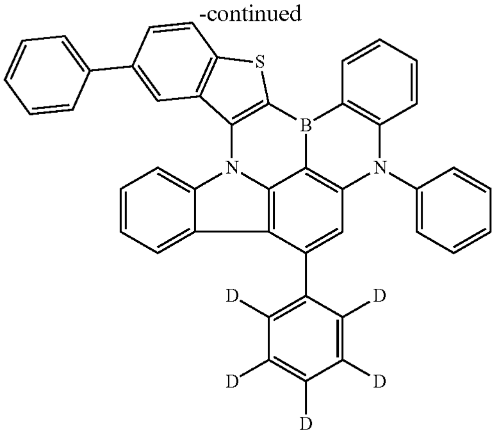
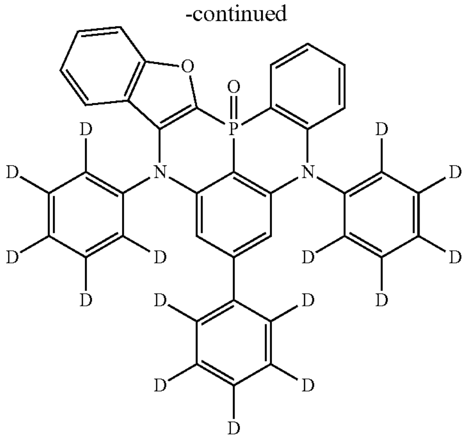
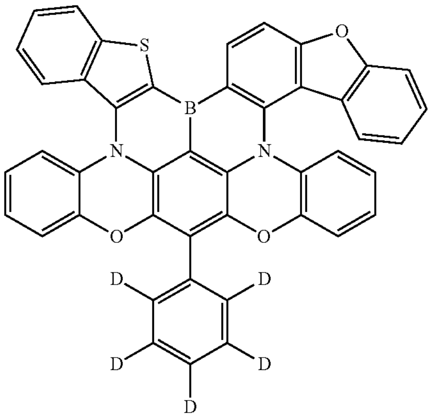
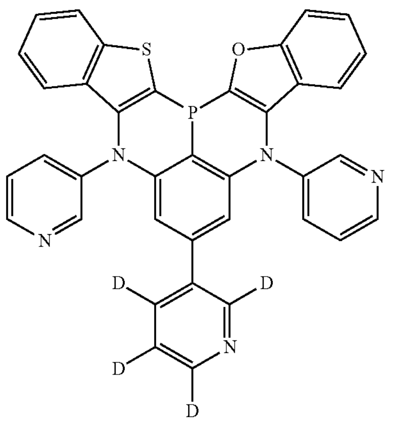
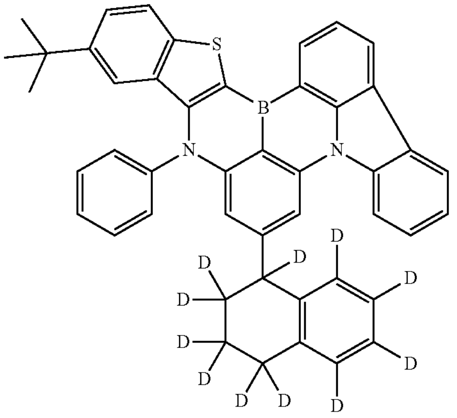
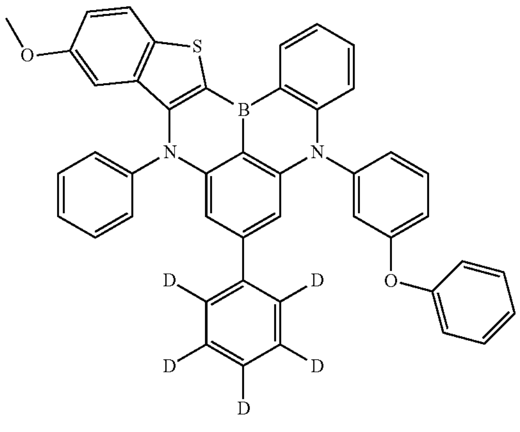
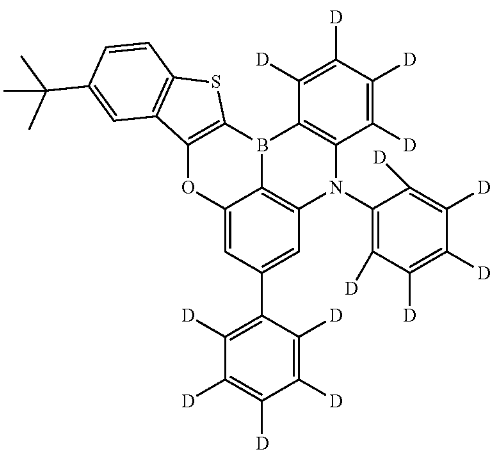
-continued -continued
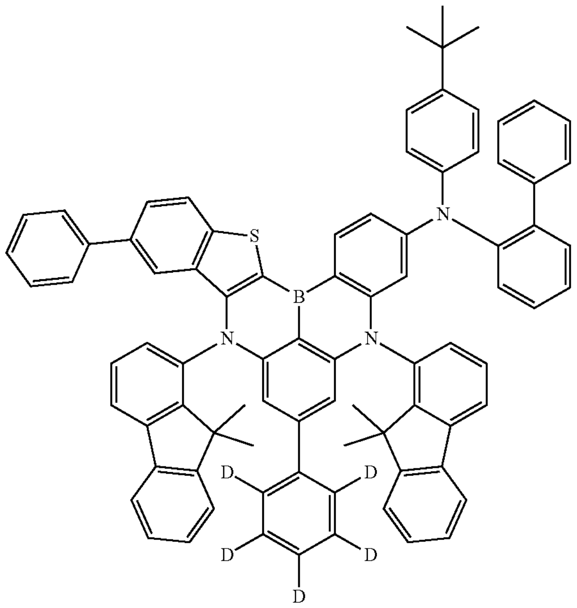
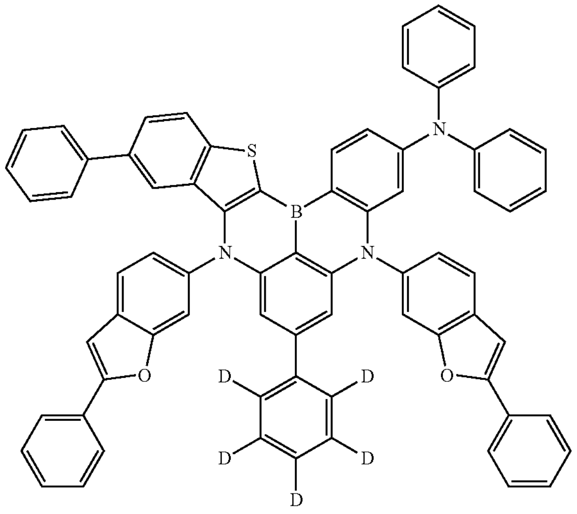
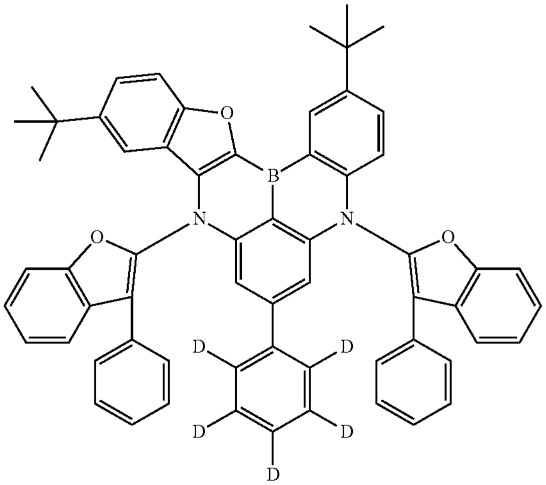
-continued
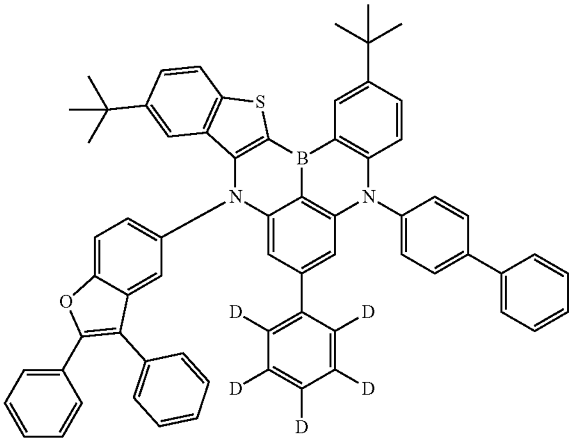
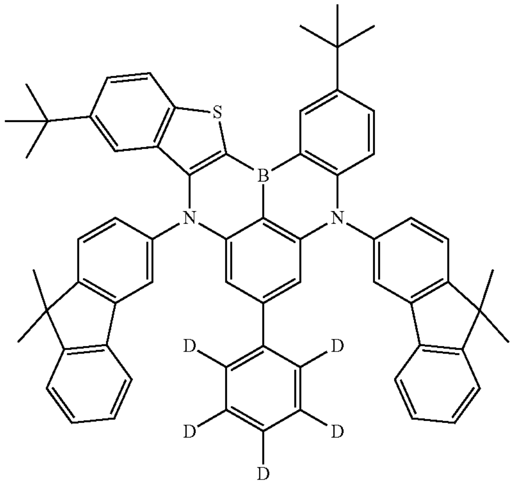
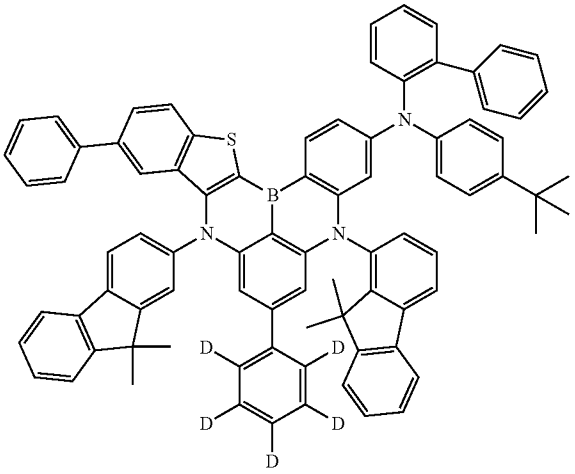

-continued

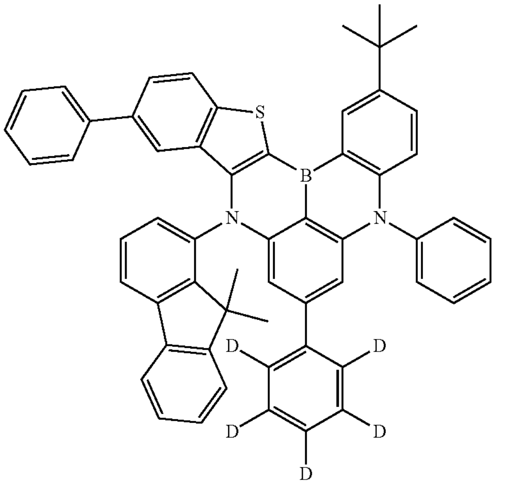

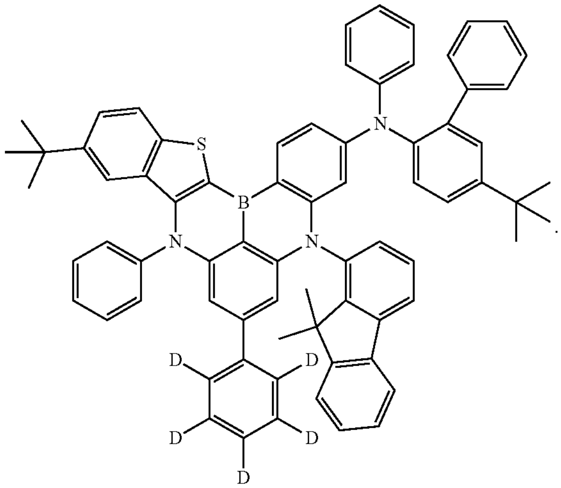

7. An organic light emitting device comprising a first electrode, a second electrode, and one or more organic layers interposed between the first and second electrodes wherein one of the organic layers comprises the polycyclic compound represented by Formula A-1 according to claim 1.

8. The organic light emitting device according to claim 7, wherein the organic layers comprise an electron injecting layer, an electron transport layer, a hole injecting layer, a hole transport layer, an electron blocking layer, a hole blocking layer, and/or a light emitting layer, at least one of which comprises the polycyclic compound represented by Formula A-1.

9. The organic light emitting device according to claim 8, wherein the light emitting layer is composed of a host and the polycyclic compound represented by Formula A-1 as a dopant.

10. The organic light emitting device according to claim 9, wherein the host is an anthracene compound represented by Formula B:

[Formula B]

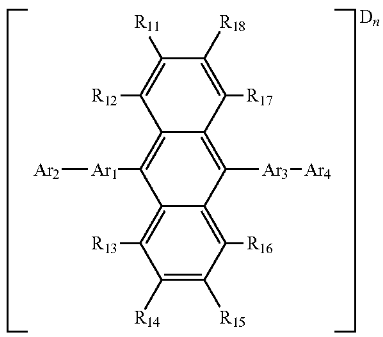

wherein $R_{11}$ to $R_{18}$ are the same as or different from each other and are each independently selected from hydrogen, substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted $C_3$-$C_{30}$ mixed aliphatic-aromatic cyclic groups, nitro, cyano, and halogen, $Ar_1$ and $Ar_3$ are the same as or different from each other and are each independently substituted or unsubstituted $C_6$-$C_{30}$ arylene, $Ar_2$ and $Ar_4$ are the same as or different from each other and are each independently selected from hydrogen, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, and substituted or unsubstituted $C_3$-$C_{30}$ mixed aliphatic-aromatic cyclic groups, $D_n$ represents the replacement of hydrogen with deuterium, and n is an integer from 0 to 50.

11. The organic light emitting device according to claim 10, wherein the anthracene compound represented by Formula B is selected from the following compounds:

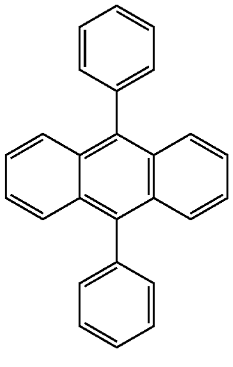

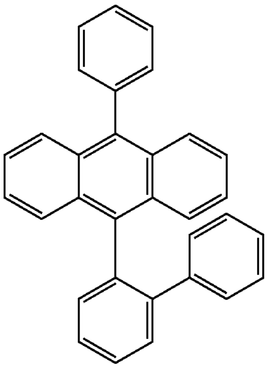

-continued
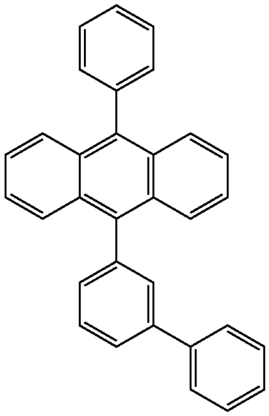
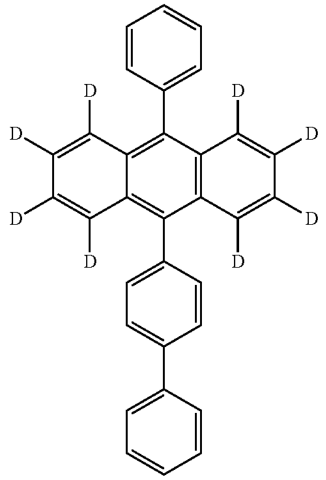
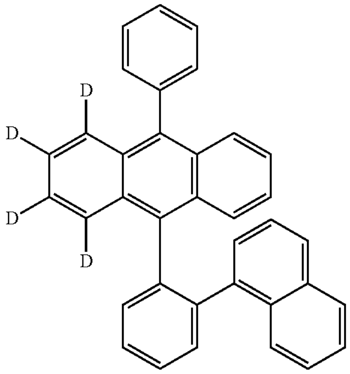
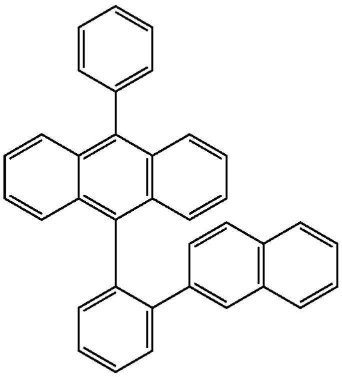
-continued
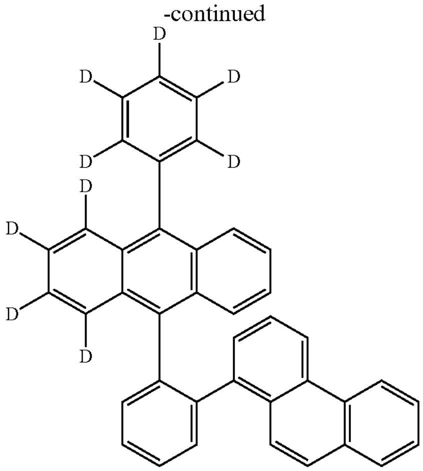
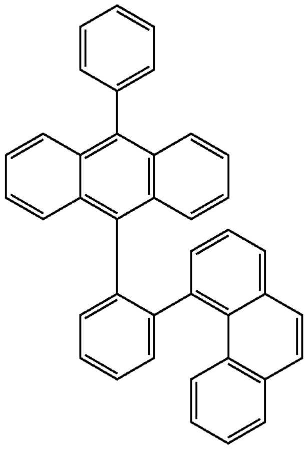
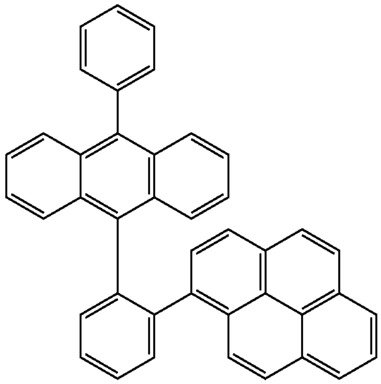
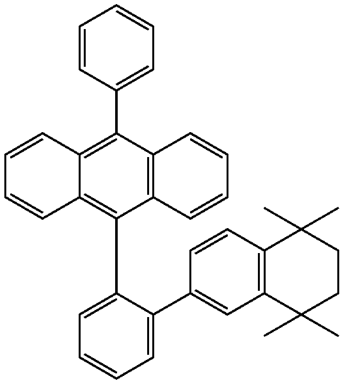

-continued
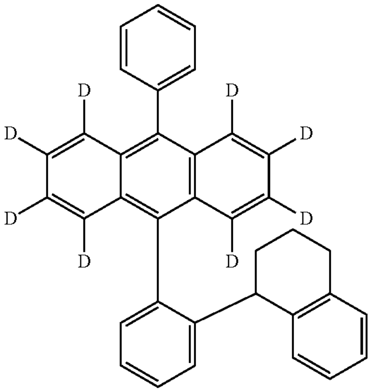
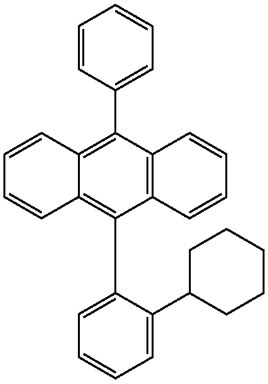
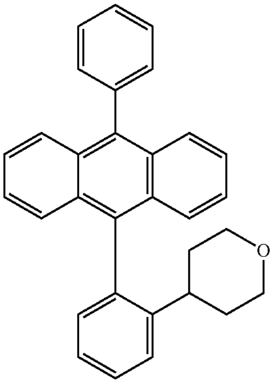
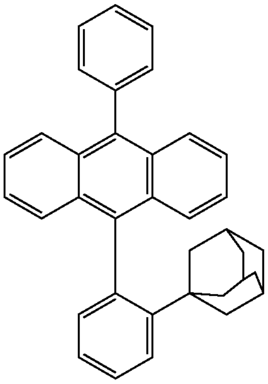
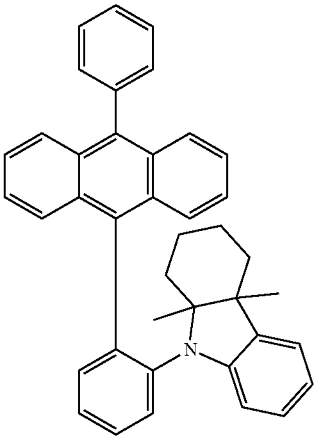
-continued
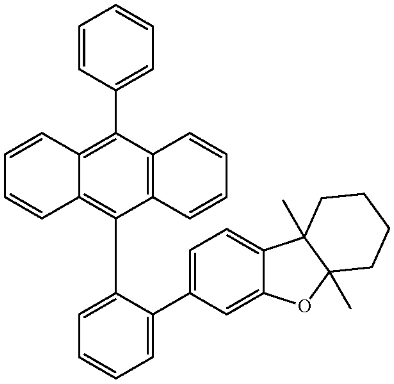
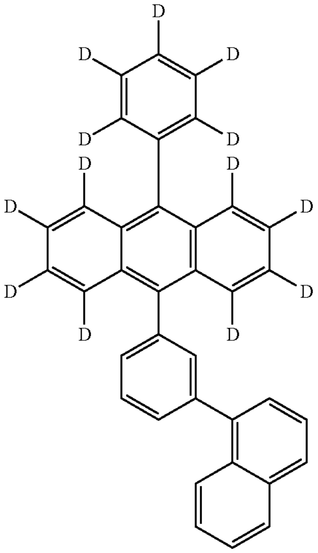
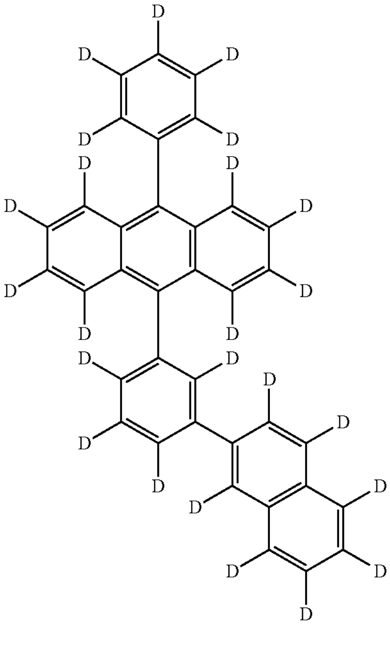

-continued
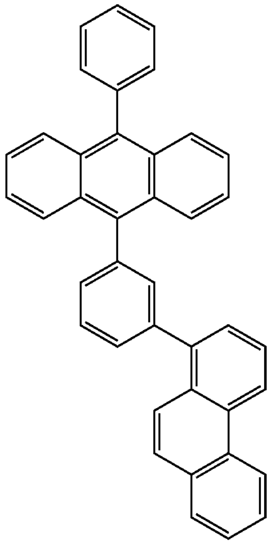
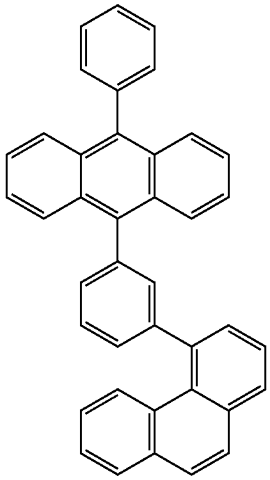
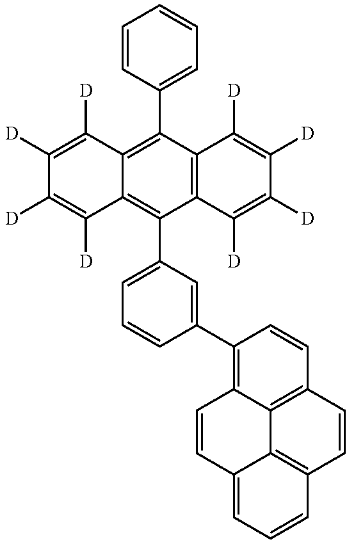
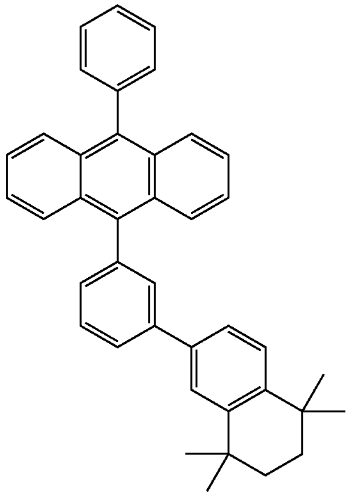
-continued
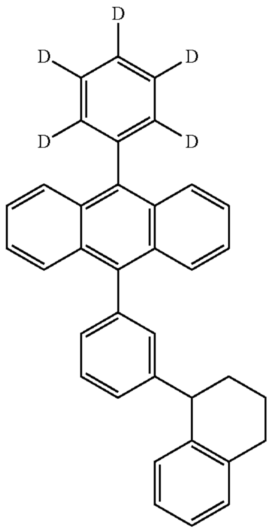
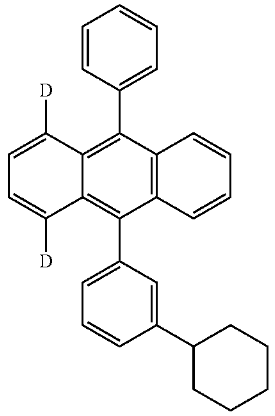
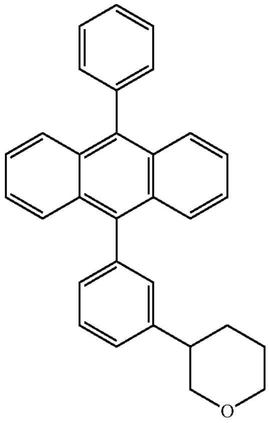
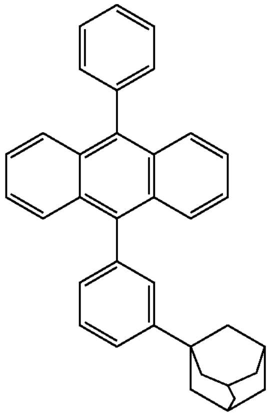
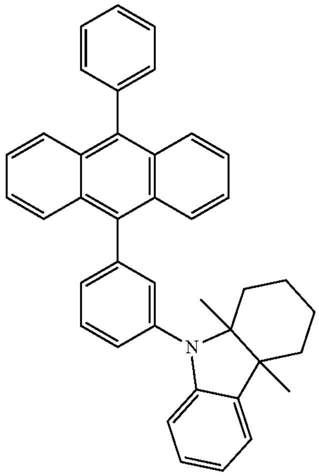

-continued
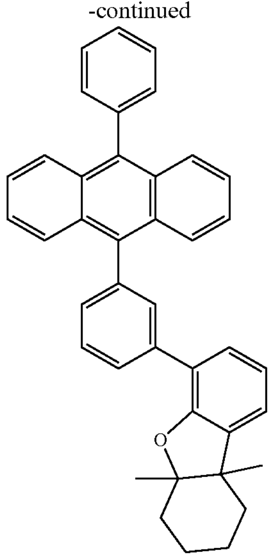
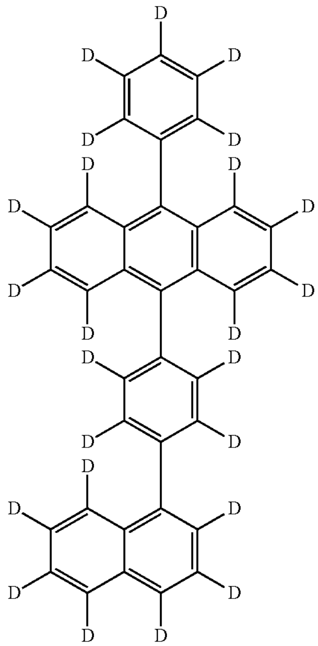
-continued
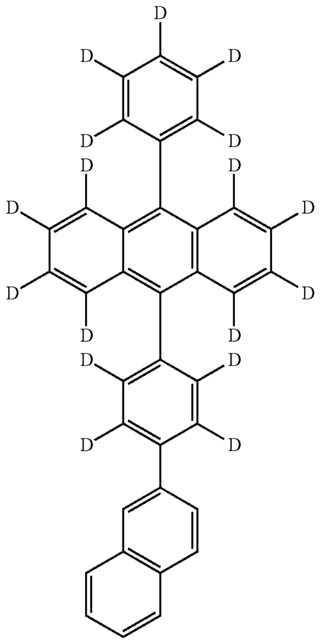
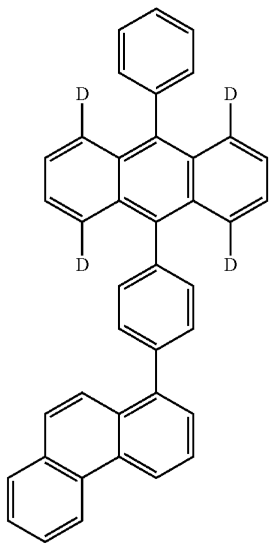
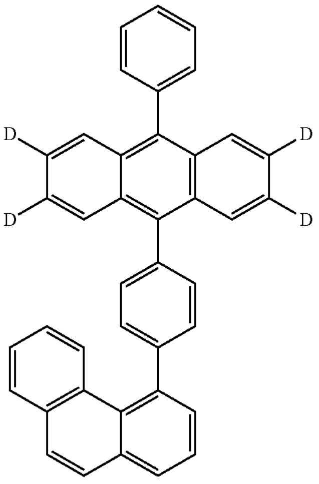

-continued
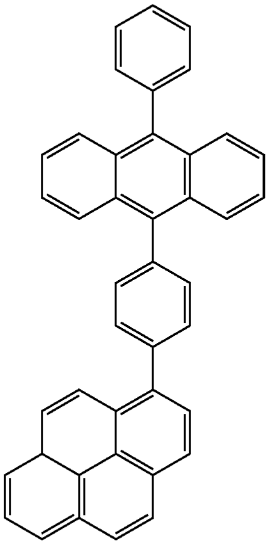
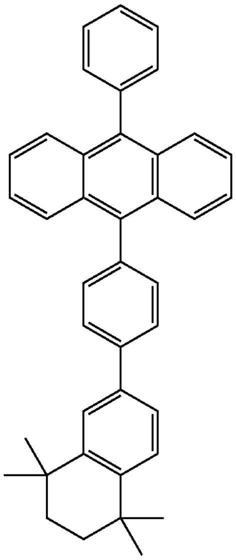
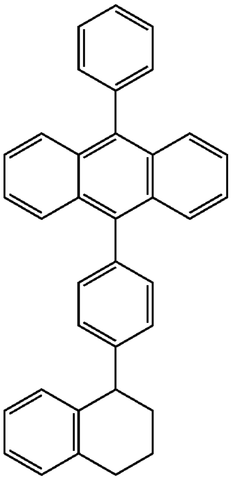
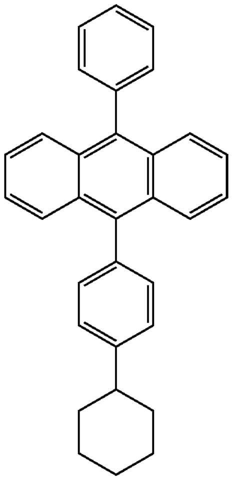
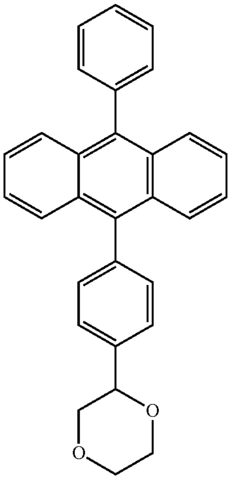
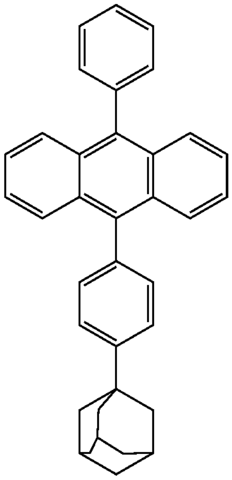
-continued
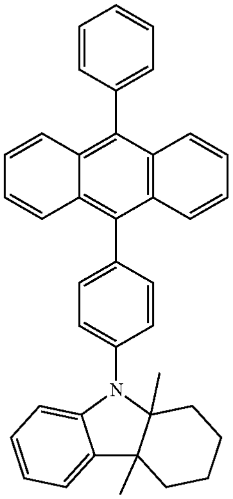
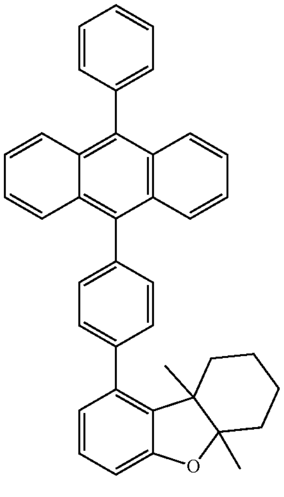
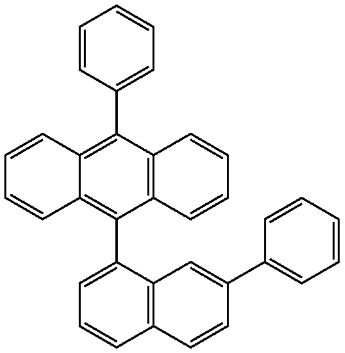
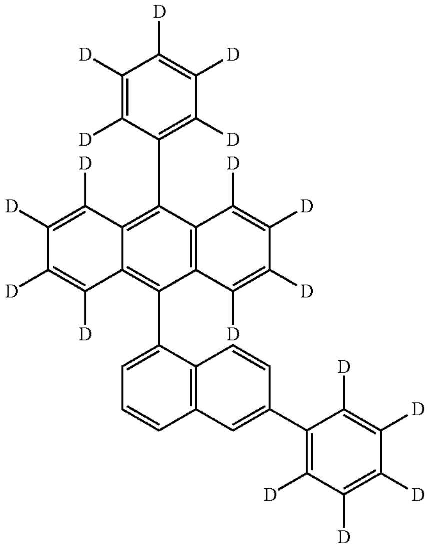

-continued
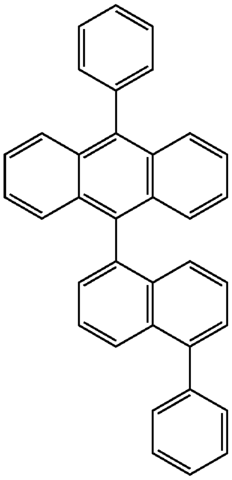
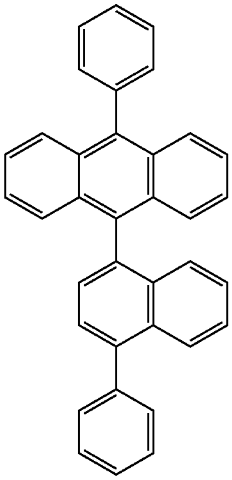
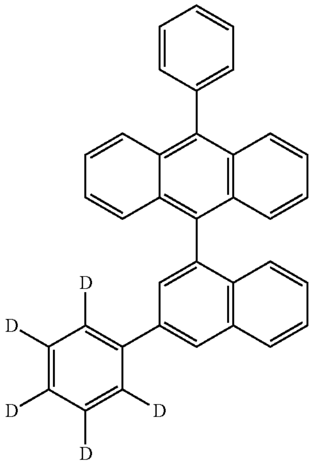
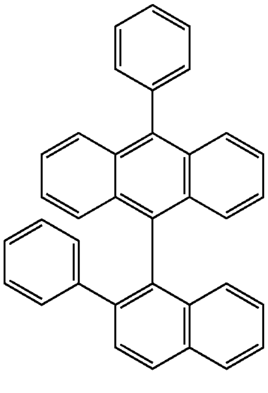
-continued
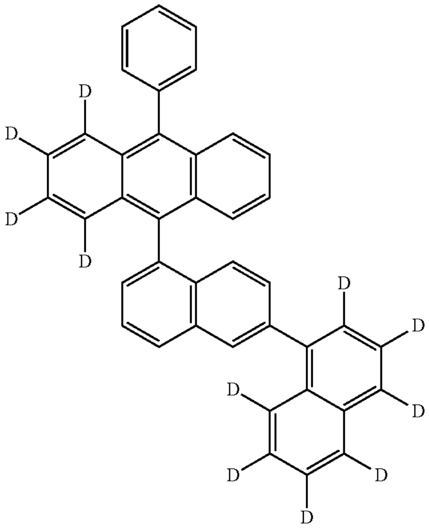
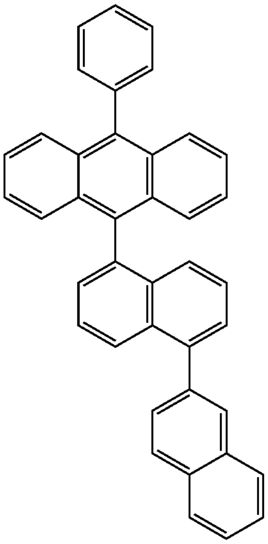
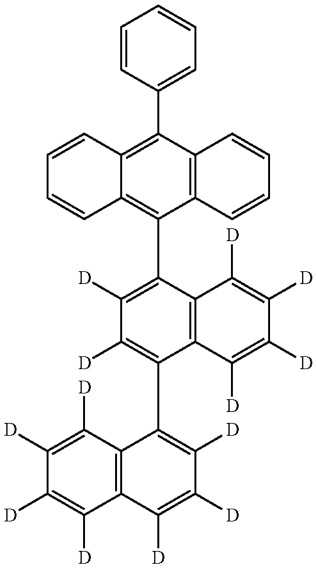

-continued
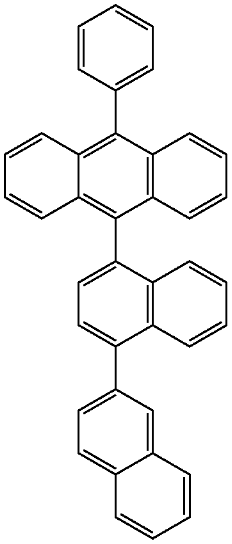
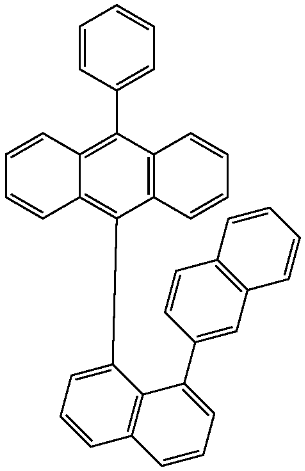
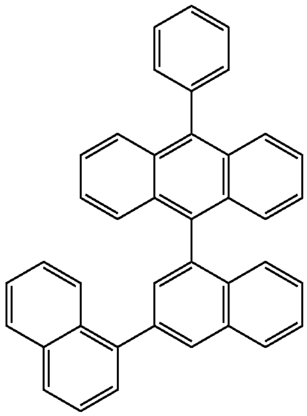
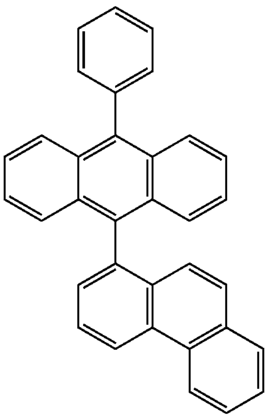
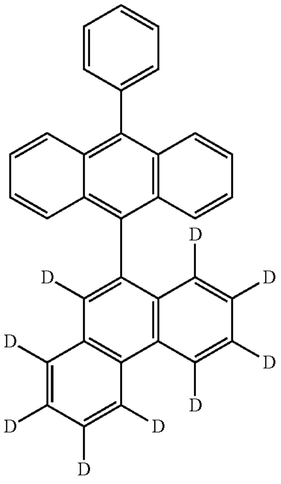
-continued
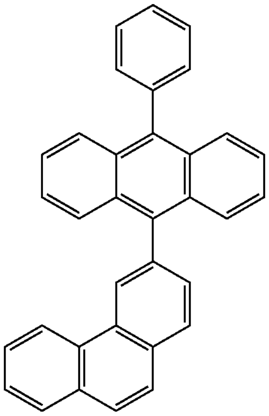
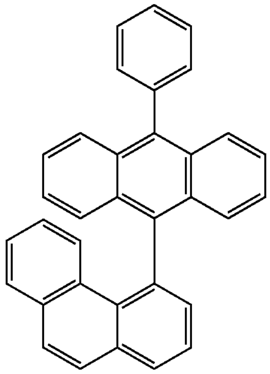
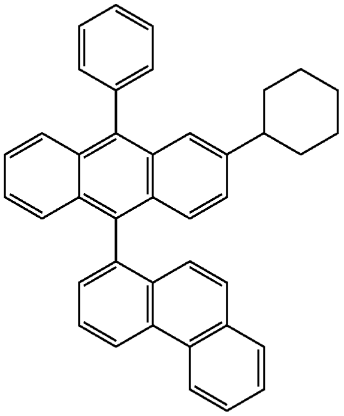
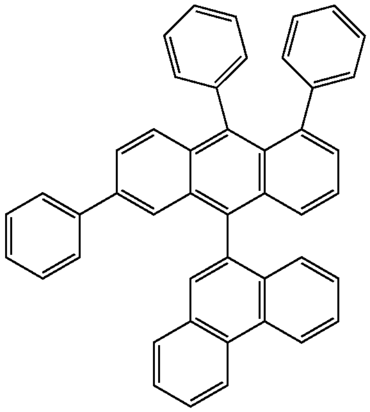
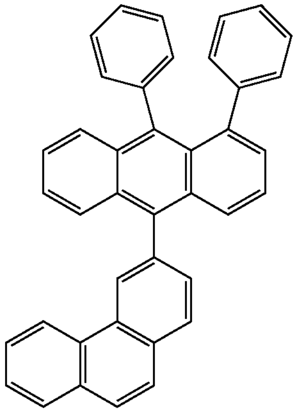

-continued
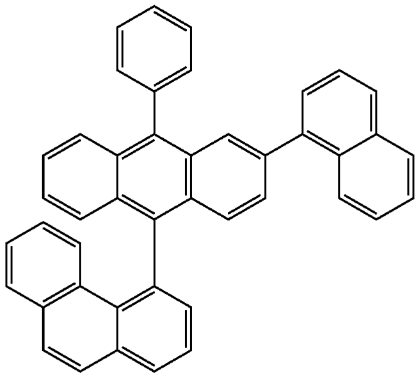
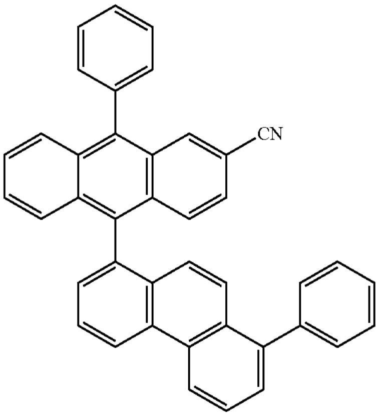
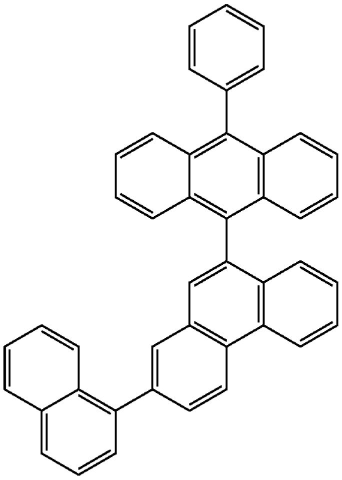
-continued
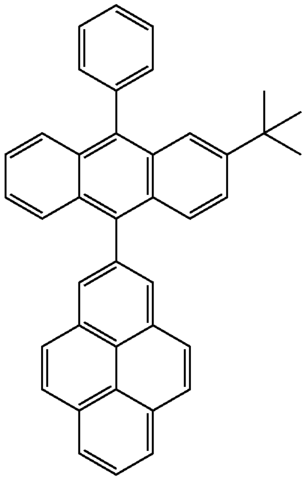
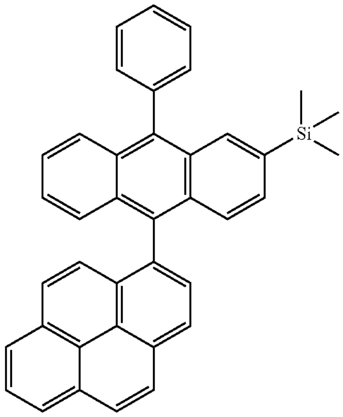
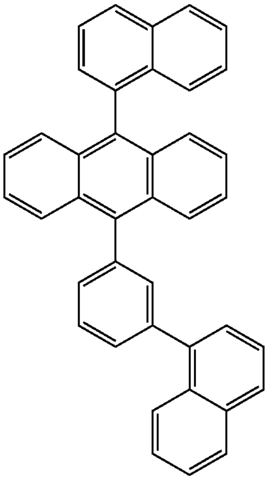
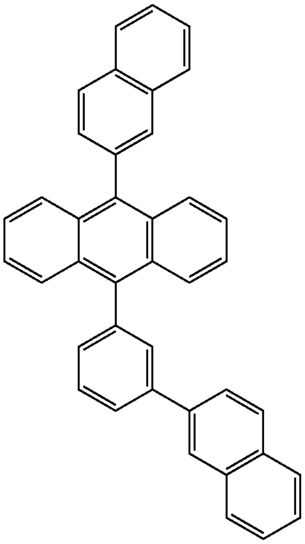

-continued
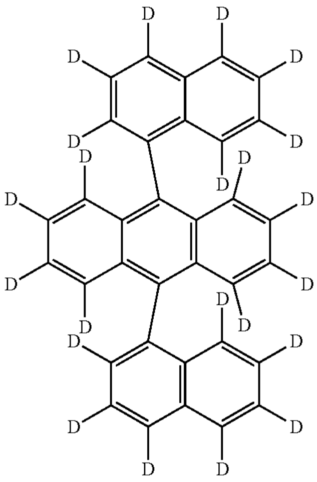
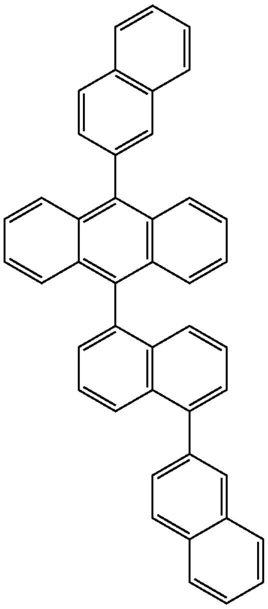
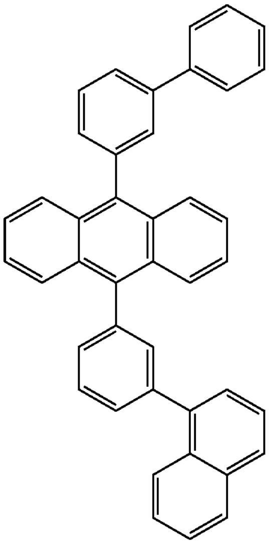
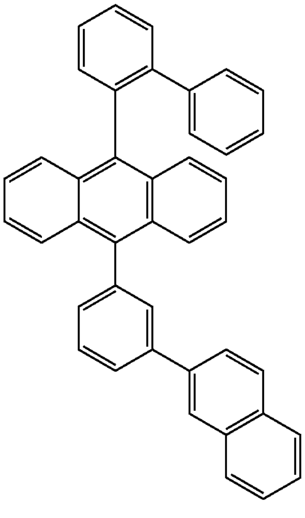
-continued
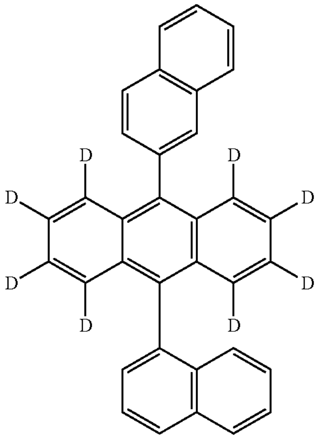
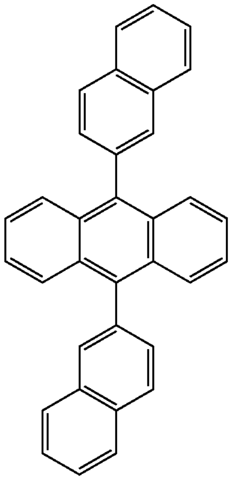
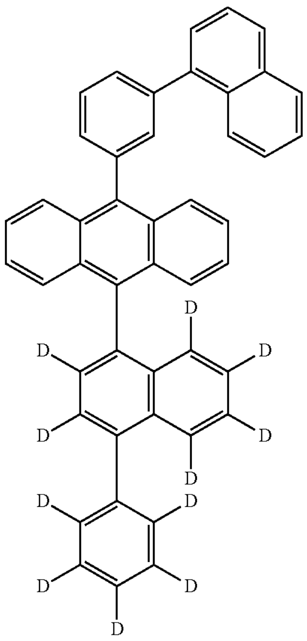
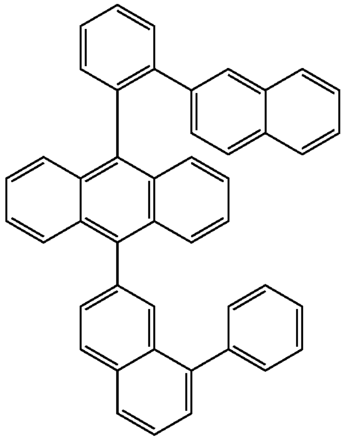

-continued

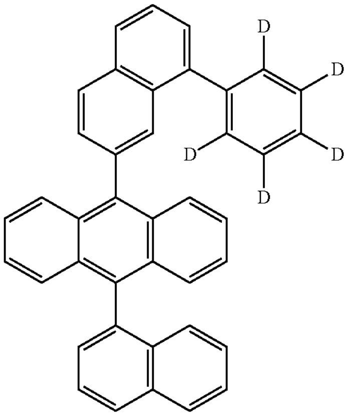

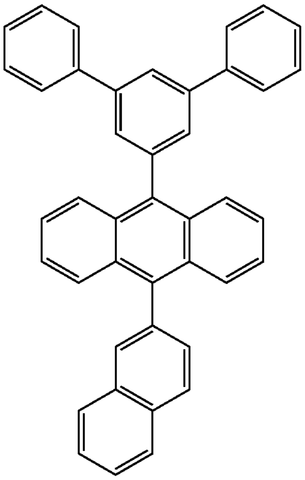

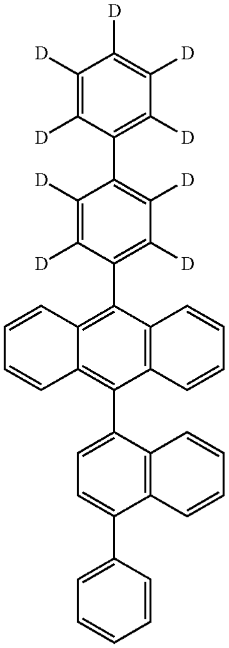

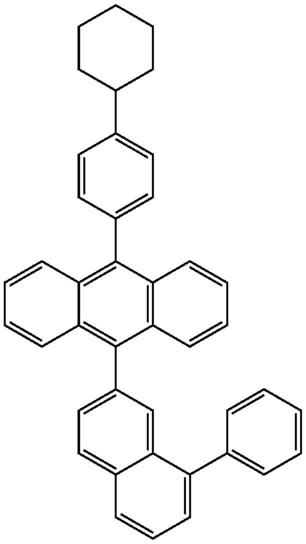

-continued

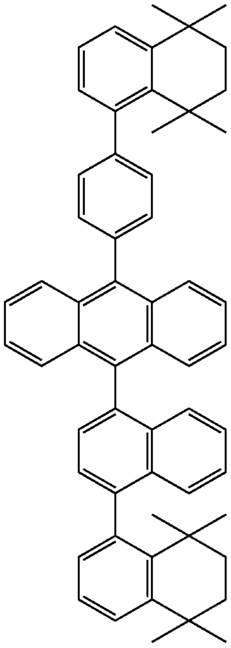

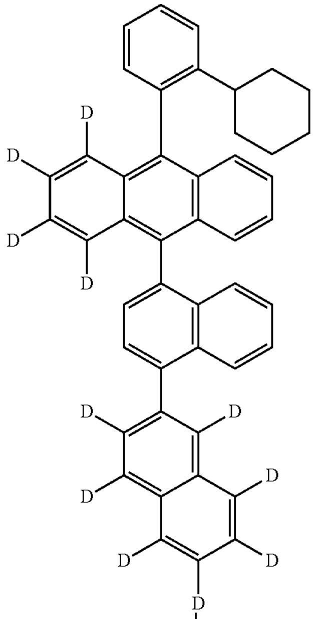

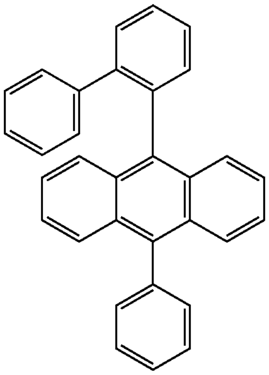

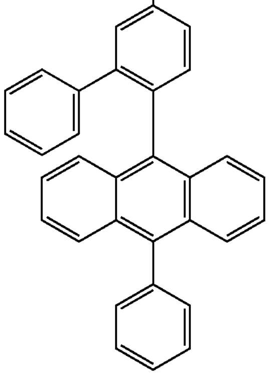

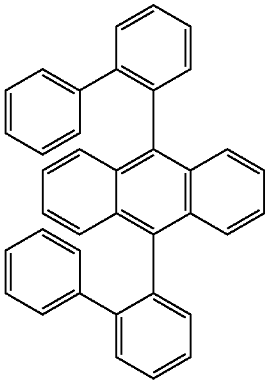

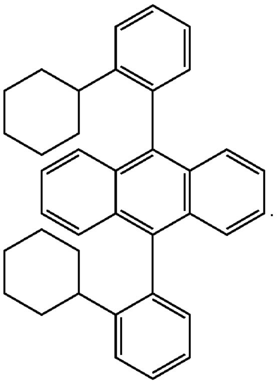

12. The organic light emitting device according to claim 10, wherein one or more host compounds other than the anthracene compound represented by Formula B are mixed or stacked.

13. The organic light emitting device according to claim 9, wherein one or more dopant compounds other than the polycyclic compound represented by Formula A-1 are mixed or stacked in the light emitting layer.

14. The organic light emitting device according to claim 8, wherein one or more of the layers are formed by a deposition or solution process.

15. The organic light emitting device according to claim 7, wherein the organic light emitting device is used in a display or lighting system selected from flat panel displays, flexible displays, monochromatic flat panel lighting systems, white flat panel lighting systems, flexible monochromatic lighting systems, flexible white lighting systems, displays for automotive applications, displays for virtual reality, and displays for augmented reality.

* * * * *